(12) United States Patent  (10) Patent No.: US 8,530,063 B2
Kim et al.  (45) Date of Patent: Sep. 10, 2013

(54) COMPOUND FOR ORGANIC PHOTOELECTRIC DEVICE AND ORGANIC PHOTOELECTRIC DEVICE INCLUDING THE SAME

(75) Inventors: Young-Hoon Kim, Uiwang-si (KR); Ja-Hyun Kim, legal representative, Boryeong (KR); Eun-Sun Yu, Uiwang-si (KR); Ho-Jae Lee, Uiwang-si (KR); Young-Sung Park, Uiwang-si (KR); Mi-Young Chae, Uiwang-si (KR); Hyung-Sun Kim, Uiwang-si (KR); Soo-Hyun Min, Uiwang-si (KR); Eui-Su Kang, Uiwang-si (KR); Sung-Hyun Jung, Uiwang-si (KR)

(73) Assignee: Cheil Industries, Inc., Gumi-si, Kyeongsangbuk-do (KR)

( * ) Notice: Subject to any disclaimer, the term of this patent is extended or adjusted under 35 U.S.C. 154(b) by 0 days.

(21) Appl. No.: 13/451,753

(22) Filed: Apr. 20, 2012

(65) Prior Publication Data

US 2012/0205636 A1  Aug. 16, 2012

Related U.S. Application Data

(63) Continuation of application No. PCT/KR2010/007054, filed on Oct. 14, 2010.

(30) Foreign Application Priority Data

Oct. 21, 2009 (KR) .................. 10-2009-0100413

(51) Int. Cl.
*H01L 51/54* (2006.01)
*C07D 401/14* (2006.01)
*C07D 403/14* (2006.01)
*C07D 487/04* (2006.01)

(52) U.S. Cl.
USPC .......... 428/690; 428/917; 548/440; 548/407; 548/418; 546/276.7; 546/167; 544/212

(58) Field of Classification Search
None
See application file for complete search history.

(56) References Cited

U.S. PATENT DOCUMENTS 6,979,414 B2  12/2005  Hosokawa
7,972,712 B2 *  7/2011  Itoh et al. ...................... 428/690

(Continued)

FOREIGN PATENT DOCUMENTS

CN  101139317 A  3/2008
EP  2 100 880 A1  9/2009

(Continued)

OTHER PUBLICATIONS

Machine-generated English translation for JP 2005-093159 A (publication date Apr. 2005).*

(Continued)

*Primary Examiner* — Dawn L. Garrett
(74) *Attorney, Agent, or Firm* — Lee & Morse, P.C.

(57) ABSTRACT

A compound for an organic photoelectric device an organic photoelectric device, and a display device, the compound being represented by the following Chemical Formula 1:

[Chemical Formula 1]

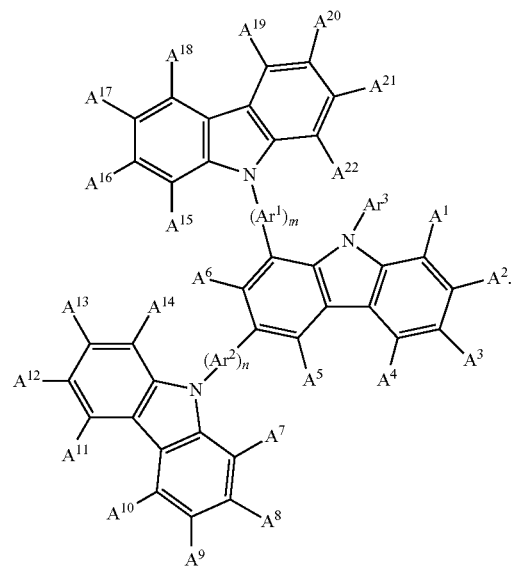

15 Claims, 3 Drawing Sheets

(56) References Cited

U.S. PATENT DOCUMENTS

| | | | |
|---|---|---|---|
| 8,120,243 B2 | 2/2012 | Kim et al. | |
| 2004/0247933 A1 | 12/2004 | Thoms | |
| 2007/0247063 A1* | 10/2007 | Murase et al. | 313/504 |
| 2009/0153034 A1 | 6/2009 | Lin et al. | |
| 2009/0284138 A1* | 11/2009 | Yasukawa et al. | 313/504 |
| 2010/0145067 A1 | 6/2010 | Yokota et al. | |
| 2010/0276673 A1 | 11/2010 | Jung et al. | |
| 2012/0211736 A1* | 8/2012 | Kim et al. | 257/40 |
| 2012/0235136 A1* | 9/2012 | Ogawa et al. | 257/40 |

FOREIGN PATENT DOCUMENTS

| | | | |
|---|---|---|---|
| JP | 2005-093159 A * | 4/2005 | |
| KR | 10-2009-0044752 A | 5/2009 | |
| KR | 10-2009-0068193 A | 6/2009 | |
| TW | 200825053 | 6/2008 | |
| WO | WO 01/41512 A1 * | 6/2001 | |
| WO | WO 2008/059943 A1 | 5/2008 | |
| WO | WO 2009/035295 A2 | 3/2009 | |

OTHER PUBLICATIONS

Baldo, M. A., et al., "Very High-Efficiency Green Organic Light-Emitting Devices Based on Electrophosphorescence," *Applied Physics Letters*, vol. 75, No. 1, 1999, pp. 4-6.

Davidenko, N. A., et al., "Photoelectric Characteristics of Composite Carbazole Polymerfilms Containing 1,8-Naphthoylene-1',2'-Benzimidazole," *Journal of Applied Spectroscopy*, vol. 72, No. 5, 2005, pp. 685-689.

O'Brien, D. F., et al., "Improved Energy Transfer in Electrophosphorescent Devices," *Applied Physics Letters*, vol. 74, No. 3, 1999, pp. 442-444.

Puodziukynaite, E., et al., "Carbazole-based bis(enamines) as Effective Charge-transporting Amorphous Molecular Materials," *Synthetic Metals*, vol. 158, 2008, pp. 993-998.

Tang, C. W., et al., "Organic Electroluminescent Diodes," *Applied Physics Letters*, vol. 51, No. 12, 1987, 913-915.

International Search Report issued in PCT/KR2010/007054 dated Jul. 19, 2011.

Taiwanese Search Report in TW 098144196, dated Dec. 4, 2012 (Kim, et al.).

* cited by examiner

COMPOUND FOR ORGANIC PHOTOELECTRIC DEVICE AND ORGANIC PHOTOELECTRIC DEVICE INCLUDING THE SAME

CROSS-REFERENCE TO RELATED APPLICATION

This application is a continuation of pending International Application No. PCT/KR2010/007054, entitled "Novel Compound for Organic Photoelectric Device and Organic Photoelectric Device Including the Same," which was filed on Oct. 14, 2010, the entire contents of which are hereby incorporated by reference.

BACKGROUND

1. Field

Embodiments relate to a compound for an organic photoelectric device and an organic photoelectric device including the same.

2. Description of the Related Art

An organic photoelectric device is a device in which a charge exchange occurs between an electrode and an organic material by using a hole or an electron.

An organic photoelectric device may be classified as follows in accordance with its driving principles. A type of first organic photoelectric device is an electronic device that is driven as follows: excitons are generated in an organic material layer by photons from an external light source; the excitons are separated to electrons and holes; and the electrons and holes are transferred to different electrodes as a current source (voltage source).

A second type of organic photoelectric device is an electronic device driven as follows: a voltage or a current is applied to at least two electrodes to inject holes and/or electrons into an organic material semiconductor positioned at an interface of the electrodes; and then the device is driven by the injected electrons and holes.

For example, the organic photoelectric device may include an organic light emitting diode (OLED), an organic solar cell, an organic photo-conductor drum, an organic transistor, an organic memory device, etc. The organic photoelectric device may include a hole injecting or transporting material, an electron injecting or transporting material, or a light emitting material.

An organic light emitting diode (OLED) has recently drawn attention due to an increase in demand for flat panel displays. In general, organic light emission refers to transformation of electrical energy to photo-energy.

The organic light emitting diode may transform electrical energy into light by applying current to an organic light emitting material. The organic light emitting diode may have a structure in which a functional organic material layer is interposed between an anode and a cathode. The organic material layer may include multi-layers including different materials from each other, e.g., a hole injection layer (HIL), a hole transport layer (HTL), an emission layer, an electron transport layer (ETL), and an electron injection layer (EIL), in order to help improve efficiency and stability of an organic light emitting diode.

In such an organic light emitting diode, when a voltage is applied between an anode and a cathode, holes from the anode and electrons from the cathode may be injected into the organic material layer to generate excitons. The generated excitons may generate light having certain wavelengths while shifting to a ground state.

An organic light emitting diode may include a low molecular aromatic diamine and an aluminum complex as an emission-layer-forming material. The organic material layer may have a structure in which a thin film (hole transport layer (HTL)) of a diamine derivative and a thin film of tris(8-hydroxy-quinolate)aluminum (Alq$_3$) are stacked.

A phosphorescent light emitting material may be used for a light emitting material of an organic light emitting diode in addition to the fluorescent light emitting material. Such a phosphorescent material may emit light by transiting the electrons from a ground state to an exited state, non-radiance transiting of a singlet exciton to a triplet exciton through intersystem crossing, and transiting a triplet exciton to a ground state to emit light.

As described above, in an organic light emitting diode, the organic material layer may include a light emitting material and a charge transport material, e.g., a hole injection material, a hole transport material, an electron transport material, an electron injection material, and the like.

The light emitting material may be classified as blue, green, and red light emitting materials according to emitted colors, and yellow and orange light emitting materials to emit colors approaching natural colors.

SUMMARY

Embodiments are directed to a compound for an organic photoelectric device and an organic photoelectric device including the same.

The embodiments may be realized by providing a compound for an organic photoelectric device represented by the following Chemical Formula 1:

[Chemical Formula 1]

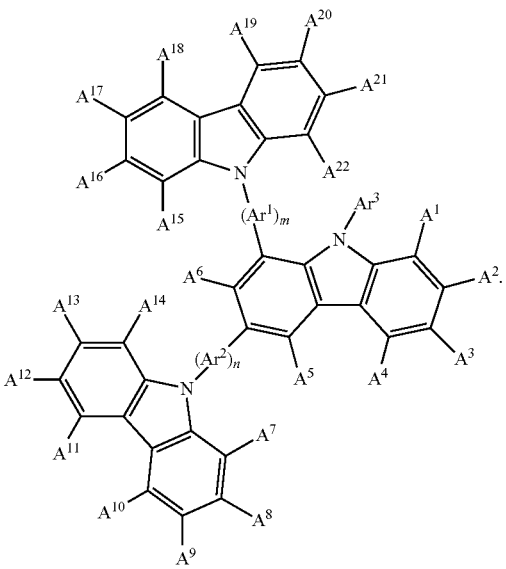

wherein Ar$^1$ and Ar$^2$ are each independently a substituted or unsubstituted C6 to C30 arylene group, Ar$^3$ is selected from the group of a substituted or unsubstituted C6 to C30 aryl group, a substituted or unsubstituted C5 to C30 heteroaryl group, and a substituted or unsubstituted C1 to C30 alkyl group, A$^1$ to A$^{22}$ are each independently selected from the group of hydrogen, a substituted or unsubstituted C6 to C30 aryl group, a substituted or unsubstituted C5 to C30 heteroaryl group, and a substituted or unsubstituted C1 to C30 alkyl group, and m and n are 0 or 1.

Ar³ may be a substituted or unsubstituted C6 to C25 aryl group or a substituted or unsubstituted C5 to C20 heteroaryl group.

Ar³ may be selected from the group of the following Chemical Formulae 3 to 10:

[Chemical Formula 3]

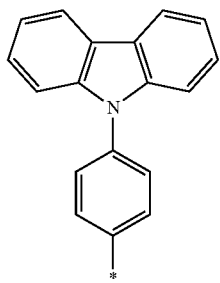

[Chemical Formula 4]

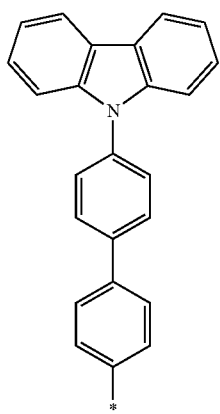

[Chemical Formula 5]

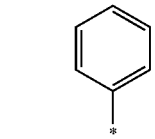

[Chemical Formula 6]

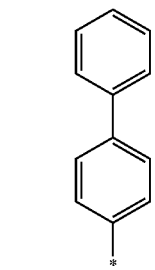

[Chemical Formula 7]

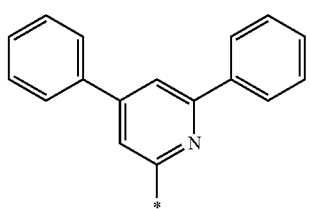

[Chemical Formula 8]

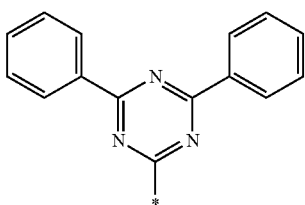

[Chemical Formula 9]

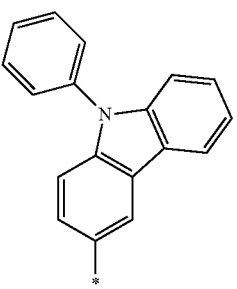

[Chemical Formula 10]

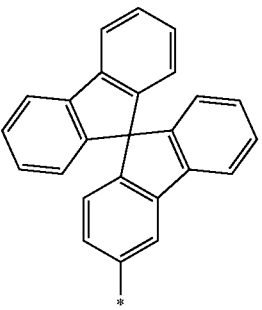

wherein, in the above Chemical Formulae, * refers to a position at which Ar³ is bound.

The compound may be represented by one of the following Chemical Formulae 11 to 81:

[Chemical Formula 11]

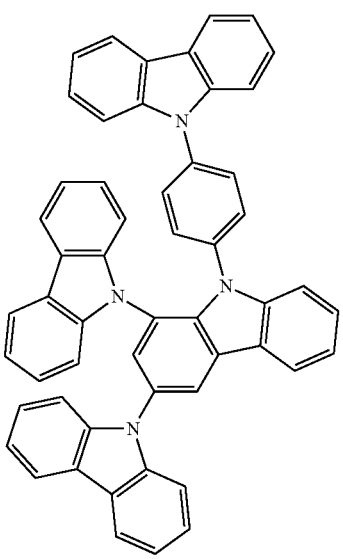

[Chemical Formula 12]
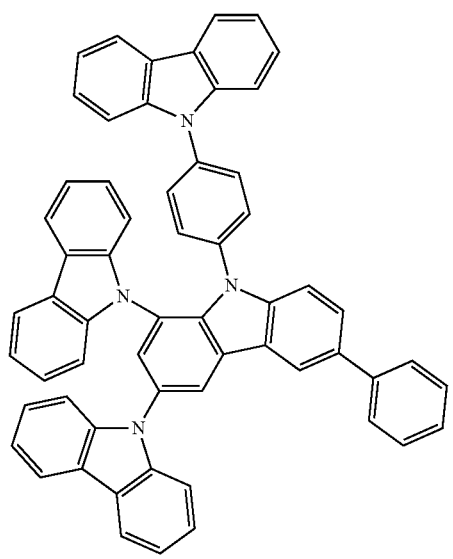
[Chemical Formula 13]
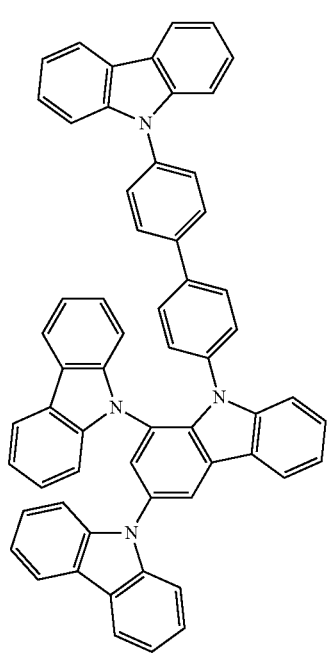
[Chemical Formula 14]
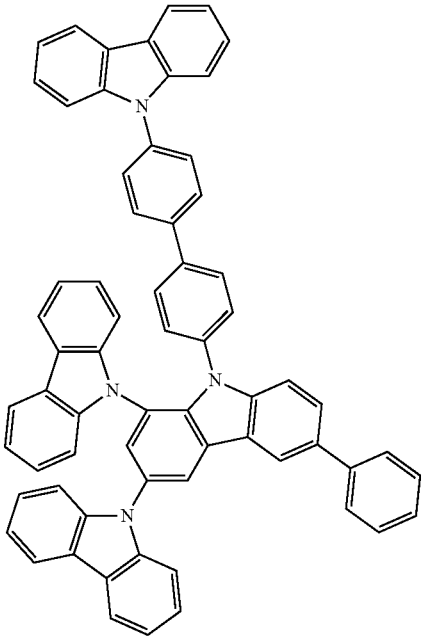
[Chemical Formula 15]
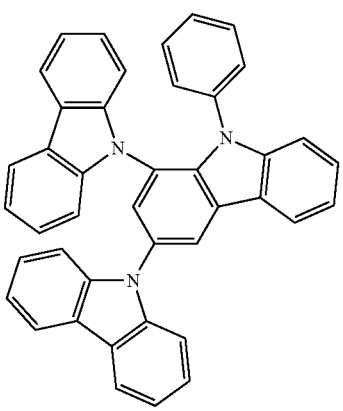
[Chemical Formula 16]
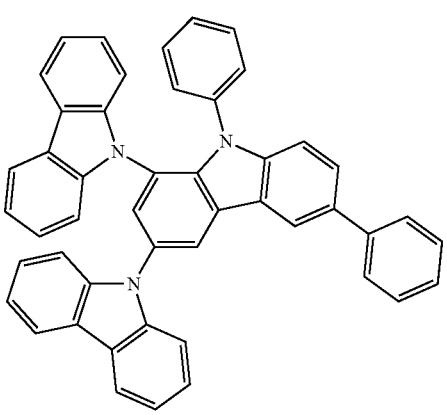

[Chemical Formula 17]
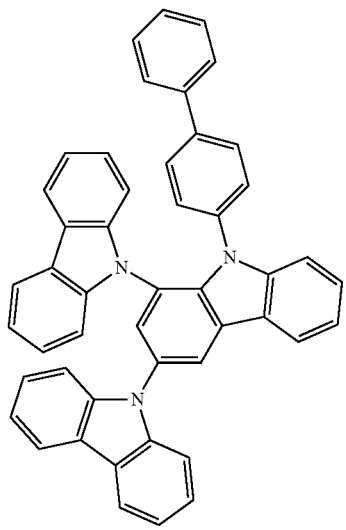
[Chemical Formula 18]
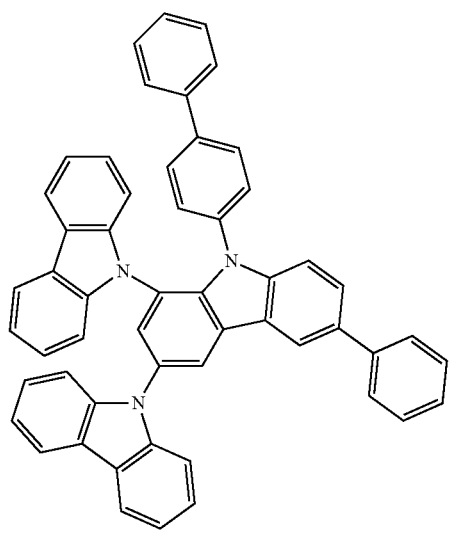
[Chemical Formula 19]
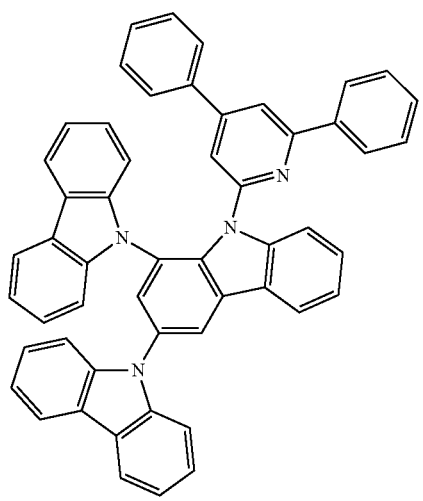
[Chemical Formula 20]
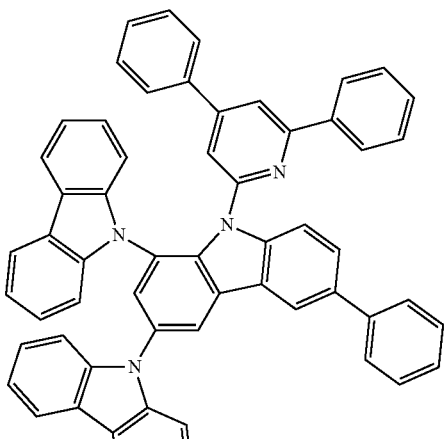
[Chemical Formula 21]
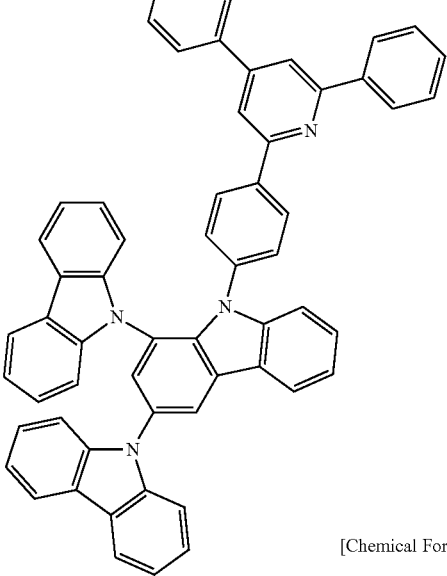
[Chemical Formula 22]
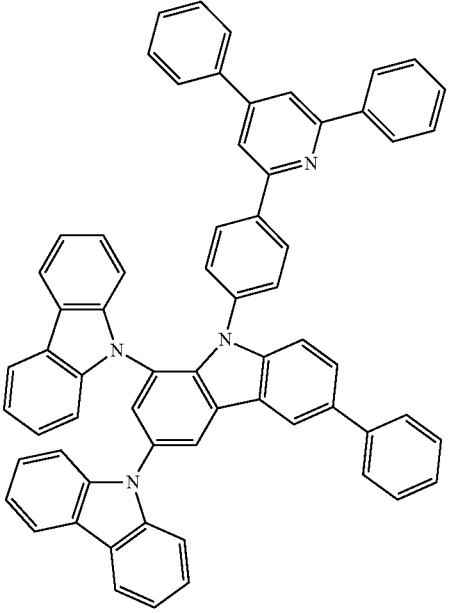

[Chemical Formula 23]
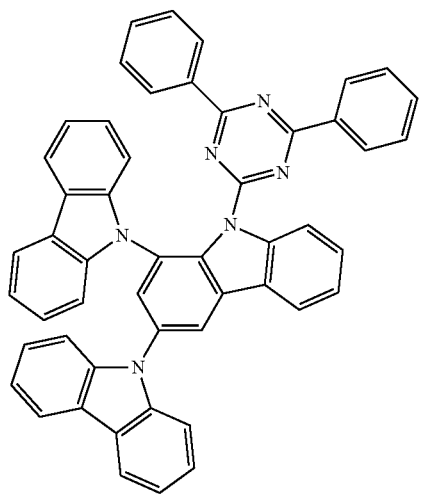
[Chemical Formula 24]
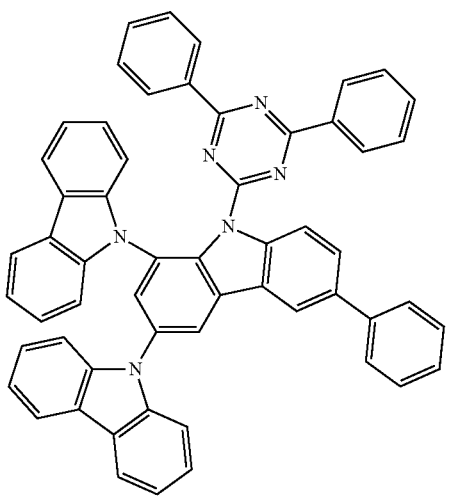
[Chemical Formula 25]
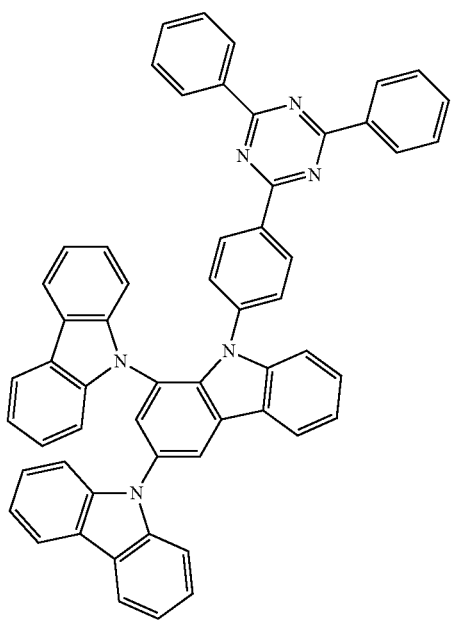
[Chemical Formula 26]
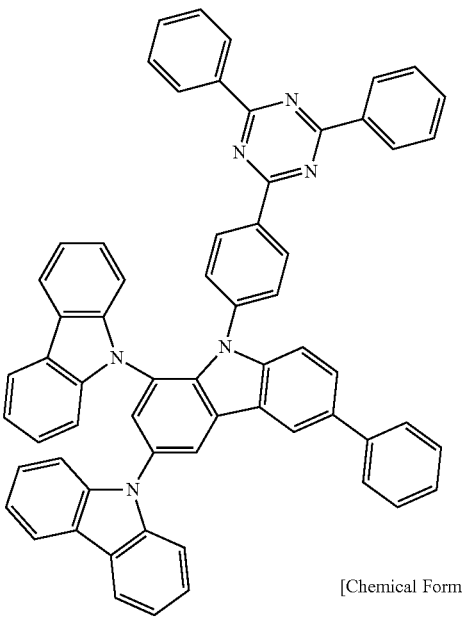
[Chemical Formula 27]
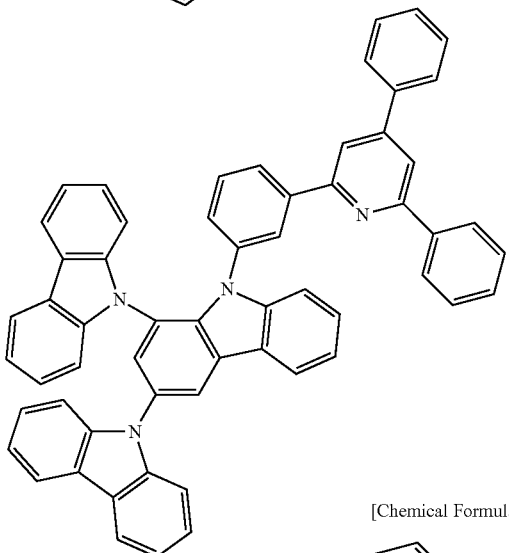
[Chemical Formula 28]
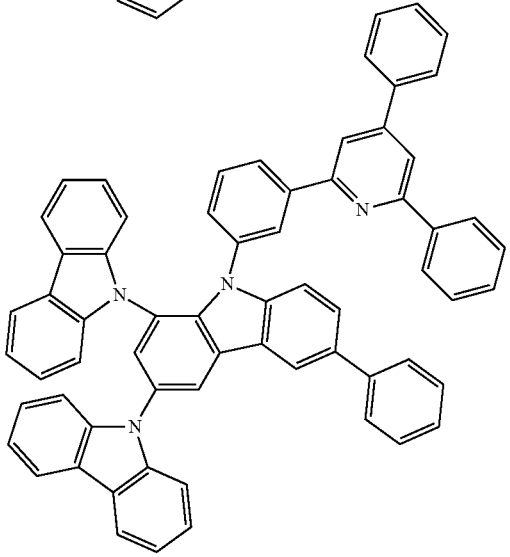

[Chemical Formula 29]
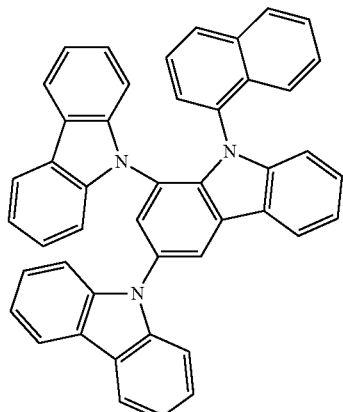
[Chemical Formula 30]
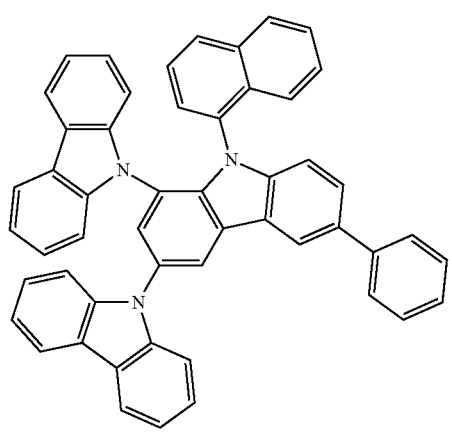
[Chemical Formula 31]
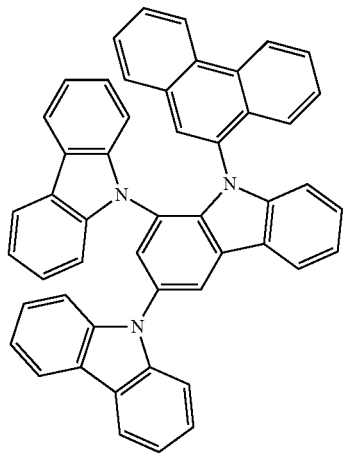
[Chemical Formula 32]
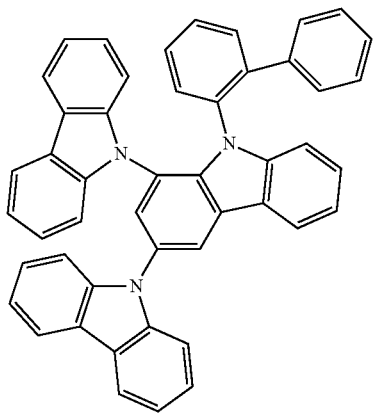
[Chemical Formula 33]
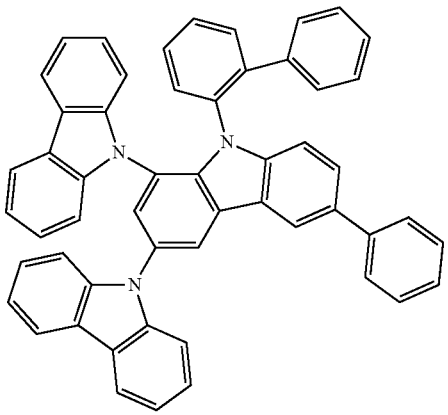
[Chemical Formula 34]
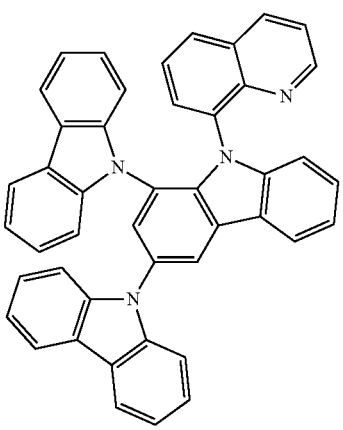

[Chemical Formula 35]
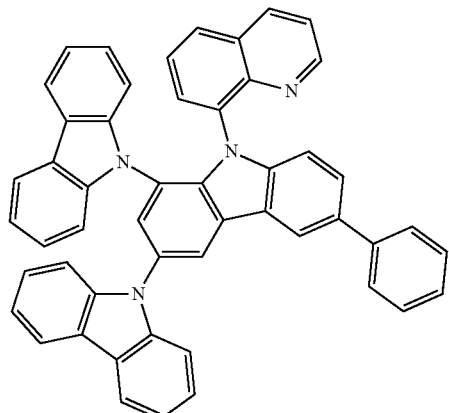
[Chemical Formula 36]
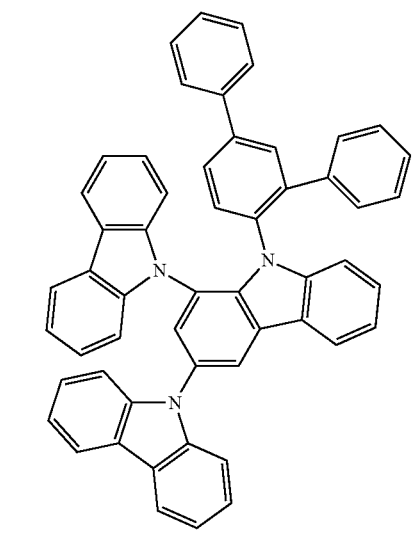
[Chemical Formula 37]
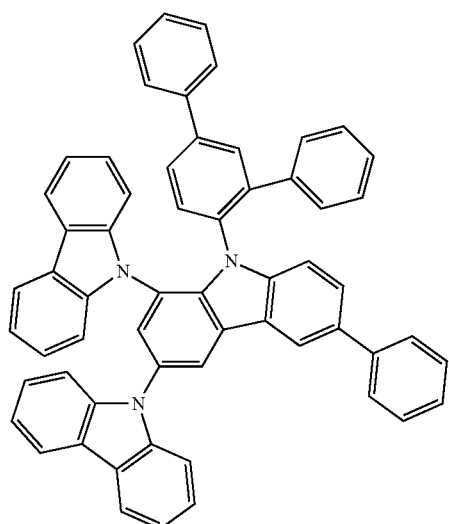
[Chemical Formula 38]
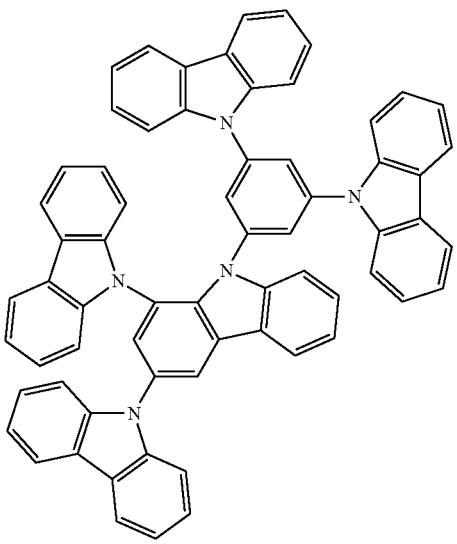
[Chemical Formula 39]
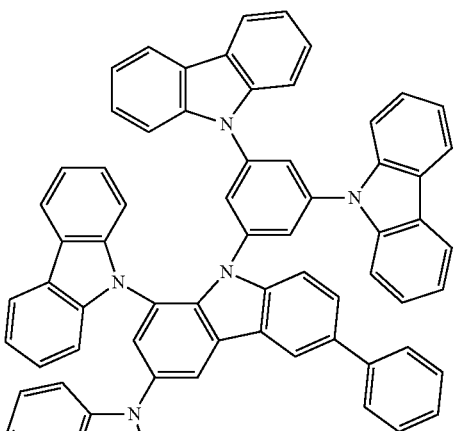
[Chemical Formula 40]
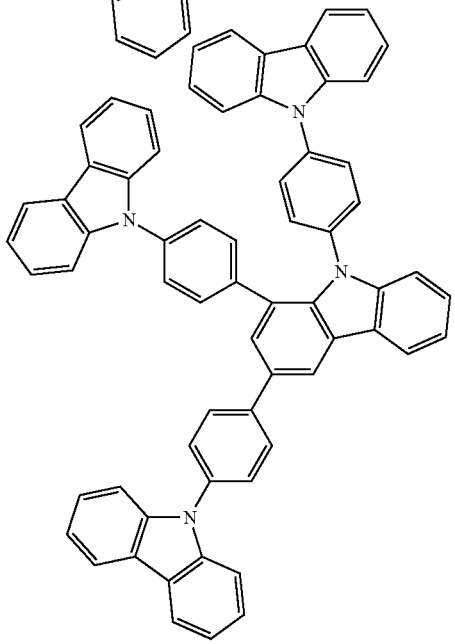

[Chemical Formula 41]
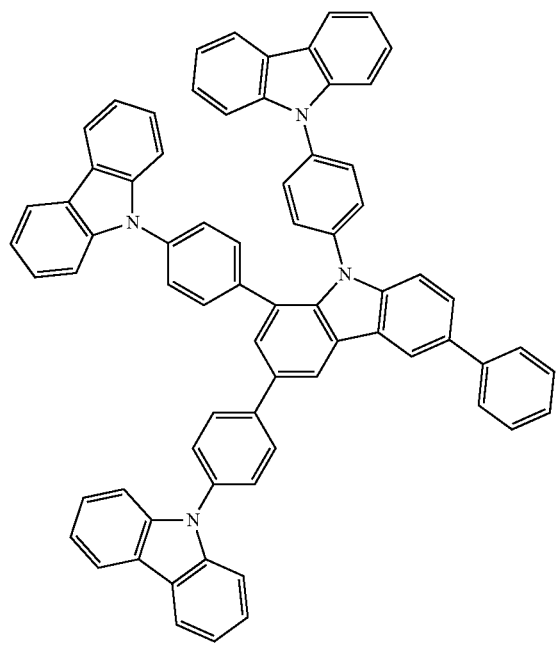
[Chemical Formula 42]
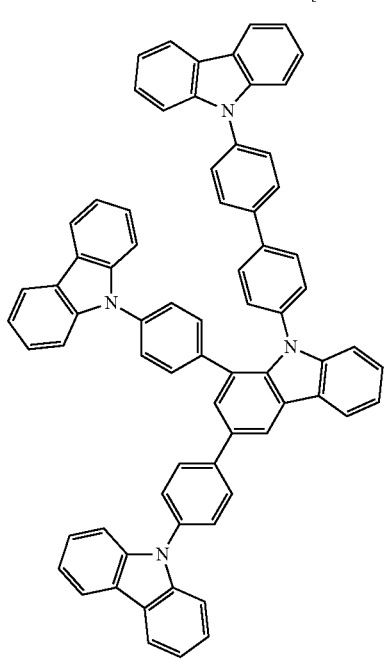
[Chemical Formula 43]
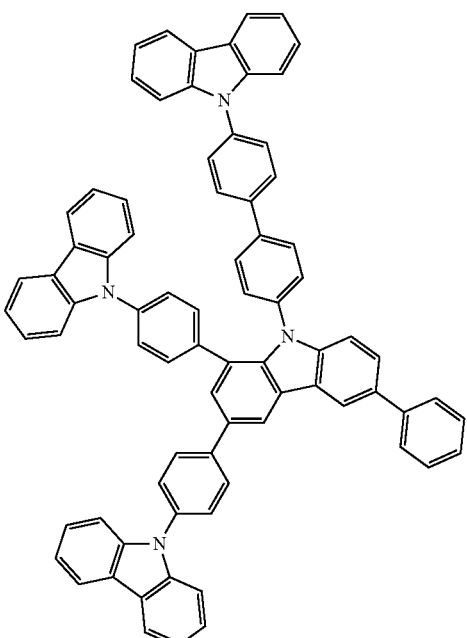
[Chemical Formula 44]
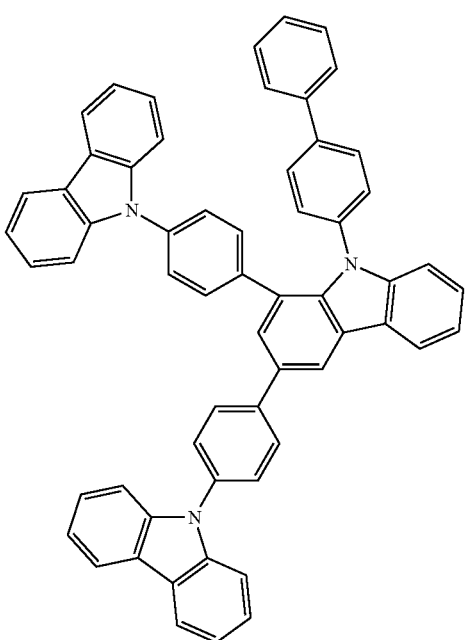

[Chemical Formula 45]
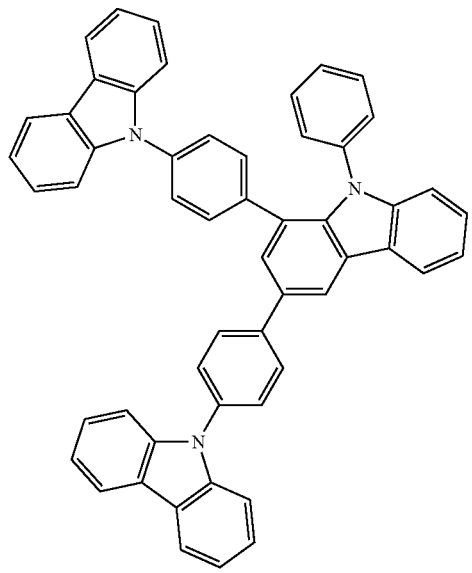
[Chemical Formula 46]
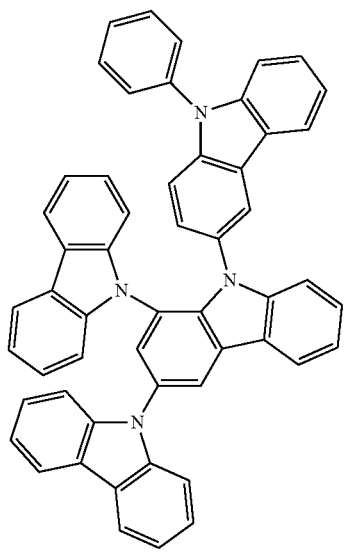
[Chemical Formula 47]
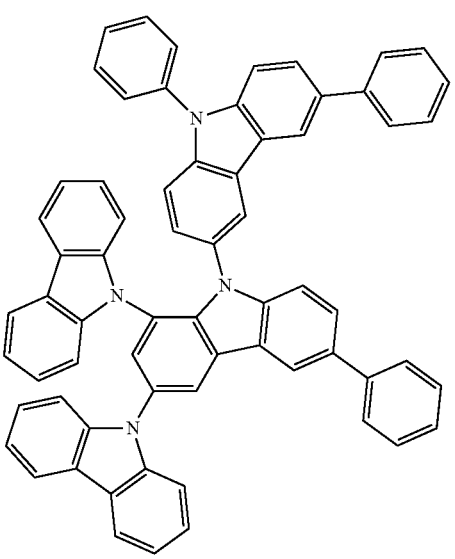
[Chemical Formula 48]
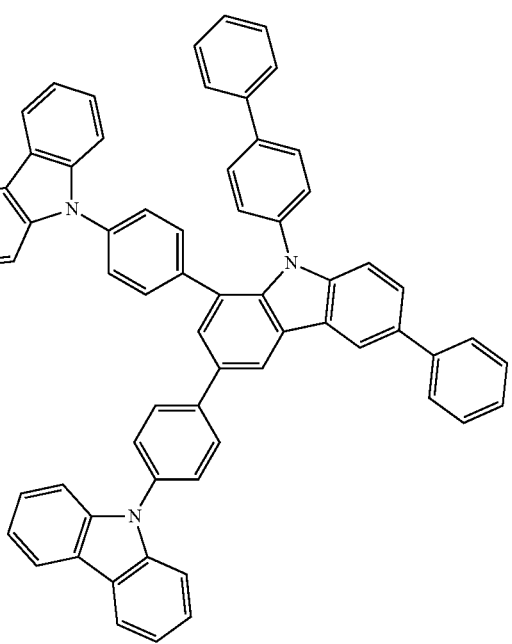

[Chemical Formula 49]
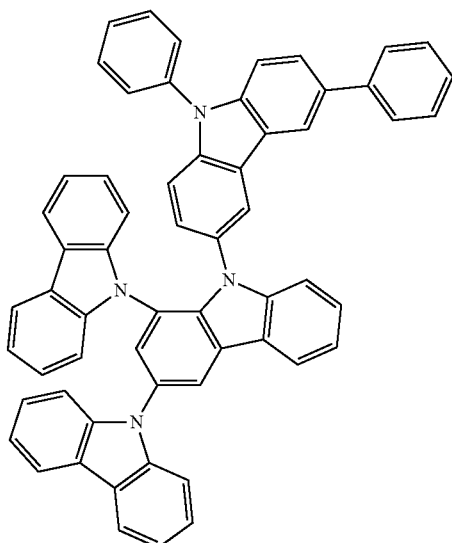
[Chemical Formula 50]
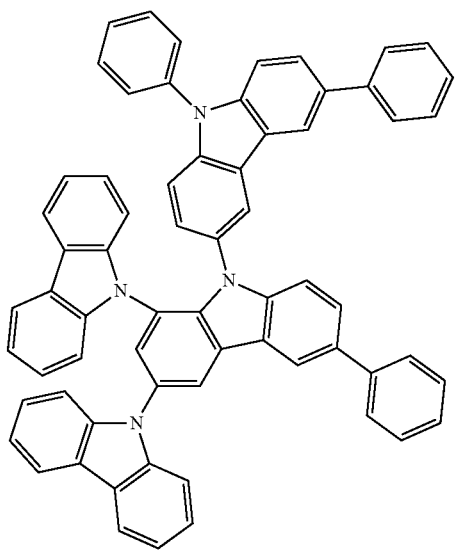
[Chemical Formula 51]
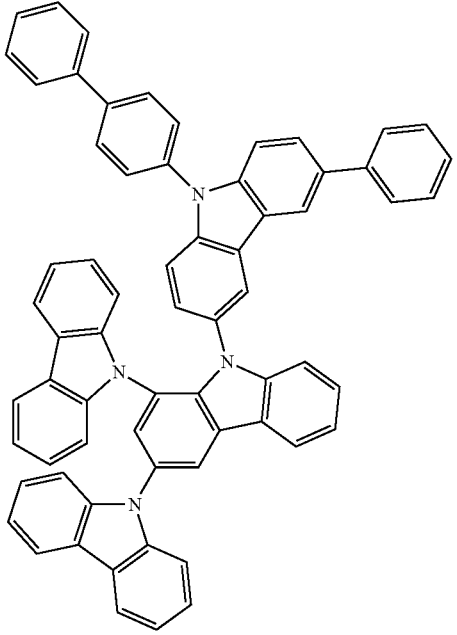
[Chemical Formula 52]
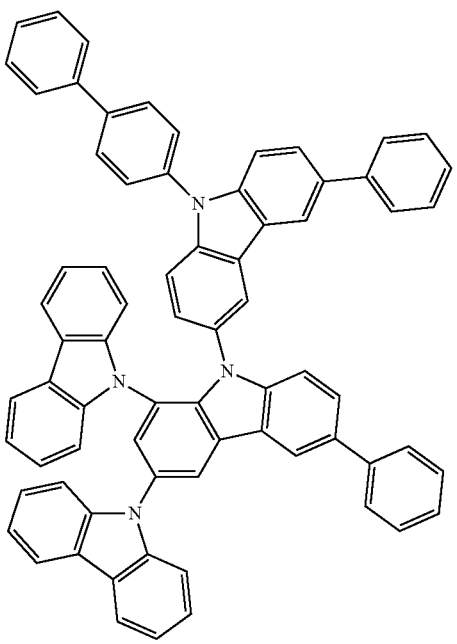

[Chemical Formula 53]
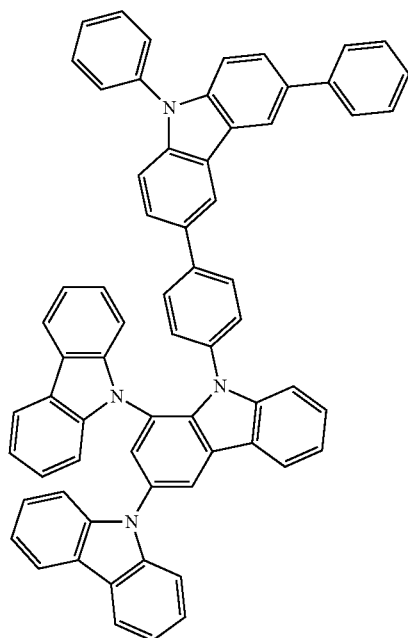
[Chemical Formula 54]
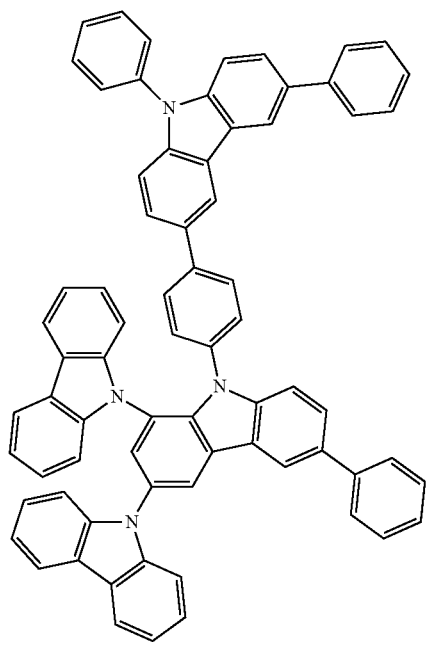
[Chemical Formula 55]
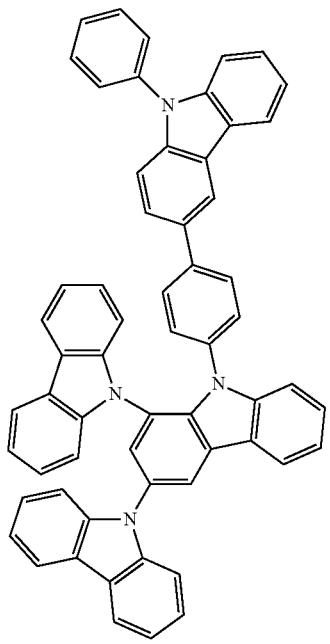
[Chemical Formula 56]
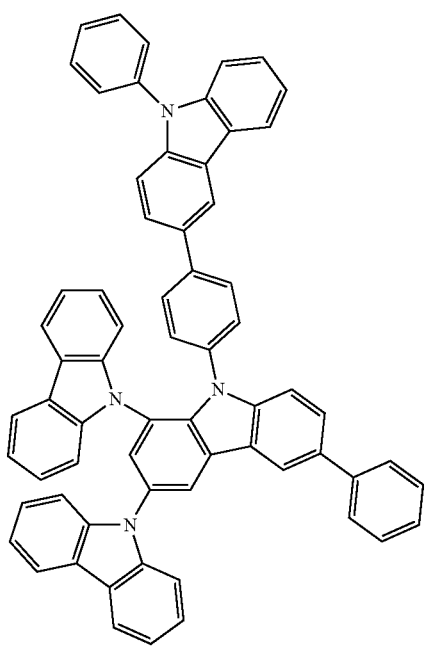

[Chemical Formula 57]
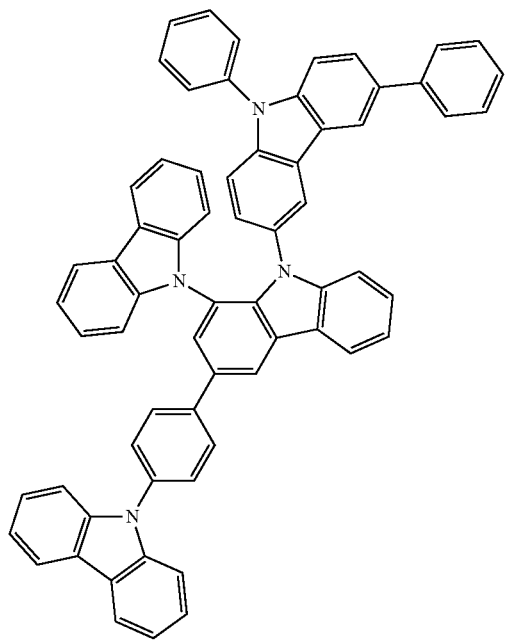
[Chemical Formula 58]
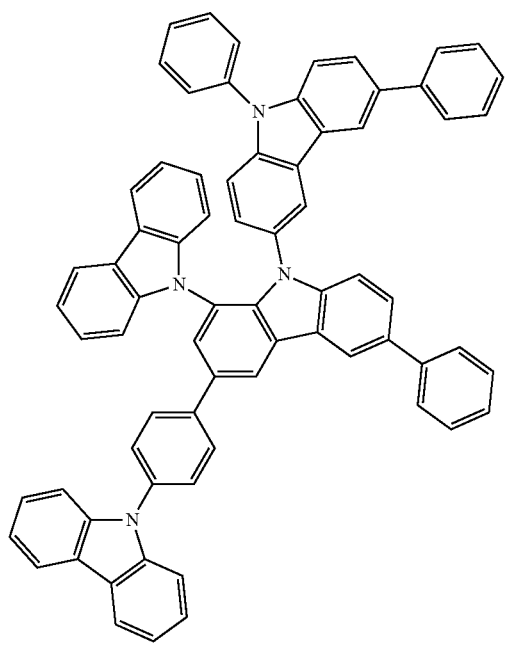
[Chemical Formula 59]
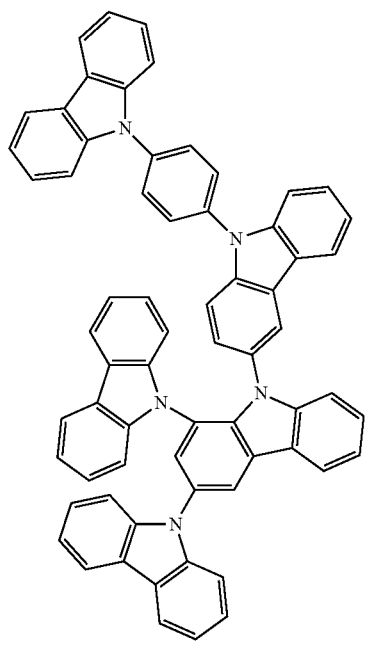
[Chemical Formula 60]
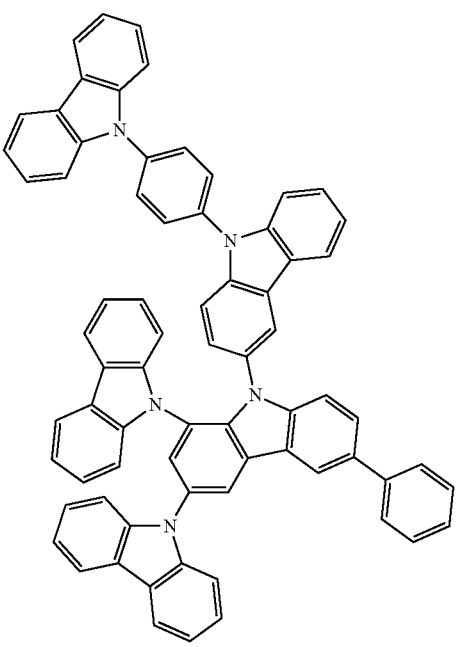

[Chemical Formula 61]
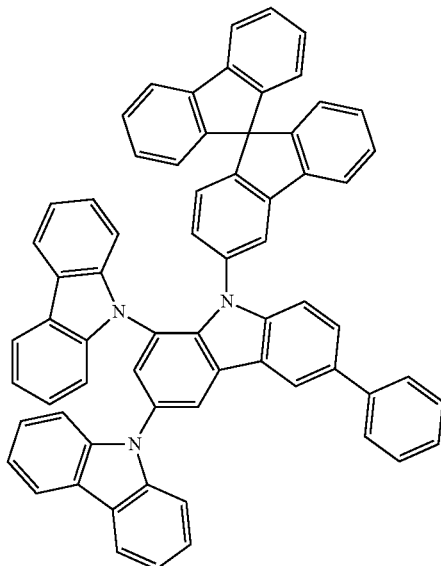
[Chemical Formula 63]
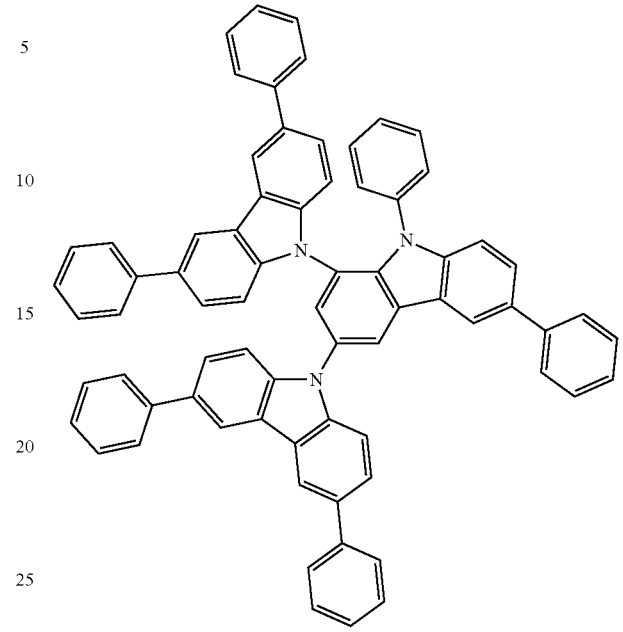
[Chemical Formula 62]
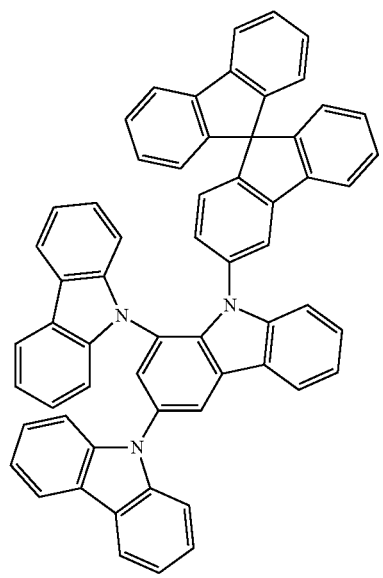
[Chemical Formula 64]
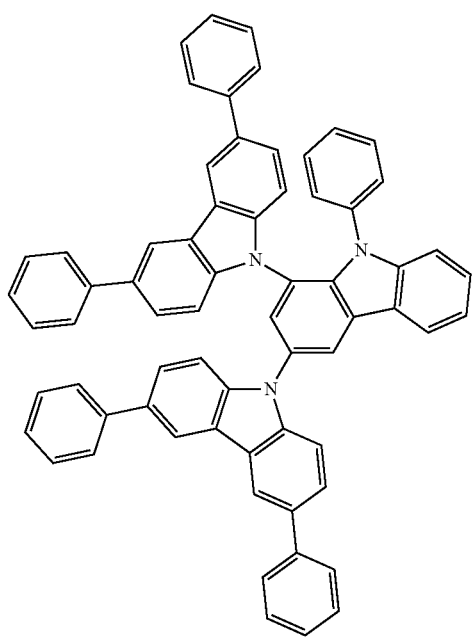

[Chemical Formula 65]
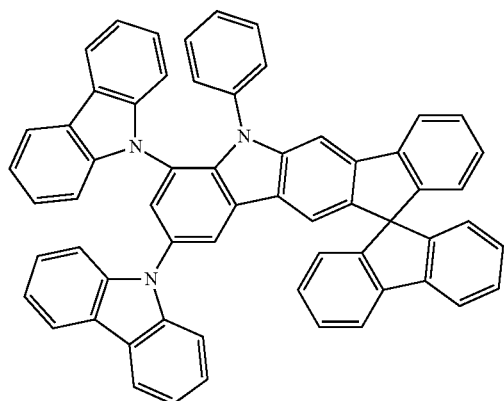
[Chemical Formula 66]
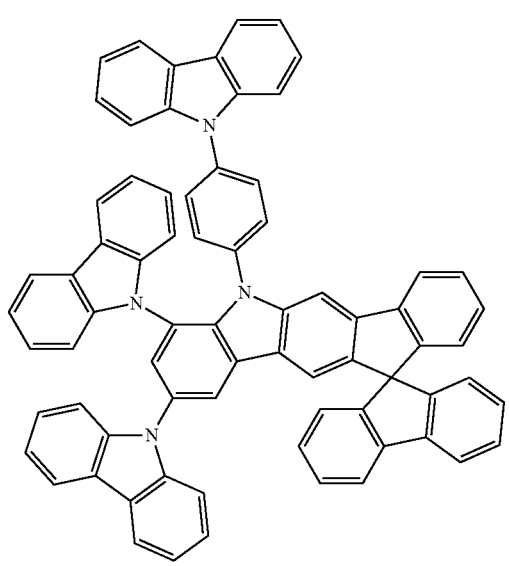
[Chemical Formula 67]
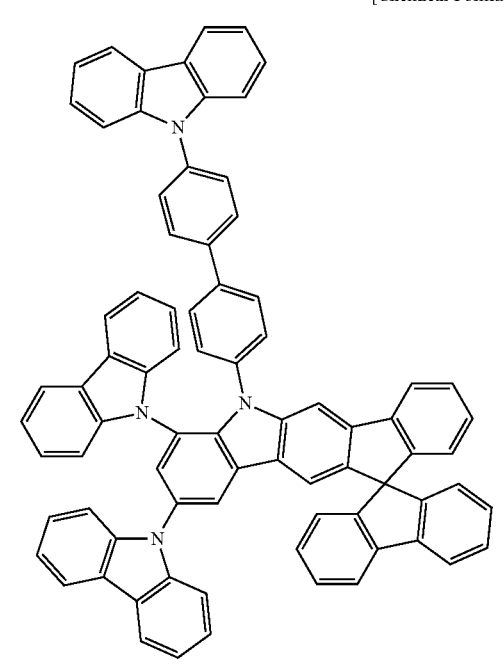
[Chemical Formula 68]
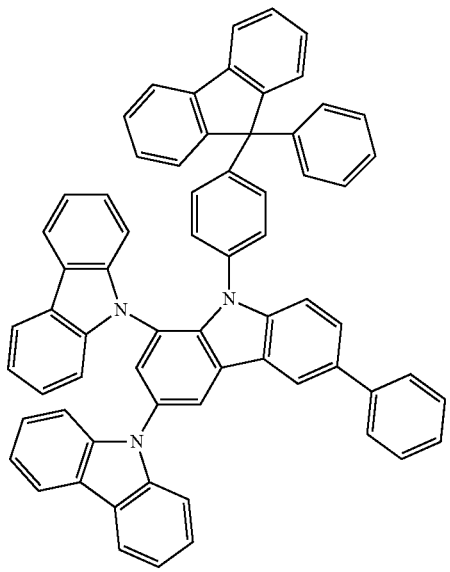
[Chemical Formula 69]
[Chemical Formula 70]
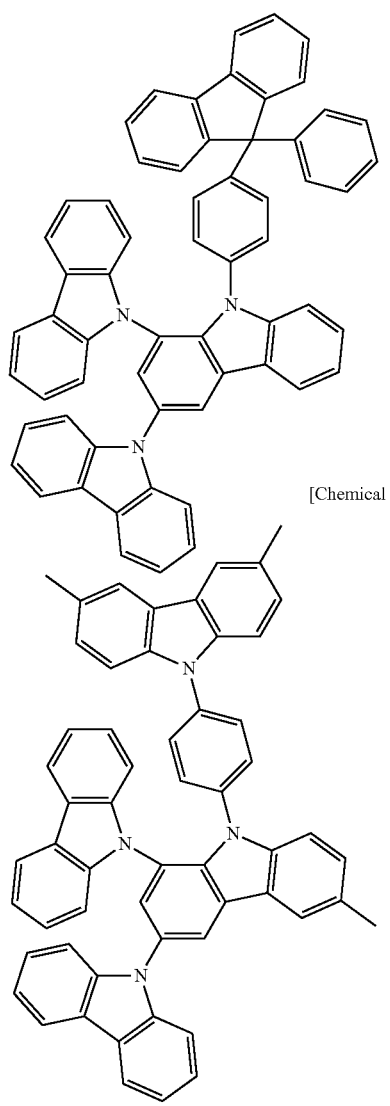

[Chemical Formula 71]
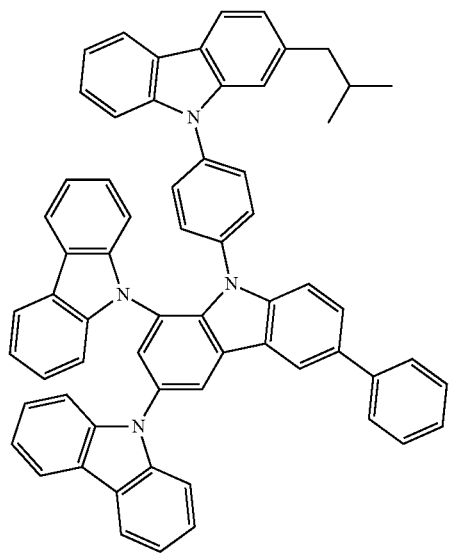
[Chemical Formula 72]
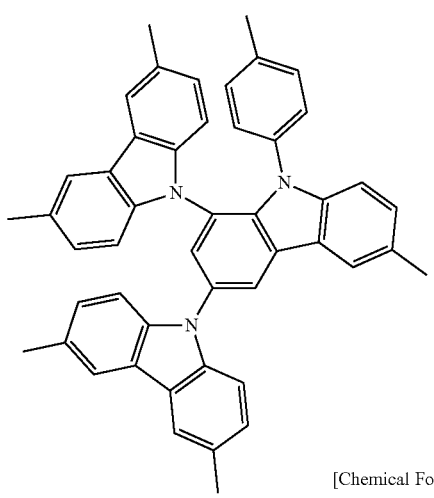
[Chemical Formula 73]
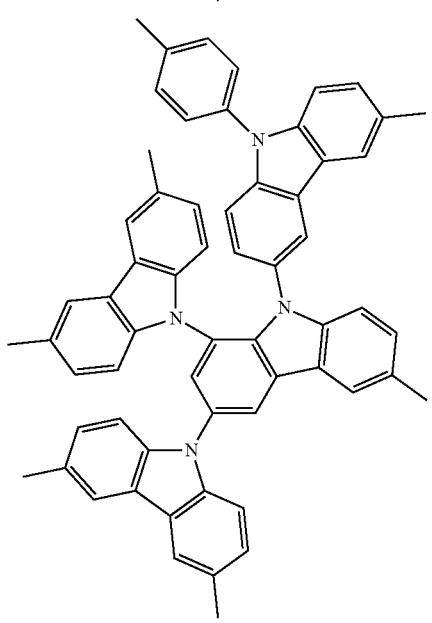
[Chemical Formula 74]
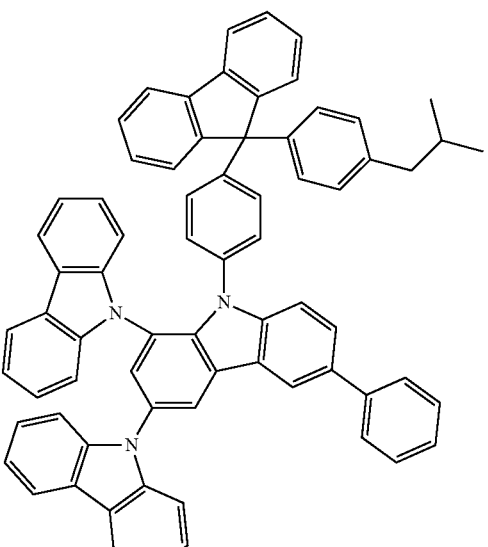
[Chemical Formula 75]
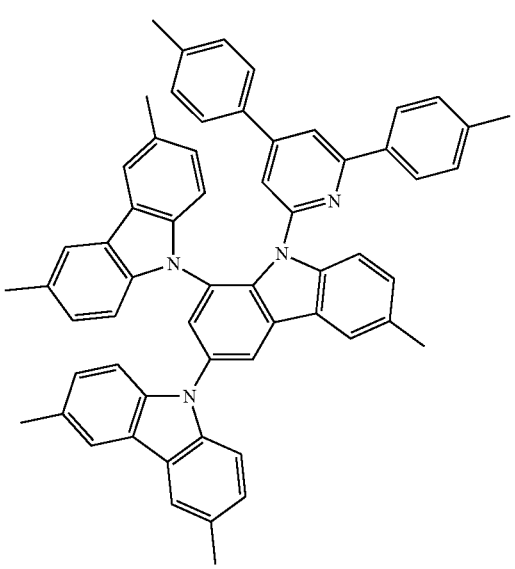
[Chemical Formula 76]

[Chemical Formula 77]
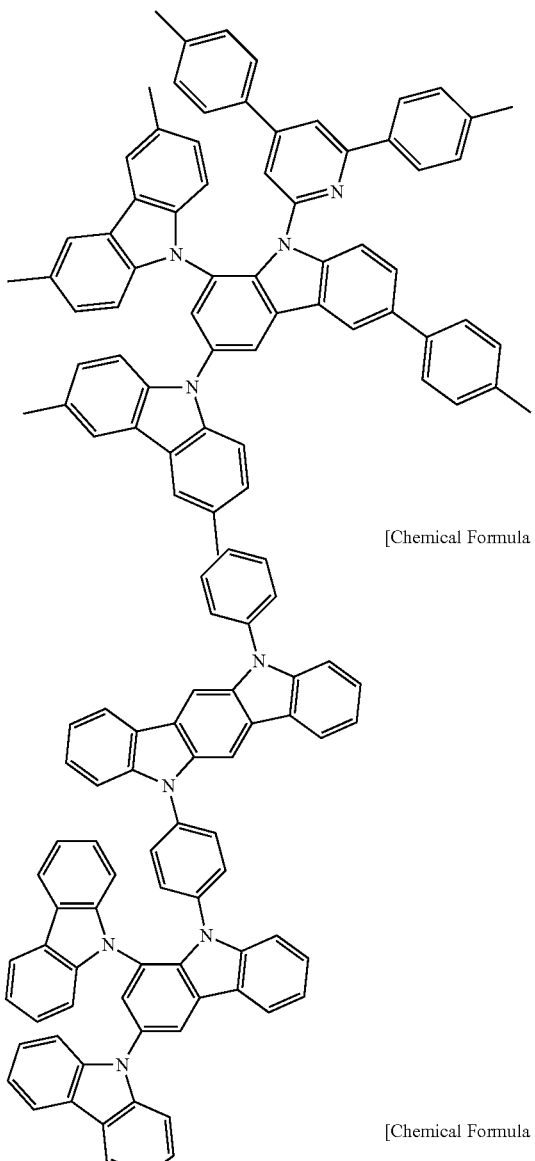
[Chemical Formula 78]
[Chemical Formula 79]
[Chemical Formula 80]
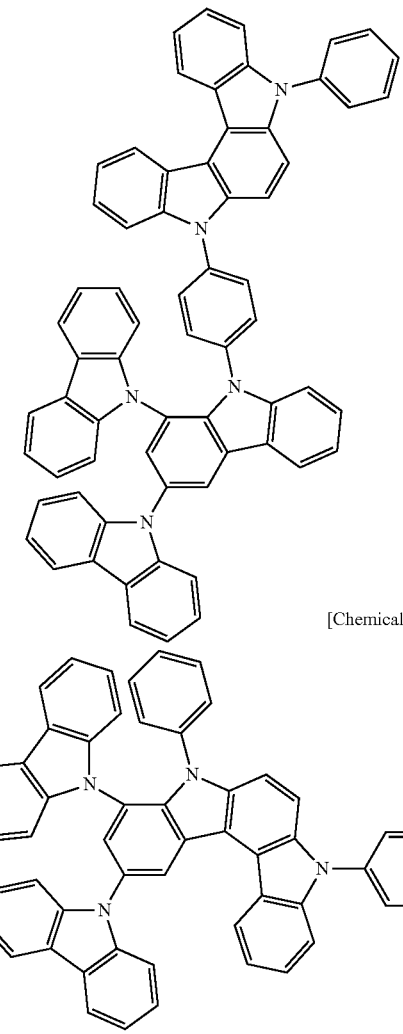
[Chemical Formula 81]
The compound represented by Chemical Formula 1 may be represented by the following Chemical Formula 2:
[Chemical Formula 2]
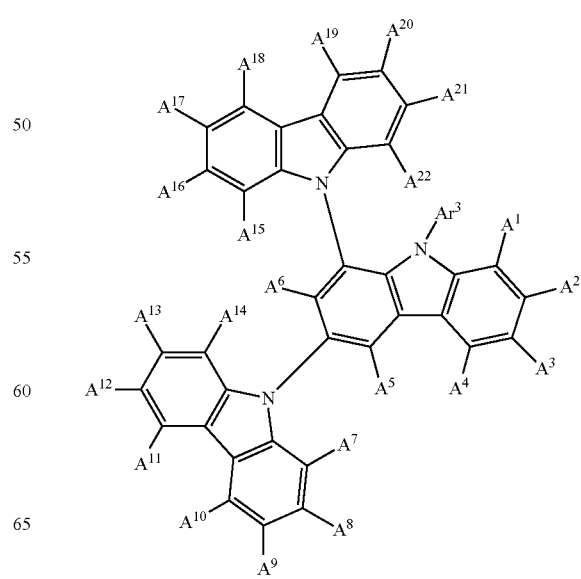

wherein $Ar^3$ is selected from the group of a substituted or unsubstituted C6 to C30 aryl group, a substituted or unsubstituted C5 to C30 heteroaryl group, and a substituted or unsubstituted C1 to C30 alkyl group, and $A^1$ to $A^{22}$ are each independently selected from the group of hydrogen, a substituted or unsubstituted C6 to C30 aryl group, a substituted or unsubstituted C5 to C30 heteroaryl group, and a substituted or unsubstituted C1 to C30 alkyl group.

At least one of $A^1, A^3, A^7, A^9, A^{12}, A^{14}, A^{15}, A^{17}, A^{20}$, and $A^{22}$ may be independently selected from the group of a substituted or unsubstituted C6 to C30 aryl group, a substituted or unsubstituted C5 to C30 heteroaryl group, and a substituted or unsubstituted C1 to C30 alkyl group.

At least one of $A^1, A^3, A^7, A^9, A^{12}, A^{14}, A^{15}, A^{17}, A^{20}$, and $A^{22}$ may be independently selected from the group of a substituted or unsubstituted C6 to C12 aryl group, a substituted or unsubstituted C5 to C12 heteroaryl group, and a substituted or unsubstituted C1 to C4 alkyl group.

The embodiments may also be realized by providing an organic photoelectric device including an anode; a cathode; and at least one organic thin layer between the anode and cathode, wherein the at least one organic thin layer includes the compound according to an embodiment.

The at least one organic thin layer may include one selected from the group of an emission layer, a hole transport layer (HTL), a hole injection layer (HIL), an electron transport layer (ETL), an electron injection layer (EIL), a hole blocking layer, and a combination thereof.

The at least one organic thin layer may include one of an electron transport layer (ETL) and an electron injection layer (EIL), and the compound may be included in the electron transport layer (ETL) or the electron injection layer (EIL).

The at least one organic thin layer may include an emission layer, and the compound may be included in the emission layer.

The at least one organic thin layer may include an emission layer, and the compound may be a phosphorescent or fluorescent host material in the emission layer.

The at least one organic thin layer may include an emission layer, and the compound may be a fluorescent blue dopant material in the emission layer.

The organic photoelectric device may be selected from the group of an organic light emitting diode, an organic solar cell, an organic transistor, an organic photo-conductor drum, and an organic memory device.

The embodiments may also be realized by providing a display device including the organic photoelectric device according to an embodiment.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
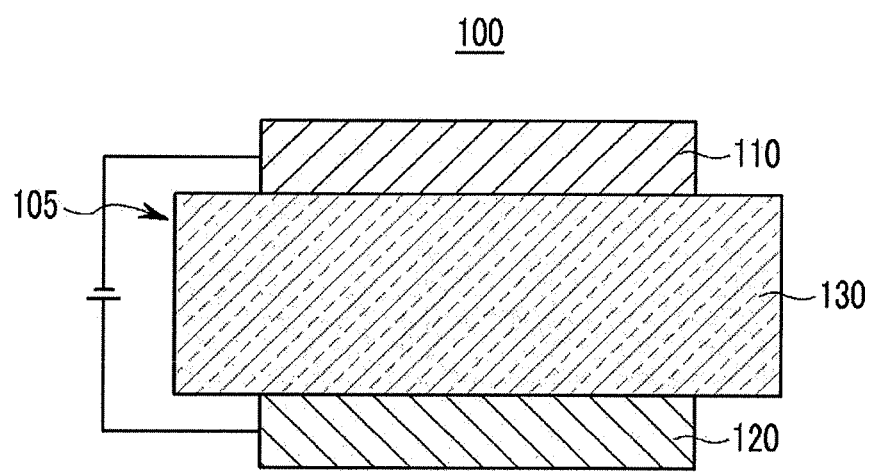
FIGS. 1 to 5 illustrate cross-sectional views showing organic light emitting diodes including compounds according to various embodiments.

Korean Patent Application No. 10-2009-0100413, filed on Oct. 21, 2009, in the Korean Intellectual Property Office, and entitled: "Novel Compound for Organic Photoelectric Device and Organic Photoelectric Device Including the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

As used herein, when specific definition is not otherwise provided, the term "substituted" may refer to one substituted with at least a substituent selected from the group of a C1 to C30 alkyl group, a C1 to C10 alkylsilyl group, a C3 to C30 cycloalkyl group, a C6 to C30 aryl group, a C1 to C10 alkoxy group, a fluoro, a C1 to 10 trifluoroalkyl group such as trifluoromethyl and the like, or a cyano group.

As used herein, when specific definition is not otherwise provided, the term "hetero" may refer to one including 1 to 3 of N, O, S, or P, and remaining carbons in one ring.

As used herein, when a definition is not otherwise provided, the term "combination thereof" may refer to at least two substituents bound to each other by a linker, or at least two substituents condensed to each other.

As used herein, when a definition is not otherwise provided, the term "alkyl" may refer to an aliphatic hydrocarbon group. The alkyl may be a saturated alkyl group that does not include any alkene or alkyne. Alternatively, the alkyl may be an unsaturated alkyl group that includes at least one alkene or alkyne. The term "alkene" may refer to a group in which at least two carbon atoms are bound in at least one carbon-carbon double bond; and the term "alkyne" may refer to a group in which at least two carbon atoms are bound in at least one carbon-carbon triple bond. Regardless of being saturated or unsaturated, the alkyl may be branched, linear, or cyclic.

The alkyl group may have 1 to 20 carbon atoms. The alkyl group may be a medium-sized alkyl having 1 to 10 carbon atoms. The alkyl group may be a lower alkyl having 1 to 6 carbon atoms.

For example, a C1-C4 alkyl may have 1 to 4 carbon atoms and may be selected from the group of methyl, ethyl, propyl, iso-propyl, n-butyl, iso-butyl, sec-butyl, and t-butyl.

Examples of an alkyl group may include methyl, ethyl, propyl, isopropyl, butyl, isobutyl, t-butyl, pentyl, hexyl, ethenyl, propenyl, butenyl, cyclopropyl, cyclobutyl, cyclopentyl, cyclohexyl, or the like, which may be individually and independently substituted.

The term "aryl" may refer to an aryl group including a carbocyclic aryl (e.g., phenyl) having at least one ring having a covalent pi electron system. The term may also refer to monocyclic or fusion ring polycyclic (i.e., rings sharing adjacent pairs of carbon atoms) groups. In addition, this term may also refer to a spiro compound having a contact point of one carbon.

The term "heteroaryl" may refer to an aryl group including a heterocyclic aryl (e.g., pyridine) having at least one ring having a covalent pi electron system. The term may also refer to monocyclic or fusion ring polycyclic (i.e., groups sharing adjacent pairs of carbon atoms) groups. In addition, the term may also refer to a spiro compound having a contact point of one carbon.

The compound for an organic photoelectric device according to an embodiment may have a structure in which two carbazole moieties are directly or indirectly bound to a core of another carbazole moiety, e.g., in a center of the core of the carbazole moiety.

In addition, the compound for an organic photoelectric device may include a compound having various energy band gaps by introducing various substituents into the core of the carbazole moiety and two carbazole moieties bound to the core of the carbazole moiety, so it may be used for compounds satisfying conditions desirable for the emission layer as well as the electron injection layer (EIL) and/or electron transport layer.

As described above, the organic photoelectric device may include the compound having the appropriate energy level depending upon the substituents. Thus, the electron transporting property may be enforced to provide excellent efficiency and driving voltage, and the electrochemical and thermal stability may be improved to help enhance the life-span characteristic while driving the organic photoelectric device.

According to an embodiment, a compound for an organic photoelectric device may be represented by the following Chemical Formula 1.

[Chemical Formula 1]

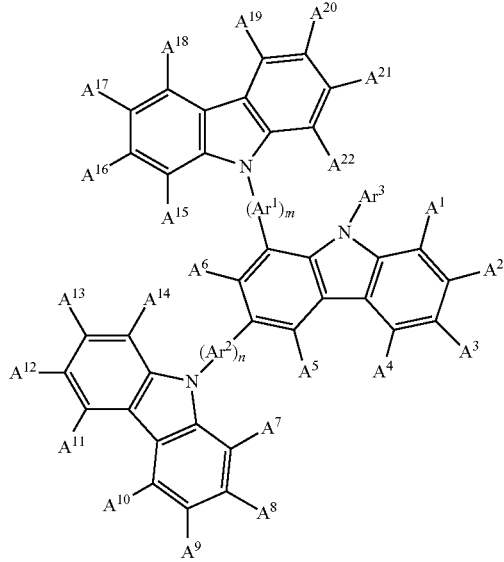

In Chemical Formula 1, $Ar^1$ and $Ar^2$ may each independently be a substituted or unsubstituted C6 to C30 arylene group. For example, $Ar^1$ and $Ar^2$ may each independently be a substituted or unsubstituted phenylene group, or a continuously bound of a substituted or unsubstituted phenylene group. m and n may be 0 or 1.

$A^1$ to $A^{22}$ may each independently be selected from the group of hydrogen, a substituted or unsubstituted C6 to C30 aryl group, a substituted or unsubstituted C5 to C30 heteroaryl group, and a substituted or unsubstituted C1 to C30 alkyl group.

$Ar^3$ may be selected from the group of a substituted or unsubstituted C6 to C30 aryl group, a substituted or unsubstituted C5 to C30 heteroaryl group, and a substituted or unsubstituted C1 to C30 alkyl group. In an implementation, $Ar^3$ may be a substituted or unsubstituted C6 to C25 aryl group or a substituted or unsubstituted C5 to C20 heteroaryl group.

In an implementation, the compound represented by Chemical Formula 1 may exhibit asymmetry.

In an implementation, $Ar^1$ and $Ar^2$ may not be present, and two carbazole moieties may be directly bound to the core of a carbazole moiety. For example, the compound represented by Chemical Formula 1 may be represented by the following Chemical Formula 2.

[Chemical Formula 2]

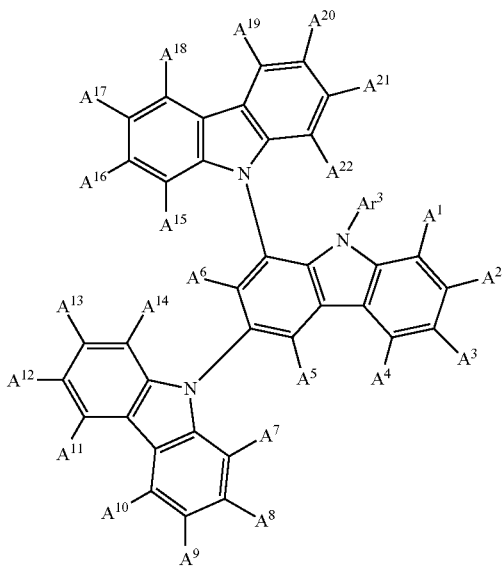

In Chemical Formula 2, $Ar^3$ and $A^1$ to $A^{22}$ may be the same as described above with respect to Chemical Formula 1.

Light emission may be controlled in the visible region by adjusting a π-conjugation length of $Ar^1$ and $Ar^2$. Accordingly, the compound may be usefully applied to the emission layer of an organic photoelectric device. For example, maintaining the carbon number at about 30 or less may help ensure that it is possible to obtain sufficient effects for the device.

The carbazole core structure that is bound with the substituent may have improved thermal stability and/or oxidation resistance. Thus, it may help improve the life-span characteristic of an organic photoelectric device.

Non-limiting examples of $Ar^3$ of Chemical Formulae 1 and 2 may include groups represented by the following Chemical Formulae 3 to 10.

[Chemical Formula 3]

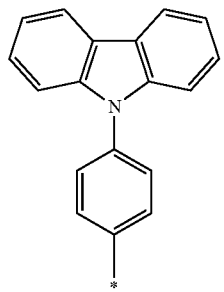

[Chemical Formula 4]

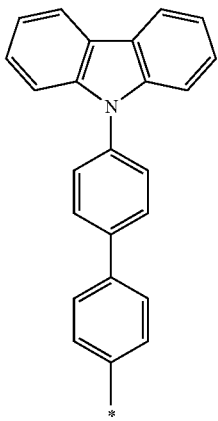

[chemical Formula 5]

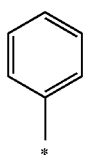

[Chemical Formula 6]

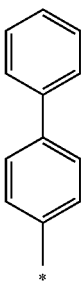

[Chemical Formula7]

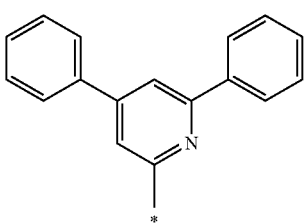

[Chemical Formula 8]

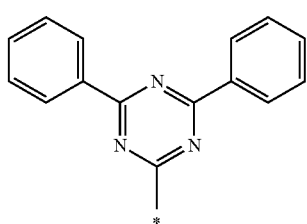

[Chemical Formula 9]

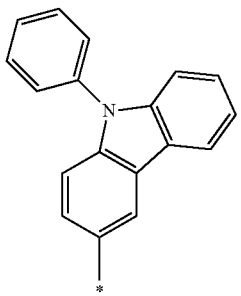

[Chemical Formula 10]

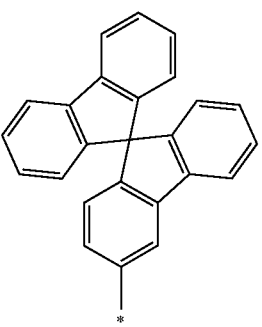

In the above Chemical Formulae 3-10, * refers to a position at which a substituent is bound, e.g., a position at which the group is bound to the N atom of the core carbazole moiety of Chemical Formula 1 or 2.

As described above, $A^1$ to $A^{22}$ may each independently be selected from the group of hydrogen, a substituted or unsubstituted C6 to C30 aryl group, a substituted or unsubstituted C5 to C30 heteroaryl group, and a substituted or unsubstituted C1 to C30 alkyl group. The tri-carbazole structure that is bound with the substituent may have excellent light emitting characteristics and mobility of electrons/holes.

In an implementation, at least one substituent selected from the group of $A^1$, $A^3$, $A^7$, $A^9$, $A^{12}$, $A^{14}$, $A^{15}$, $A^{17}$, $A^{20}$, and $A^{22}$ may be independently selected from the group of a substituted or unsubstituted C6 to C30 aryl group, a substituted or unsubstituted C5 to C30 heteroaryl group, and a substituted or unsubstituted C1 to C30 alkyl group.

In an implementation, at least one substituent selected from the group of $A^1$, $A^3$, $A^7$, $A^9$, $A^{12}$, $A^{14}$, $A^{15}$, $A^{17}$, $A^{20}$, and $A^{22}$ may be independently selected from the group of a substituted or unsubstituted C6 to C12 aryl group, a substituted or unsubstituted C5 to C12 heteroaryl group, and a substituted or unsubstituted C1 to C4 alkyl group.

Maintaining the carbon number of the substituent $A^1$, $A^3$, $A^7$, $A^9$, $A^{12}$, $A^{14}$, $A^{15}$, $A^{17}$, $A^{20}$, and $A^{22}$ within the ranges described above may help ensure that the molecular weight of the compound is sufficiently small, thereby ensuring that a sublimation/refinement process may be performed at a relatively low temperature.

The compound for an organic photoelectric device may be represented by the following Chemical Formula 11 to Chemical Formula 81. For example, the compound for an organic photoelectric device represented by Chemical Formula 1 (or Chemical Formula 2) may be represented by one of the following Chemical Formula 11 to Chemical Formula 81. However, the embodiments are not limited to the following compounds.

[Chemical Formula 11]
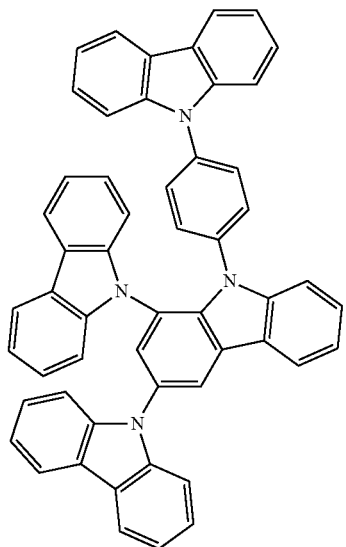
[Chemical Formula 12]
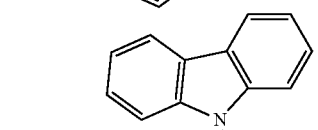
[Chemical Formula 13]
[Chemical Formula 14]
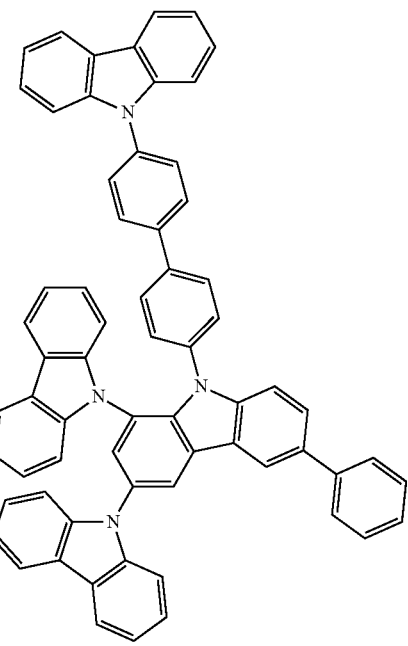
[Chemical Formula 15]
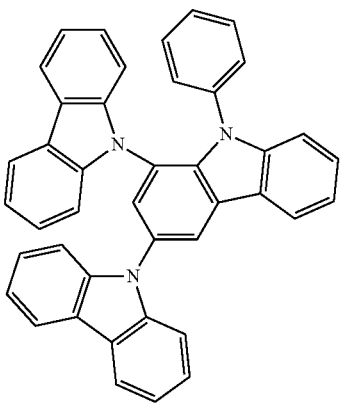
[Chemical Formula 16]
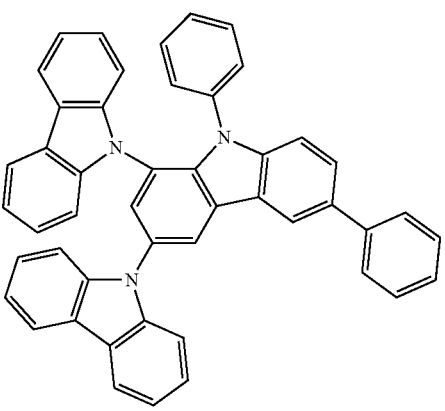

-continued
[Chemical Formula 17]
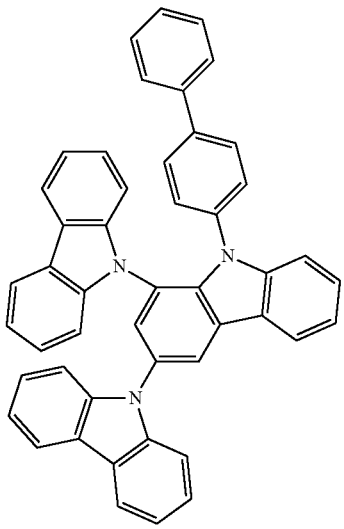
[Chemical Formula 18]
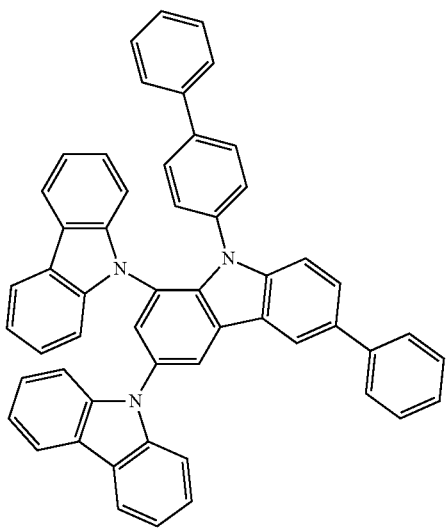
[Chemical Formula 19]
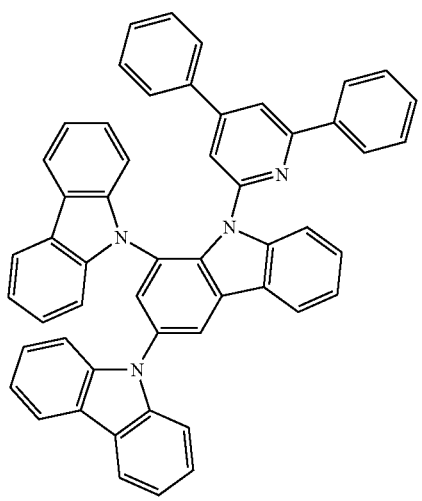
[Chemical Formula 20]
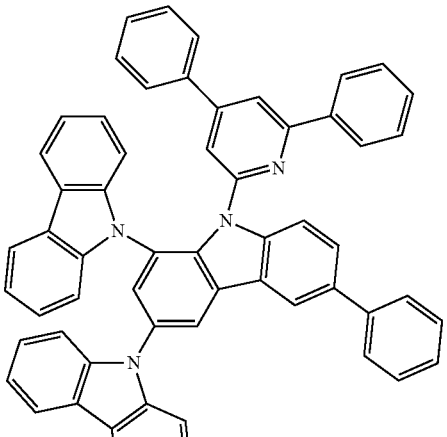
[Chemical Formula 21]
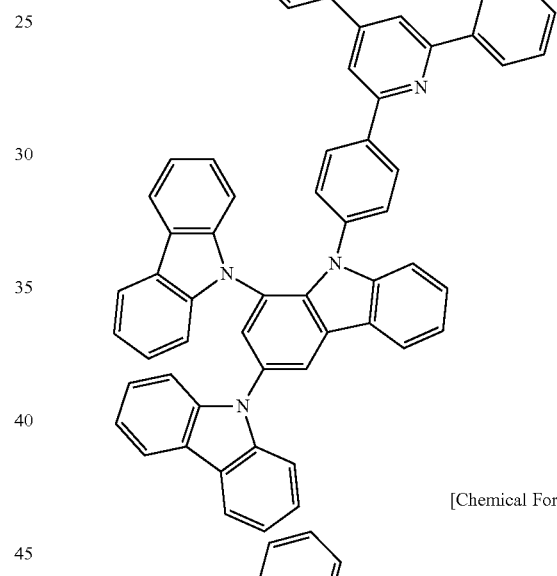
[Chemical Formula 22]
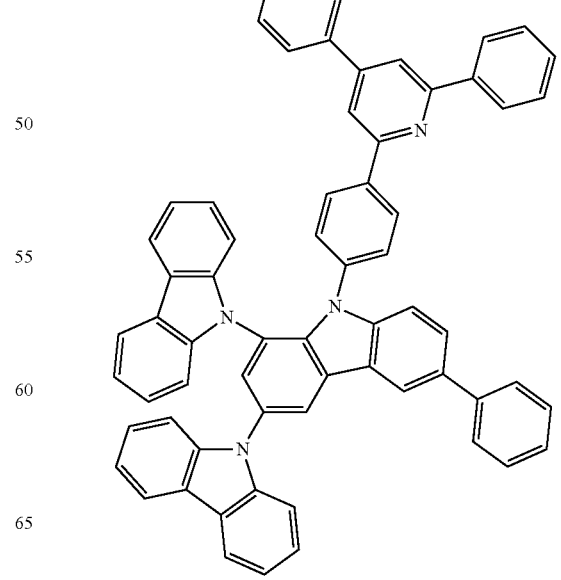

[Chemical Formula 23]
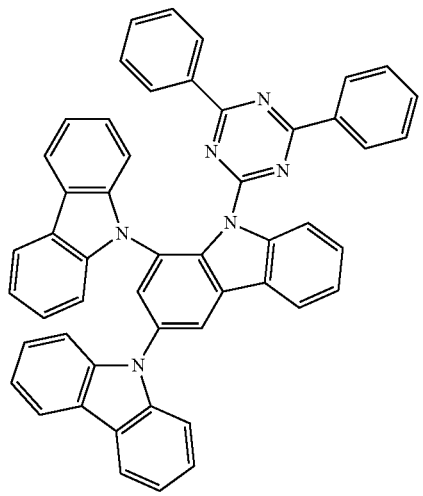
[Chemical Formula 24]
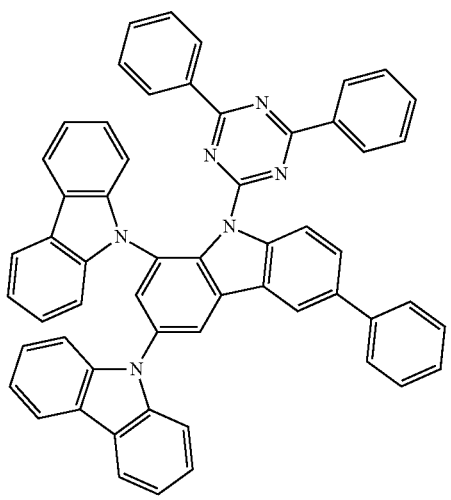
[Chemical Formula 25]
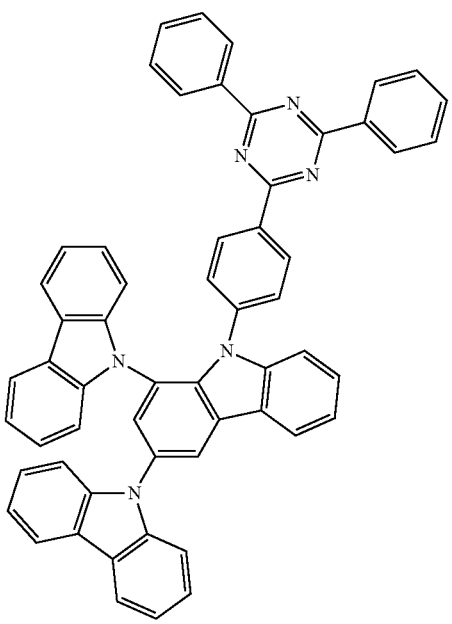
[Chemical Formula 26]
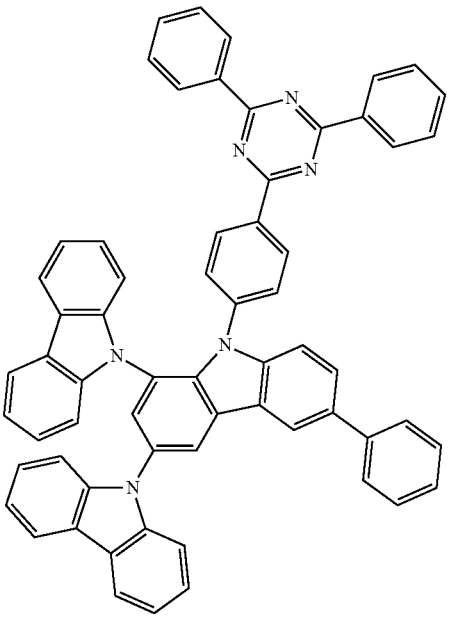
[Chemical Formula 27]
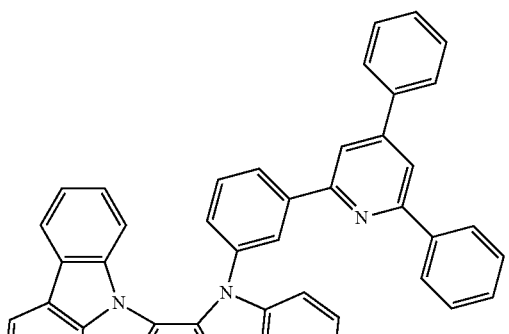
[Chemical Formula 28]
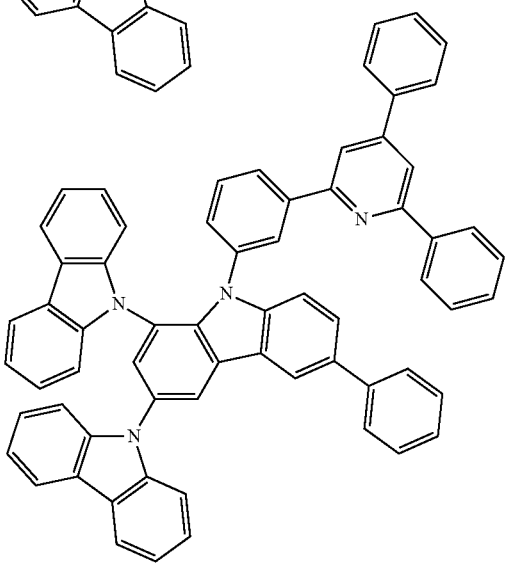

[Chemical Formula 29]
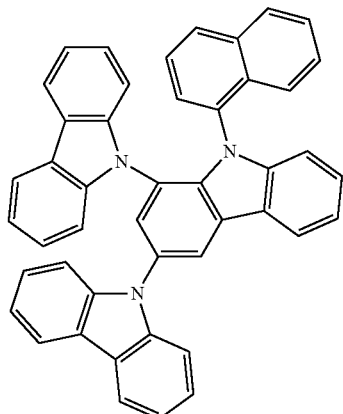
[Chemical Formula 30]
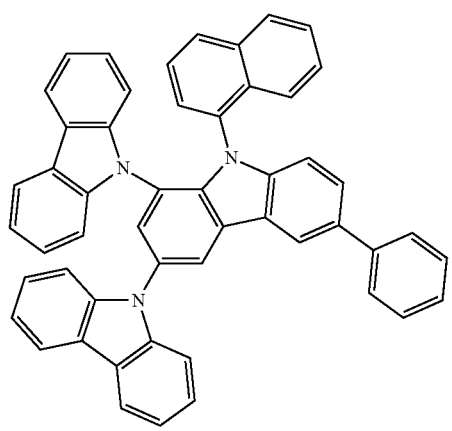
[Chemical Formula 31]
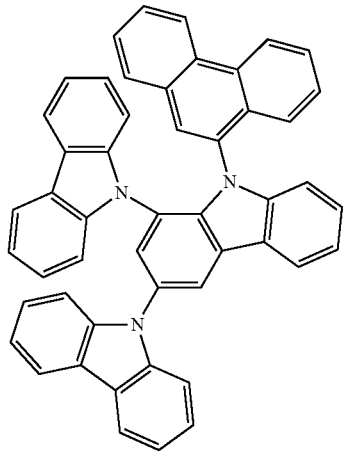
[Chemical Formula 32]
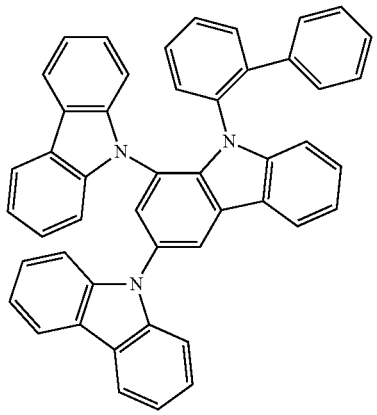
[Chemical Formula 33]
[Chemical Formula 34]
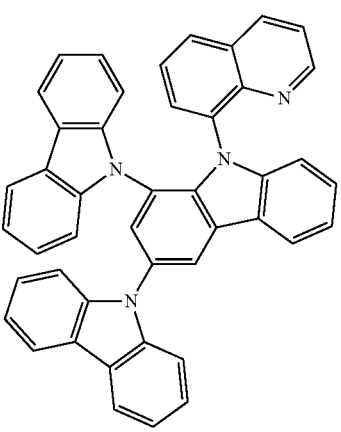

[Chemical Formula 35]
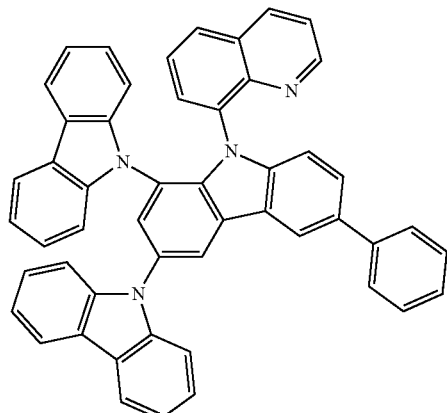
[Chemical Formula 36]
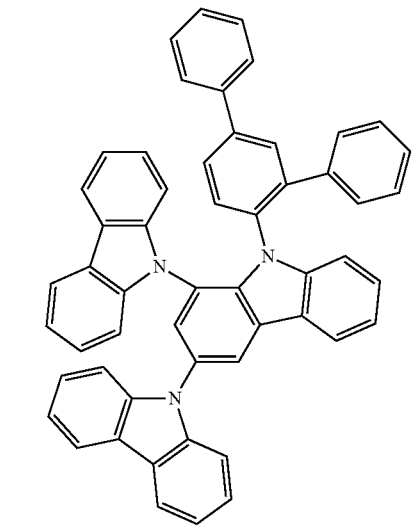
[Chemical Formula 37]
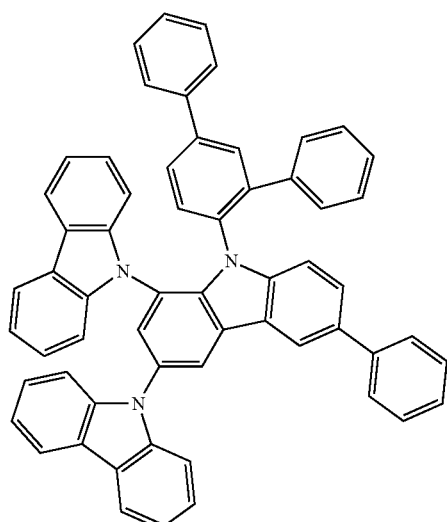
[Chemical Formula 38]
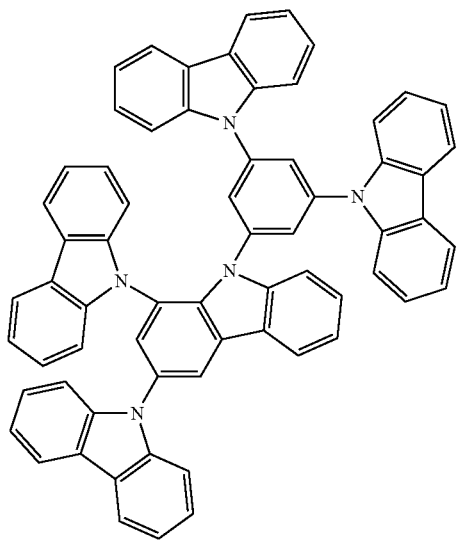
[Chemical Formula 39]
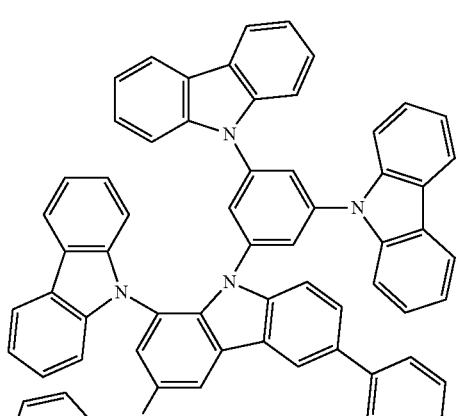
[Chemical Formula 40]
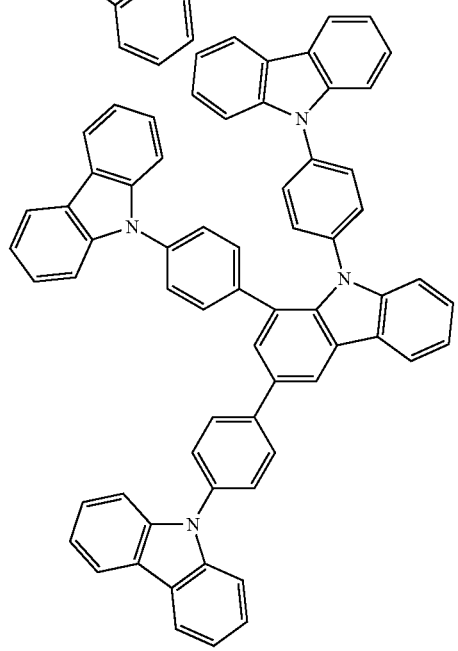

[Chemical Formula 41]
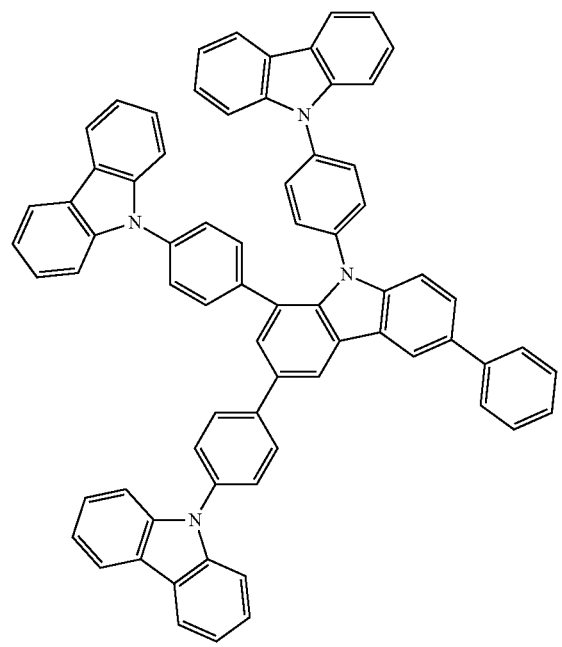
[Chemical Formula 42]
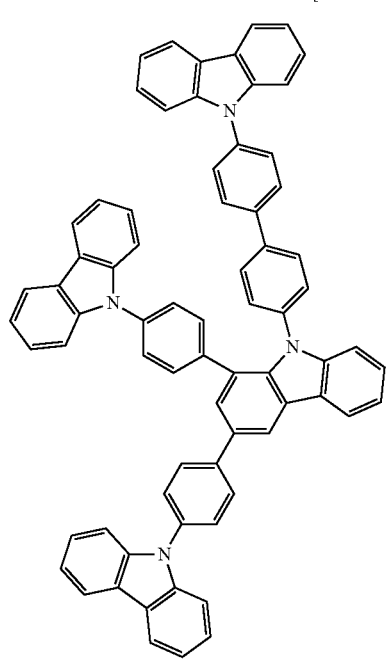
[Chemical Formula 43]
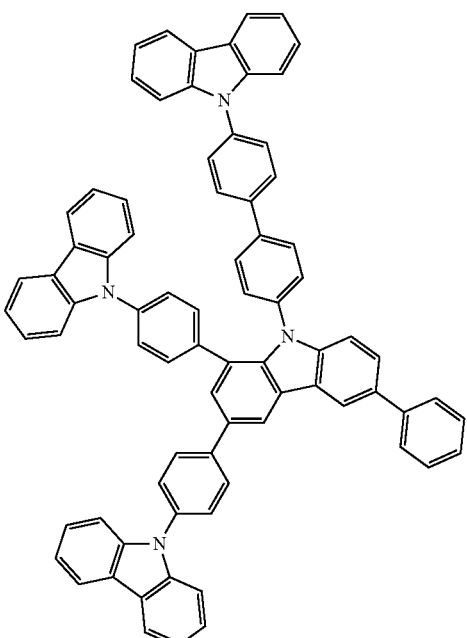
[Chemical Formula 44]
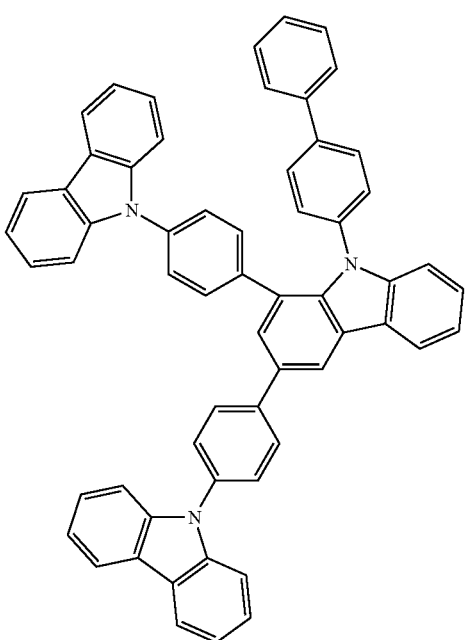

[Chemical Formula 45]
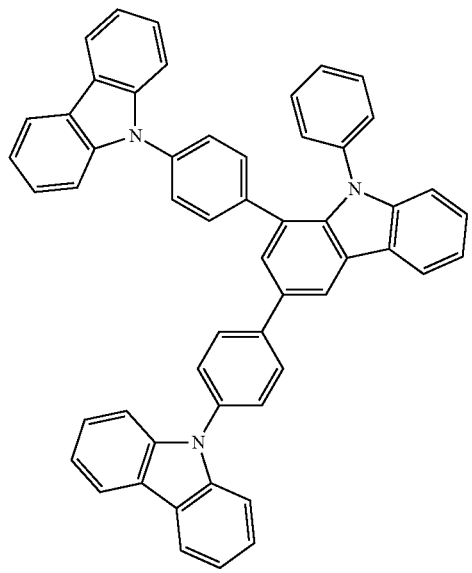
[Chemical Formula 46]
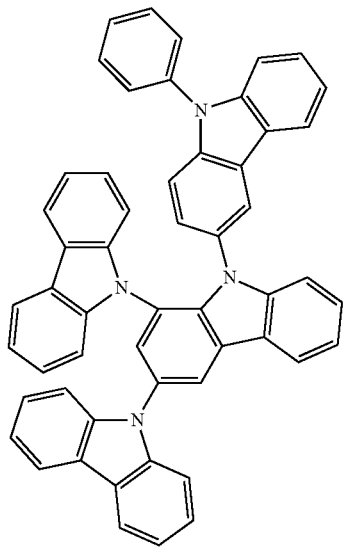
[Chemical Formula 47]
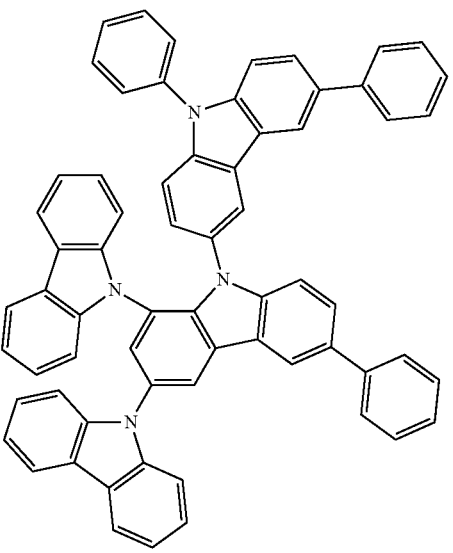
[Chemical Formula 48]
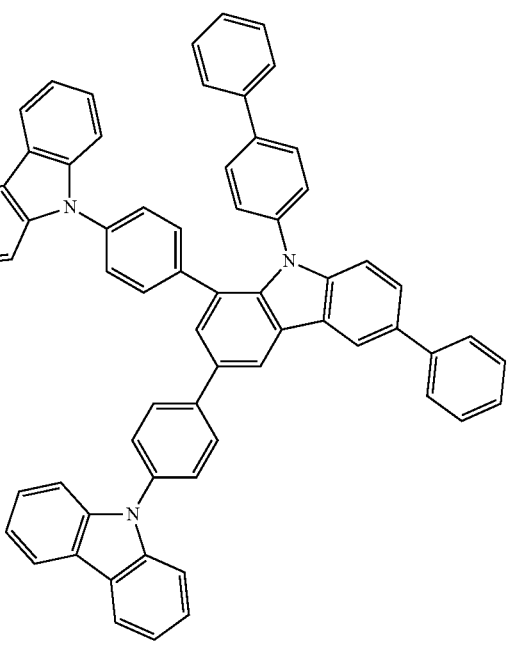

[Chemical Formula 49]
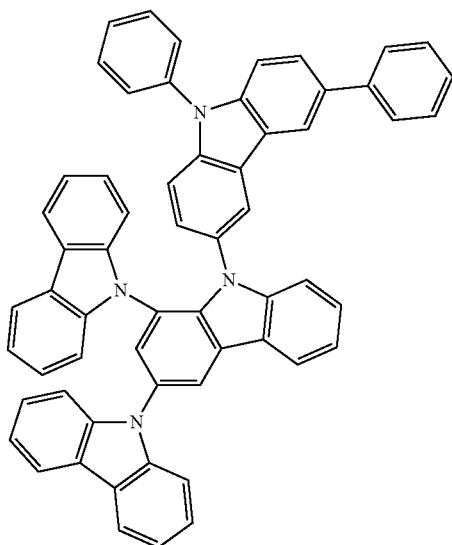
[Chemical Formula 50]
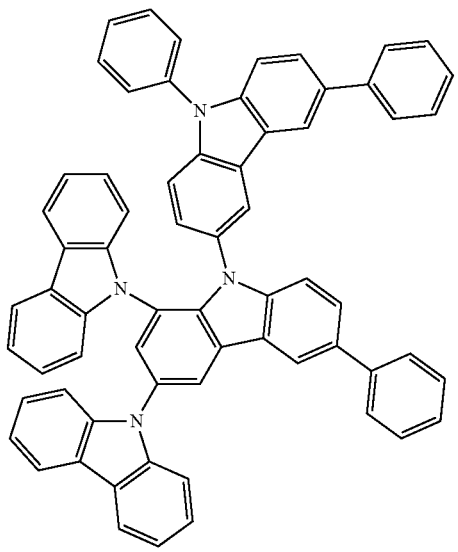
[Chemical Formula 51]
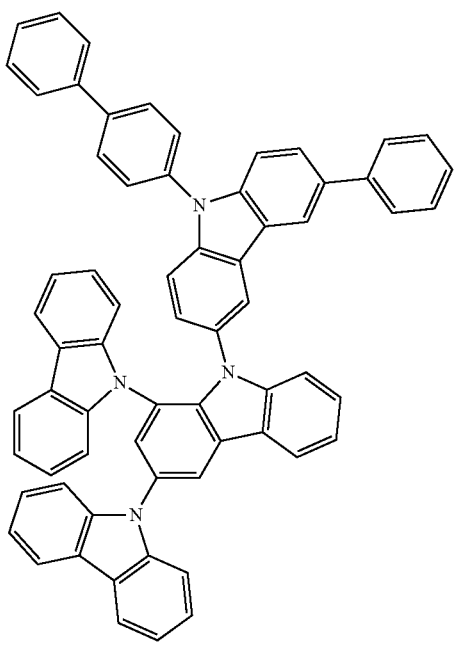
[Chemical Formula 52]
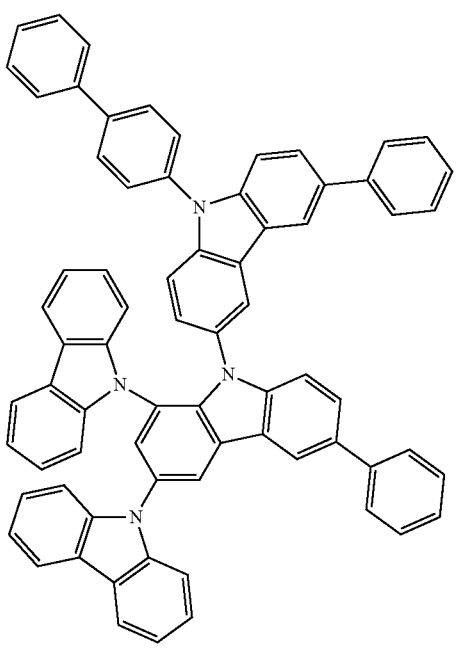

[Chemical Formula 53]
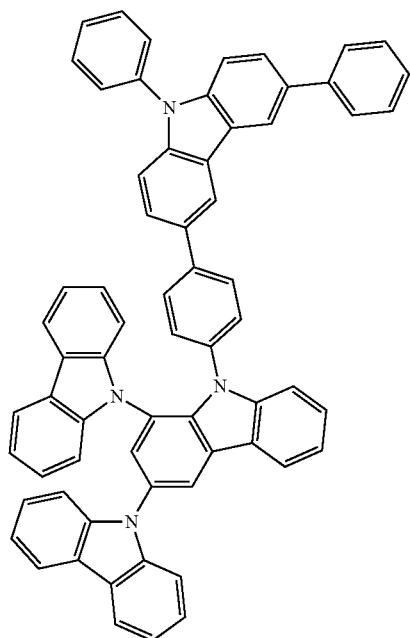
[Chemical Formula 54]
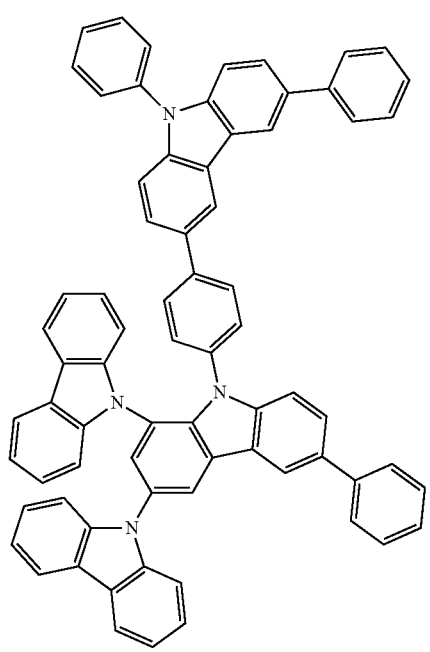
[Chemical Formula 55]
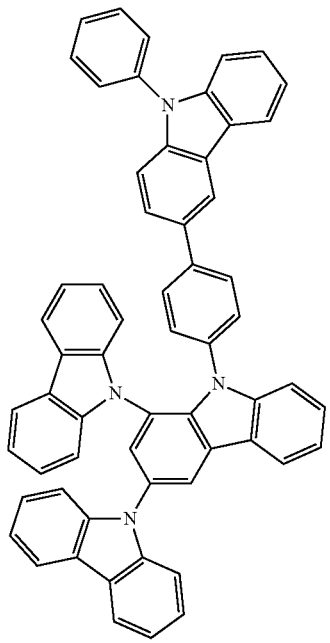
[Chemical Formula 56]
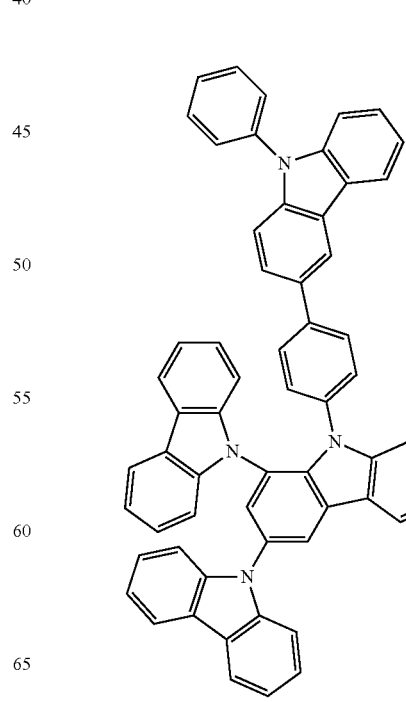

-continued
[Chemical Formula 57]
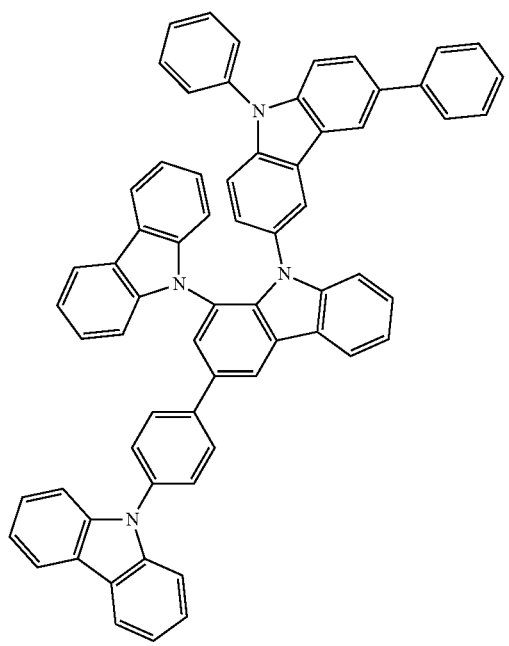
[Chemical Formula 58]
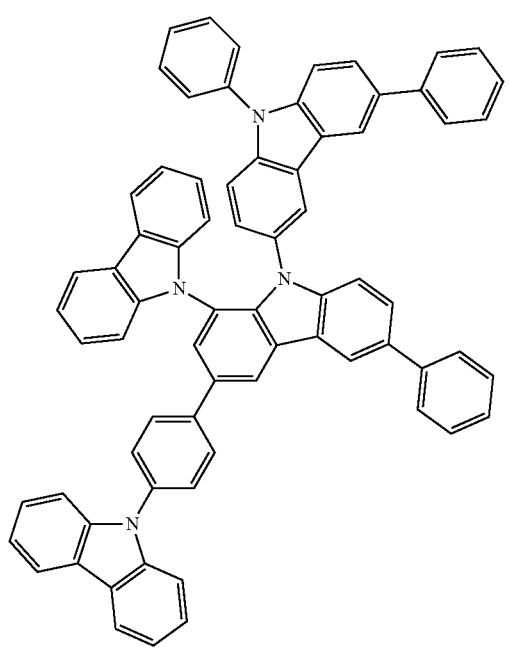
-continued
[Chemical Formula 59]
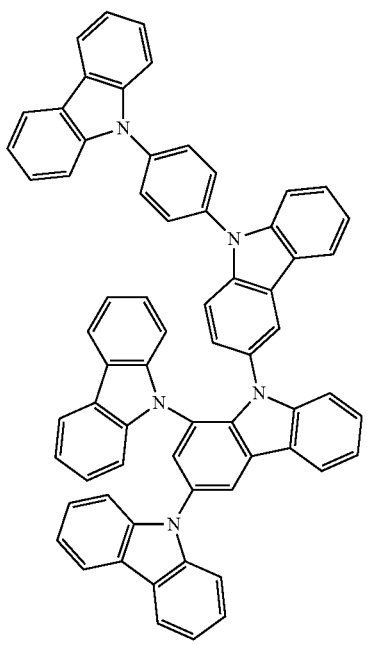
[Chemical Formula 60]
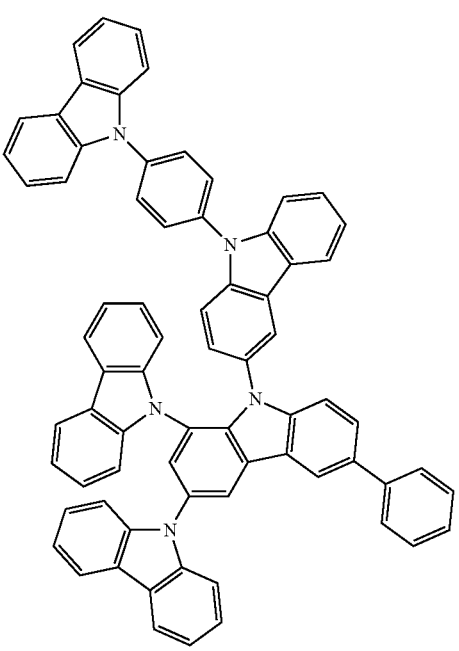

[Chemical Formula 61]
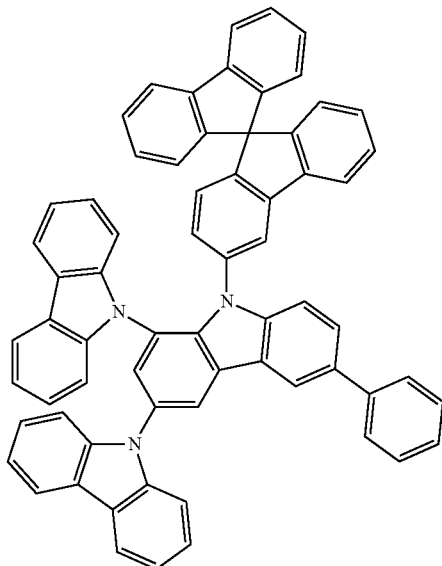
[Chemical Formula 62]
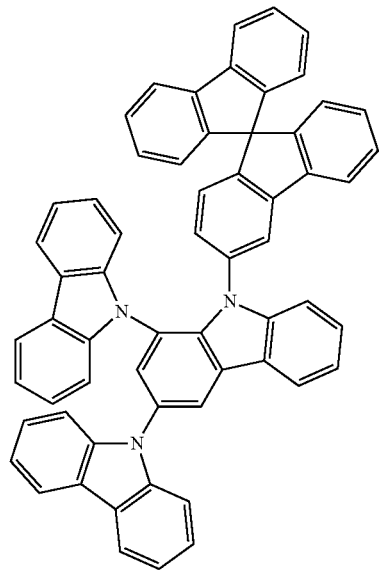
[Chemical Formula 63]
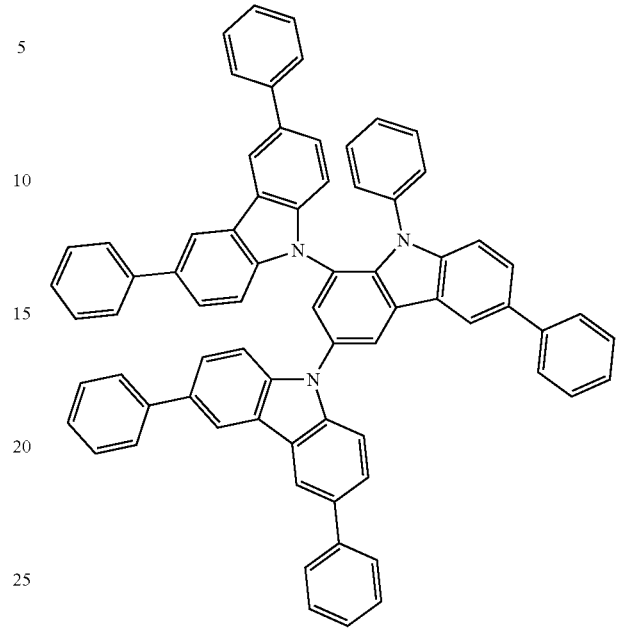
[Chemical Formula 64]
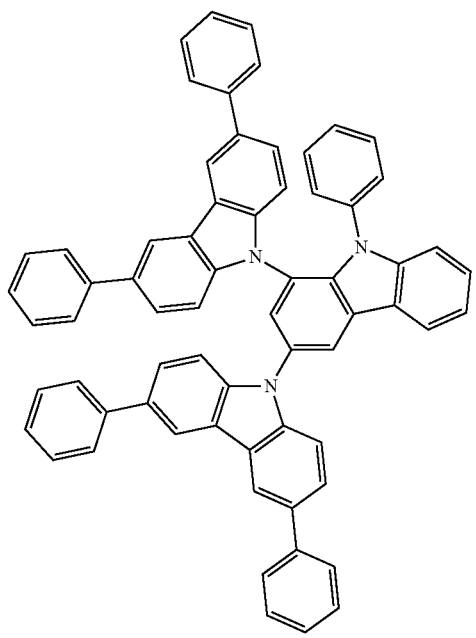

[Chemical Formula 65]
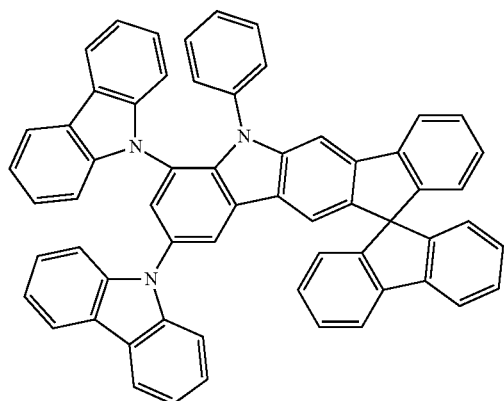
[Chemical Formula 66]
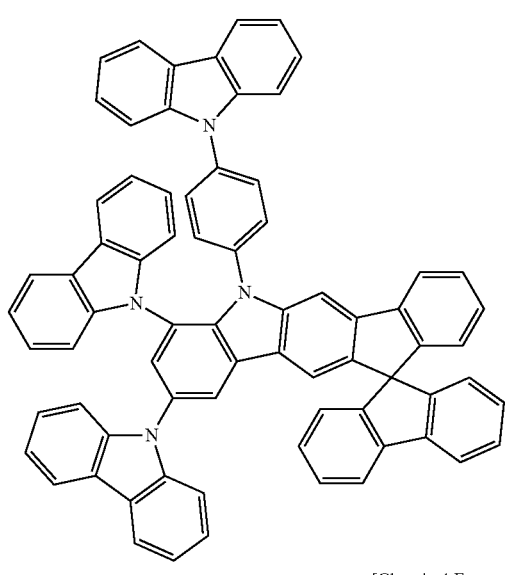
[Chemical Formula 67]
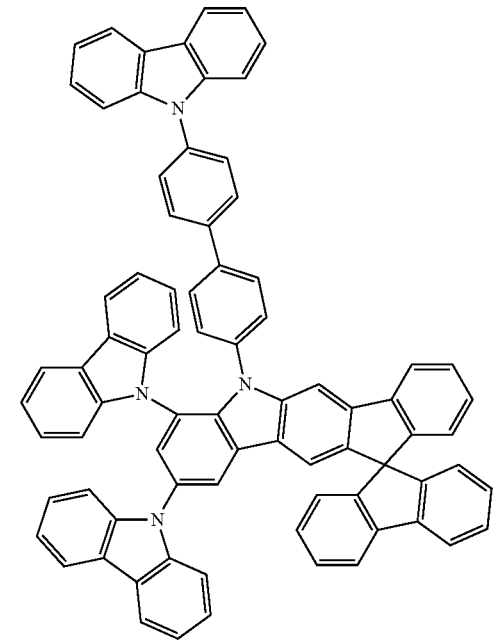
[Chemical Formula 68]
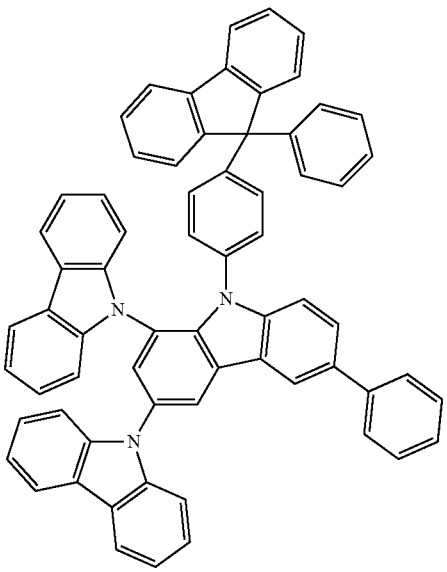
[Chemical Formula 69]
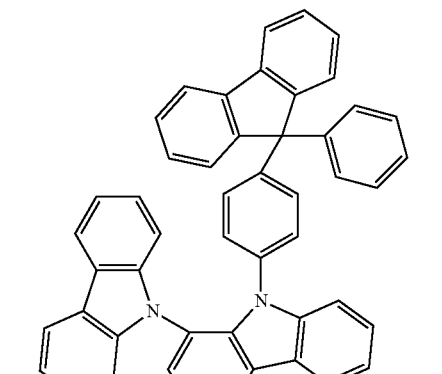
[Chemical Formula 70]
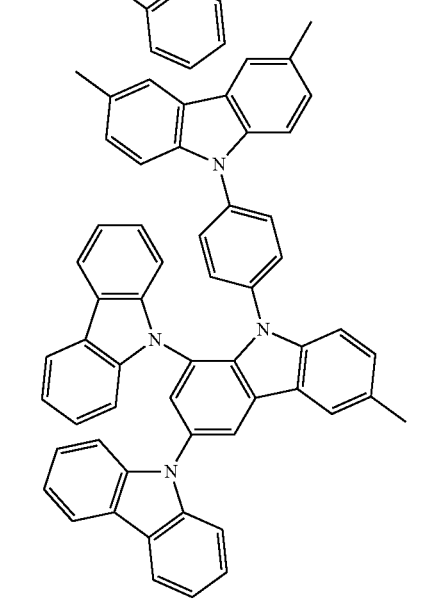

[Chemical Formula 71]
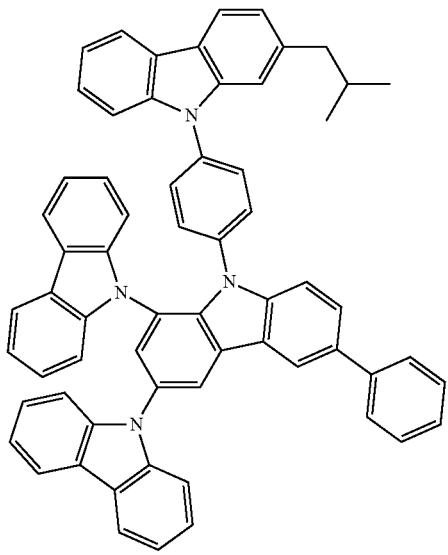
[Chemical Formula 72]
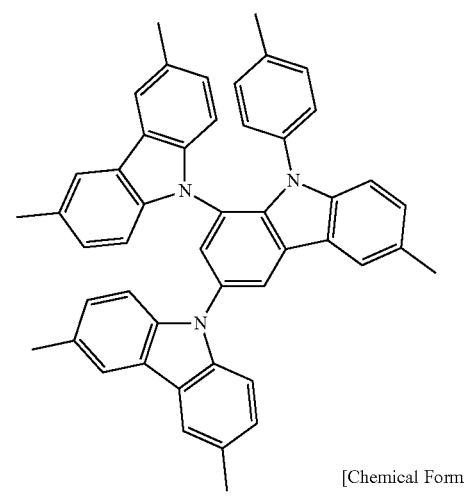
[Chemical Formula 73]
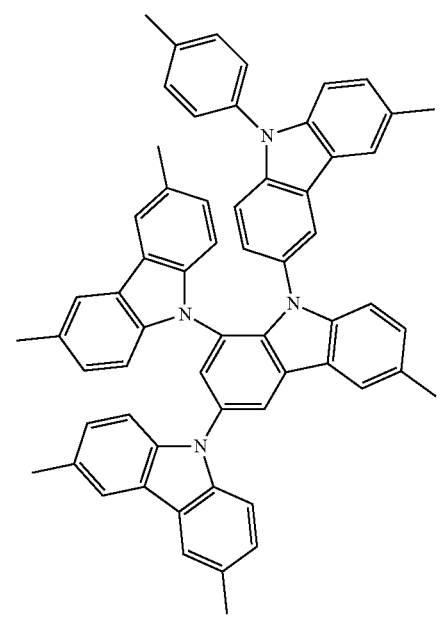
[Chemical Formula 74]
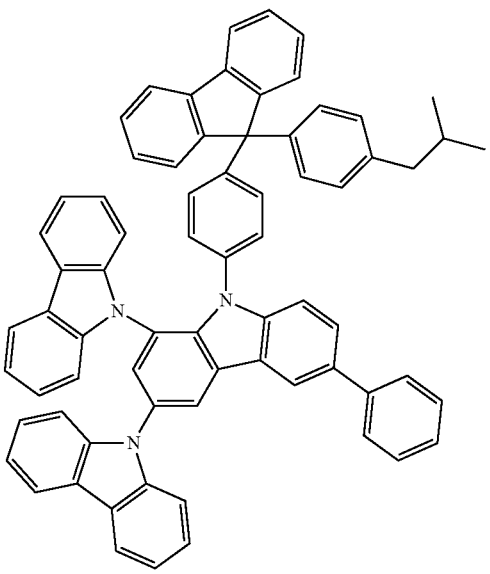
[Chemical Formula 75]
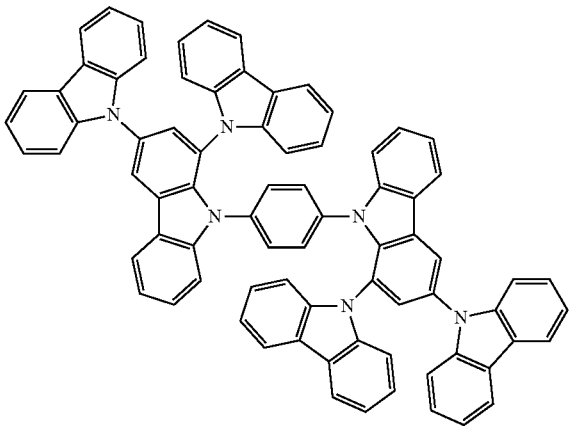
[Chemical Formula 76]
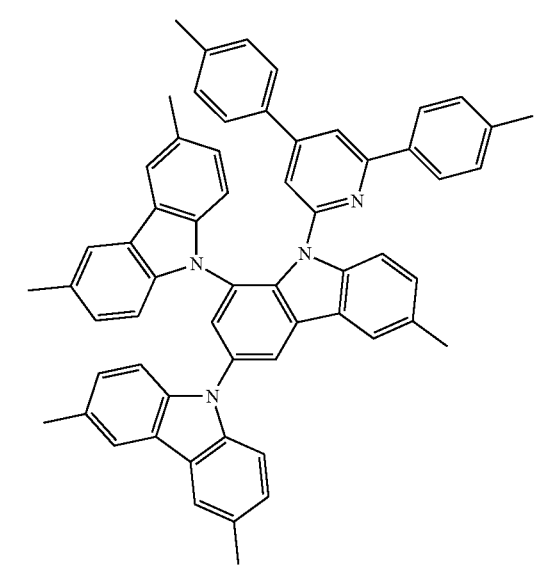

-continued

[Chemical Formula 77]

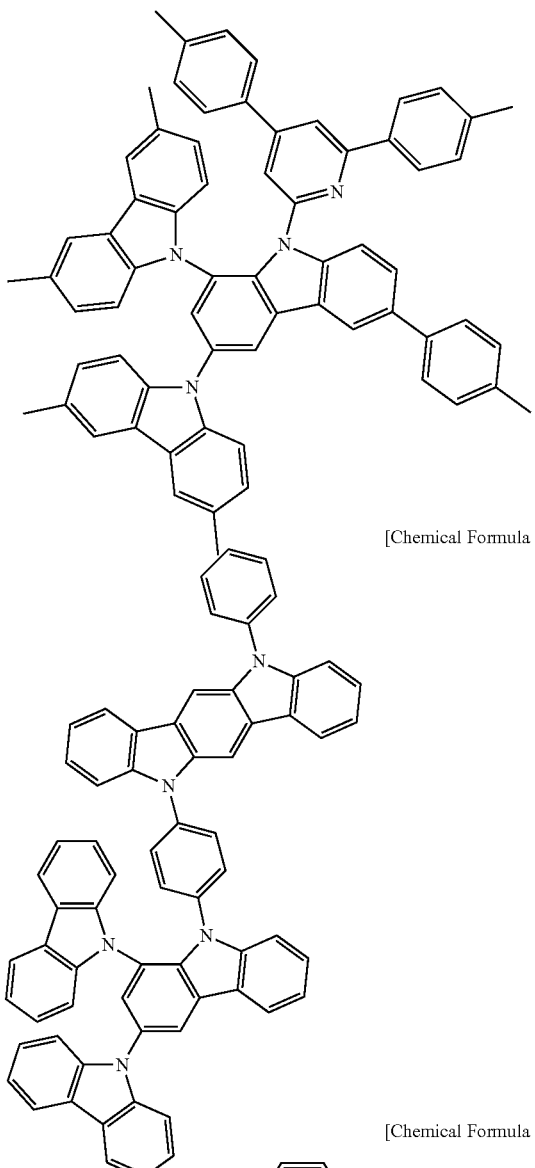

[Chemical Formula 78]

[Chemical Formula 79]

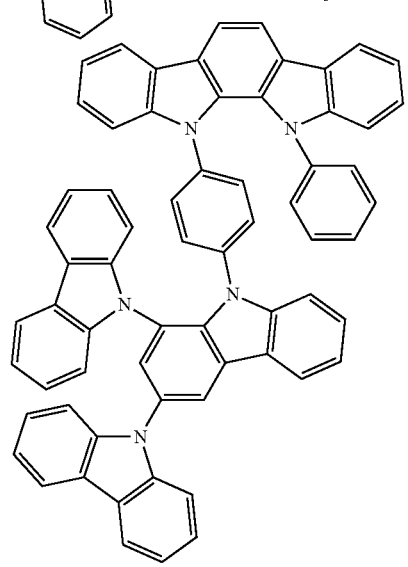

-continued

[Chemical Formula 80]

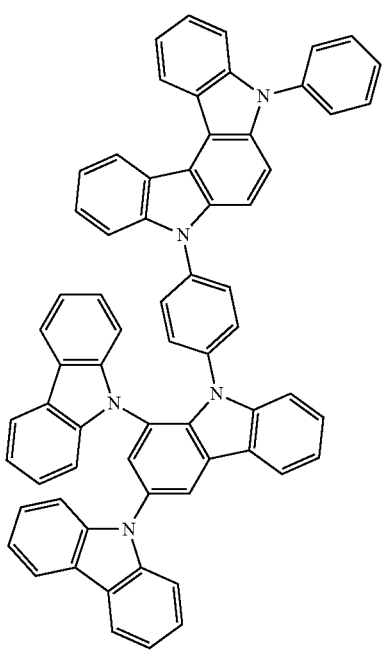

[Chemical Formula 81]

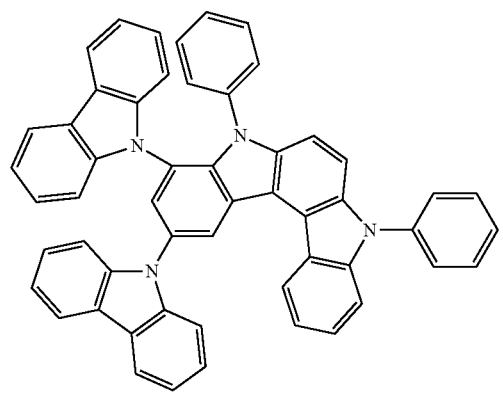

The compound for an organic photoelectric device according to an embodiment may have a glass transition temperature of about 120° C. or higher and/or a thermal decomposition temperature of about 400° C. or higher, so as to help improve thermal stability. Accordingly, it is possible to produce an organic photoelectric device having a high efficiency.

The compound for an organic photoelectric device according to an embodiment may play a role in emitting light or injecting and/or transporting electrons. For example, the compound for an organic photoelectric device may act as a light emitting host together with a suitable dopant. In an implementation, the compound for an organic photoelectric device may be used as a phosphorescent or fluorescent host material, a blue light emitting dopant material, or an electron transporting material.

The compound for an organic photoelectric device according to an embodiment may be used for an organic thin layer. Thus, it may help improve the life-span characteristic, efficiency characteristic, electrochemical stability, and thermal stability of an organic photoelectric device and decrease the driving voltage.

An embodiment provides an organic photoelectric device. The organic photoelectric device includes the compound for an organic photoelectric device. The organic photoelectric device may include an organic luminescent device, an organic solar cell, an organic transistor, an organic photosensitive drum, an organic memory device, or the like. For example, the compound for an organic photoelectric device according to an embodiment may be included in an electrode or an electrode buffer layer in the organic solar cell to help improve the quantum efficiency, or it may be used as an electrode material for a gate, a source-drain electrode, or the like in the organic transistor.

Hereinafter, a detailed described relating to the organic photoelectric device will be provided.

According to an embodiment, the organic photoelectric device may include an anode, a cathode, and at least one organic thin layer interposed between the anode and the cathode. The at least one organic thin layer may provide an organic photoelectric device that includes the compound for an organic photoelectric device according to an embodiment.

The organic thin layer may include a layer selected from the group of an emission layer, a hole transport layer (HTL), a hole injection layer (HIL), an electron transport layer (ETL), an electron injection layer (EIL), a hole blocking film, and a combination thereof. The at least one organic thin layer may include the compound for an organic photoelectric device according to an embodiment. For example, the electron transport layer (ETL) or the electron injection layer (EIL) may include the compound for an organic photoelectric device according to an embodiment. In an implementation, when the compound for an organic photoelectric device is included in the emission layer, the compound for an organic photoelectric device may be included as a phosphorescent or fluorescent host, and particularly, as a fluorescent blue dopant material.

FIGS. 1 to 5 illustrate cross-sectional views showing an organic photoelectric device including the compound for an organic photoelectric device according to an embodiment.

Referring to FIGS. 1 to 5, organic photoelectric devices 100, 200, 300, 400, and 500 according to an embodiment may include at least one organic thin layer 105 interposed between an anode 120 and a cathode 110.

The anode 120 may include an anode material laving a large work function to facilitate hole injection into an organic thin layer. The anode material may include, e.g., a metal such as nickel, platinum, vanadium, chromium, copper, zinc, and gold, or alloys thereof; a metal oxide such as zinc oxide, indium oxide, indium tin oxide (ITO), and indium zinc oxide (IZO); a combined metal and oxide such as ZnO:Al or SnO$_2$:Sb; or a conductive polymer such as poly(3-methylthiophene), poly[3,4-(ethylene-1,2-dioxy)thiophene] (PEDT), polypyrrole, and polyaniline, but is not limited thereto. In an implementation, a transparent electrode including indium tin oxide (ITO) may be used as the anode.

The cathode 110 may include a cathode material having a small work function to facilitate electron injection into an organic thin layer. The cathode material may include, e.g., a metal such as magnesium, calcium, sodium, potassium, titanium, indium, yttrium, lithium, gadolinium, aluminum, silver, tin, and lead, or alloys thereof; or a multi-layered material such as LiF/Al, Liq/Al, LiO$_2$/Al, LiF/Ca, LiF/Al, and BaF$_2$/Ca, but is not limited thereto. In an implementation, a metal electrode including aluminum may be used as the cathode.

Referring to FIG. 1, the organic photoelectric device 100 may include an organic thin layer 105 including only an emission layer 130.

Figure 2:
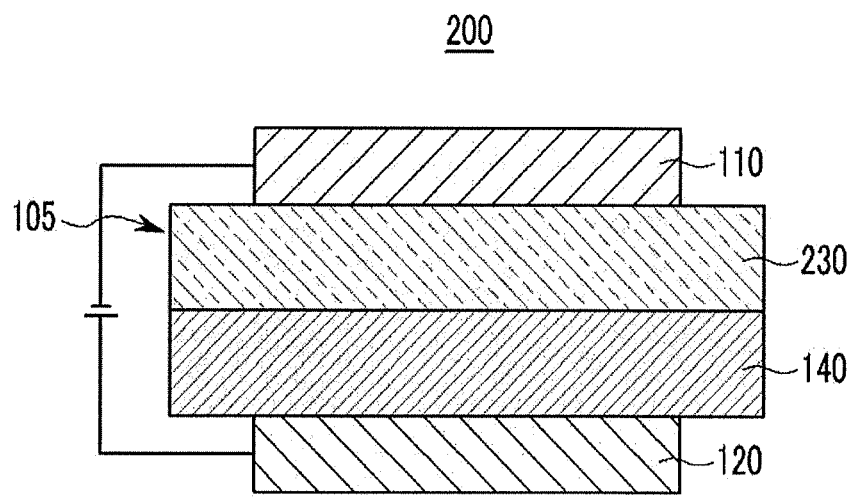

Referring to FIG. 2, a double-layered organic photoelectric device 200 may include an organic thin layer 105 including an emission layer 230 (including an electron transport layer (ETL)) and a hole transport layer (HTL) 140. For example, the emission layer 230 may also function as an electron transport layer (ETL), and the hole transport layer (HTL) 140 layer may have an excellent binding property with a transparent electrode such as ITO and/or an excellent hole transporting property.

Figure 3:
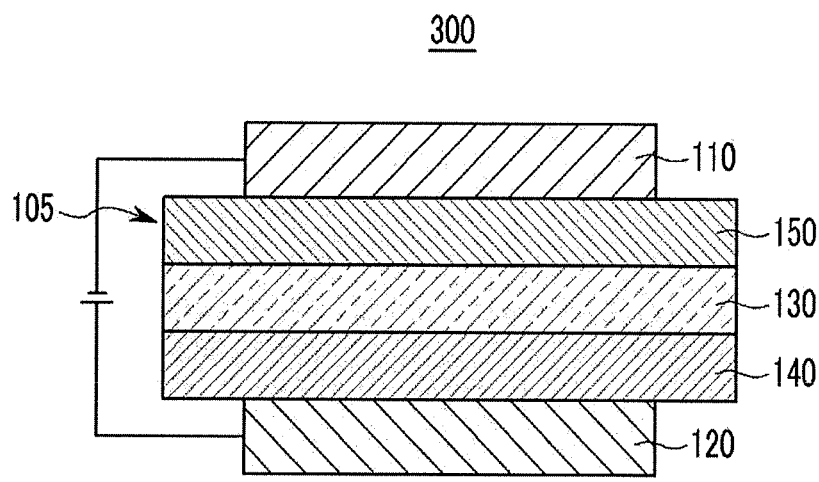

Referring to FIG. 3, a three-layered organic photoelectric device 300 may include an organic thin layer 105 including an electron transport layer (ETL) 150, an emission layer 130, and a hole transport layer (HTL) 140. The emission layer 130 may be independently installed, and layers having an excellent electron transporting property and/or an excellent hole transporting property may be separately stacked.

Figure 4:
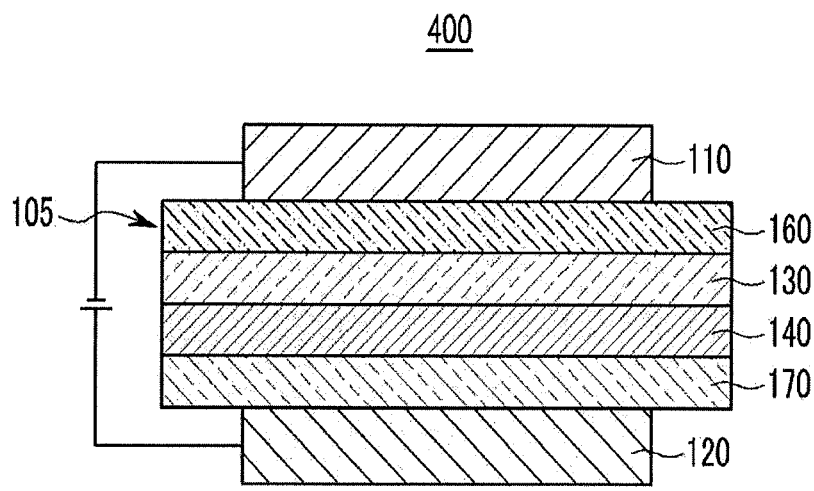

As shown in FIG. 4, a four-layered organic photoelectric device 400 may include an organic thin layer 105 including an electron injection layer (EIL) 160, an emission layer 130, a hole transport layer (HTL) 140, and a hole injection layer (HIL) 170 for binding with the anode 120 (e.g., the ITO anode).

Figure 5:
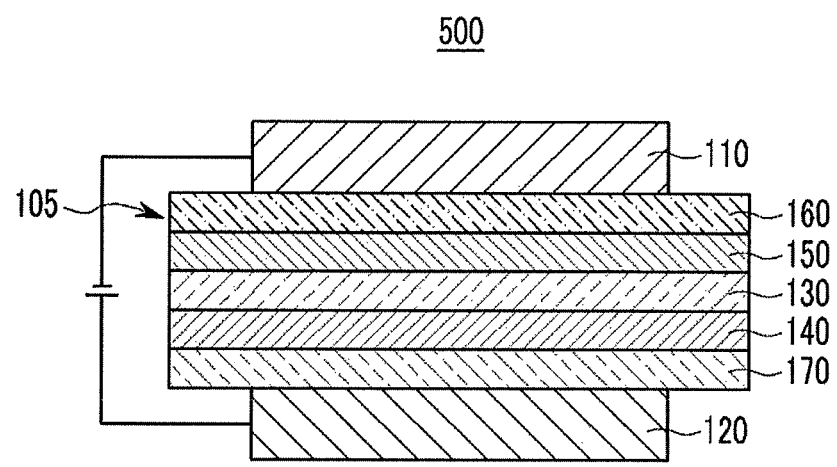

As shown in FIG. 5, a five layered organic photoelectric device 500 may include an organic thin layer 105 including an electron transport layer (ETL) 150, an emission layer 130, a hole transport layer (HTL) 140, and a hole injection layer (HIL) 170, and may further include an electron injection layer (EIL) 160 to help achieve a low voltage.

In FIG. 1 to FIG. 5, the organic thin layer 105 including at least one selected from the group of an electron transport layer (ETL) 150, an electron injection layer (EIL) 160, an emission layer 130 and 230, a hole transport layer (HTL) 140, a hole injection layer (HIL) 170, and combinations thereof may include the compound for an organic photoelectric device according to an embodiment. The compound for the organic photoelectric device may be used for the electron transport layer (ETL) 150 or electron injection layer (EIL) 160. When it is used for the electron transport layer (ETL), it is possible to provide an organic photoelectric device having a simplified structure because an additional hole blocking layer (not shown) may not be required.

In an implementation, when the compound for an organic photoelectric device is included in the emission layer 130, 230, the compound for the organic photoelectric device may be included as a phosphorescent or fluorescent host or a fluorescent blue dopant.

The organic photoelectric device may be fabricated by, e.g., forming an anode on a substrate; forming an organic thin layer in accordance with a dry coating method such as evaporation, sputtering, plasma plating, and ion plating or a wet coating method such as spin coating, dipping, and flow coating; and providing a cathode thereon.

Another embodiment provides a display device including the organic photoelectric device according to an embodiment.

The following Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect.

Preparation of Compound for Organic Photoelectric Device

Example 1

Synthesis of Compound Represented by Chemical Formula 15

As a representative example of a compound for an organic photoelectric device according to an embodiment, the compound represented by Chemical Formula 15 was synthesized through 4 steps as shown in Reaction Scheme 1, below.

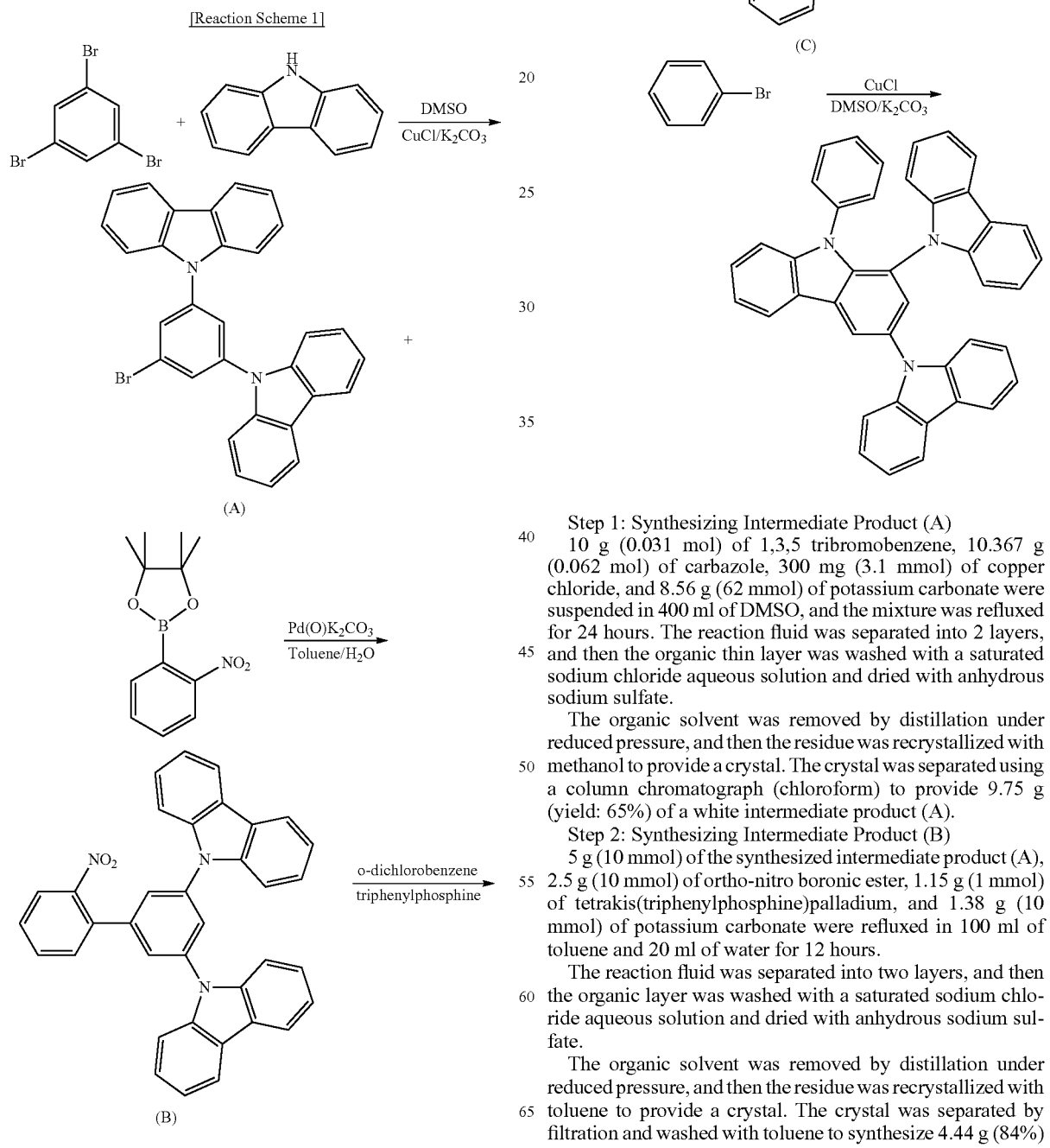

Step 1: Synthesizing Intermediate Product (A)

10 g (0.031 mol) of 1,3,5 tribromobenzene, 10.367 g (0.062 mol) of carbazole, 300 mg (3.1 mmol) of copper chloride, and 8.56 g (62 mmol) of potassium carbonate were suspended in 400 ml of DMSO, and the mixture was refluxed for 24 hours. The reaction fluid was separated into 2 layers, and then the organic thin layer was washed with a saturated sodium chloride aqueous solution and dried with anhydrous sodium sulfate.

The organic solvent was removed by distillation under reduced pressure, and then the residue was recrystallized with methanol to provide a crystal. The crystal was separated using a column chromatograph (chloroform) to provide 9.75 g (yield: 65%) of a white intermediate product (A).

Step 2: Synthesizing Intermediate Product (B)

5 g (10 mmol) of the synthesized intermediate product (A), 2.5 g (10 mmol) of ortho-nitro boronic ester, 1.15 g (1 mmol) of tetrakis(triphenylphosphine)palladium, and 1.38 g (10 mmol) of potassium carbonate were refluxed in 100 ml of toluene and 20 ml of water for 12 hours.

The reaction fluid was separated into two layers, and then the organic layer was washed with a saturated sodium chloride aqueous solution and dried with anhydrous sodium sulfate.

The organic solvent was removed by distillation under reduced pressure, and then the residue was recrystallized with toluene to provide a crystal. The crystal was separated by filtration and washed with toluene to synthesize 4.44 g (84%) of intermediate compound (B).

Step 3: Synthesizing Intermediate Product (C)

4 g (7.5 mmol) of intermediate product (B) and 3.96 g (15 mmol) of triphenylphosphine were refluxed with 40 ml of dichlorobenzene for 48 hours. After separating the reaction fluid into 2 layers, the organic layer was washed with a saturated sodium chloride aqueous solution and dried with anhydrous sodium sulfate.

The organic solvent was removed by distillation under reduced pressure, and then the residue was recrystallized with hexane to provide a crystal. The crystal was separated by filtration and washed with methanol to synthesize 3 g (80%) of intermediate compound (C).

Step 4: Synthesizing Compound Represented by Chemical Formula 15

3 g (6 mmol) of intermediate product (C), 0.94 g (6 mmol) of bromobenzene, and 59 mg (0.6 mmol) of copper chloride were refluxed with 100 ml of DMSO for 24 hours.

After separating the reaction fluid into 2 layers, the organic layer was washed with a saturated sodium chloride aqueous solution and dried with anhydrous sodium sulfate.

The organic solvent was removed by distillation under reduced pressure, and then the residue was recrystallized with methanol to provide a crystal. The crystal was separated by filtration and washed with toluene to synthesize 2.68 g (yield: 78%) of a compound represented by Chemical Formula 15.

EA: C, 87.91; H, 4.72; N, 7.32

MS[M+1] 573.

Example 2

Synthesizing Compound Represented by Chemical Formula 11

As an example of a compound for an organic photoelectric device according to an embodiment, a compound represented by Chemical Formula 11 was synthesized via the following Reaction Scheme 2.

[Reaction Scheme 2]

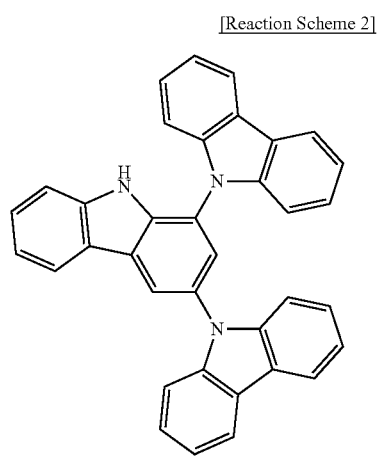

+

5 g (10 mmol) of intermediate product (C) (from Example 1), 3.2 g (10 mmol) of n-bromophenylcarbazole, 99 mg (1 mmol) of copper chloride, and 2.07 g (15 mmol) of potassium carbonate were refluxed in DMSO for 48 hours.

After separating the reaction fluid into 2 layers, the organic layer was washed with a saturated sodium chloride aqueous solution and dried with anhydrous sodium sulfate.

The organic solvent was removed by distillation under reduced pressure, and then the residue was recrystallized with methanol to provide a crystal. The crystal was separated by filtration and washed with toluene to synthesize 5.09 g (yield: 69%) of a compound represented by Chemical Formula 11.

EA: C, 87.76; H, 4.62; N, 7.6

EA: C, 87.91; H, 4.72; N, 7.32

MS[M+1] 738.2

Example 3

Synthesizing Compound Represented by Chemical Formula 19

As an example of a compound for an organic photoelectric device according to an embodiment, a compound represented by Chemical Formula 19 was synthesized via the following Reaction Scheme 3.

[Reaction Scheme 3]

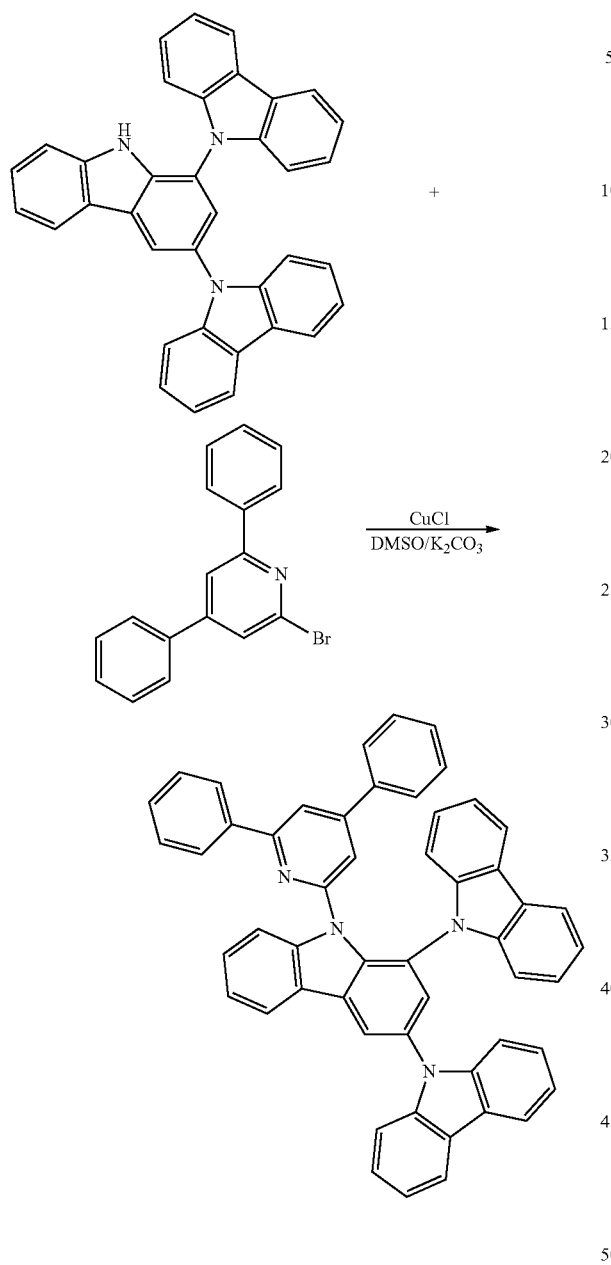

5 g (10 mmol) of intermediate product (C) (from Example 1), 3.09 g (10 mmol) of bromodiphenylpyridine, 99 mg (1 mmol) of copper chloride, and 2.07 g (15 mmol) of potassium carbonate were refluxed in DMSO for 48 hours.

After separating the reaction fluid into 2 layers, the organic layer was washed with a saturated sodium chloride aqueous solution and dried with anhydrous sodium sulfate.

The organic solvent was removed by distillation under reduced pressure, and then the residue was recrystallized with methanol to provide a crystal. The crystal was separated by filtration and washed with methanol to provide 4.64 g (yield: 64%) of a compound represented by Chemical Formula 19.

EA: C, 87.58; H, 4.71; N, 7.71

MS[M+1] 726.28

Example 4

Synthesizing Compound Represented by Chemical Formula 29

As a particular example of a compound for an organic photoelectric device according to an embodiment, a compound represented by Chemical Formula 29 was synthesized via the following Reaction Scheme 4.

[Reaction Scheme 4]

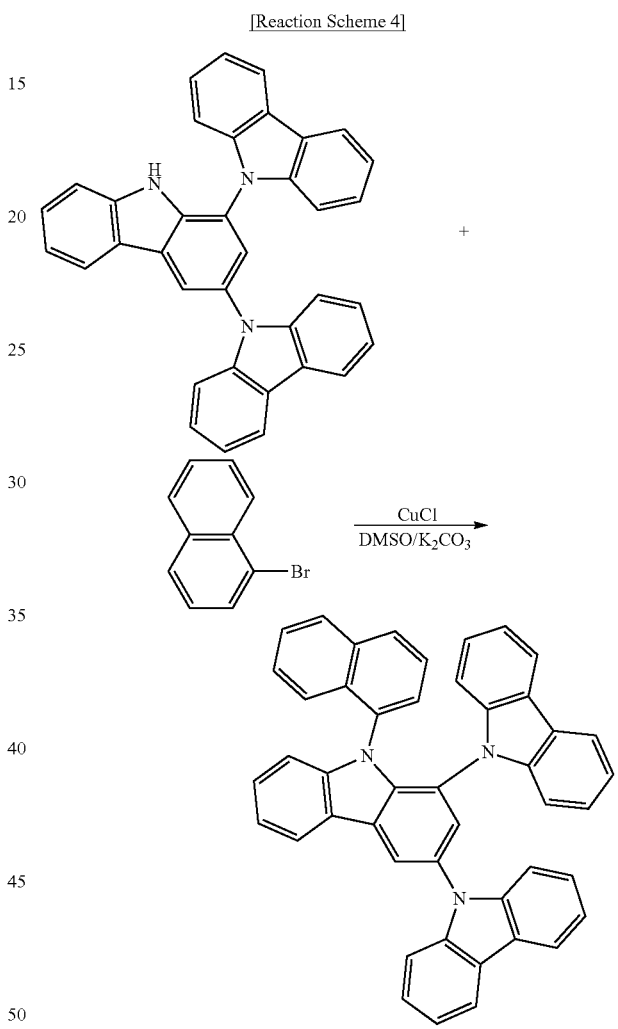

5 g (10 mmol) of intermediate product (C) (from Example 1), 2.05 g (10 mmol) of bromonaphthalene, 99 mg (1 mmol) of copper chloride, and 2.07 g (15 mmol) of potassium carbonate were refluxed in DMSO for 48 hours.

After separating the reaction fluid into 2 layers, the organic layer was washed with a saturated sodium chloride aqueous solution and dried with anhydrous sodium sulfate.

The organic solvent was removed by distillation under reduced pressure, and then the residue was recrystallized with methanol to provide a crystal. The crystal was separated by filtration and washed with methanol to provide 4.53 g (yield: 73%) of a compound represented by Chemical Formula 29.

EA: C, 88.58; H, 4.69; N, 6.74

MS[M+1]: 623.2

Example 5

Synthesizing Compound Represented by Chemical Formula 46

As a particular example of a compound for an organic photoelectric device according to an embodiment, a compound represented by Chemical Formula 46 was synthesized via the following Reaction Scheme 5.

[Reaction Scheme 5]

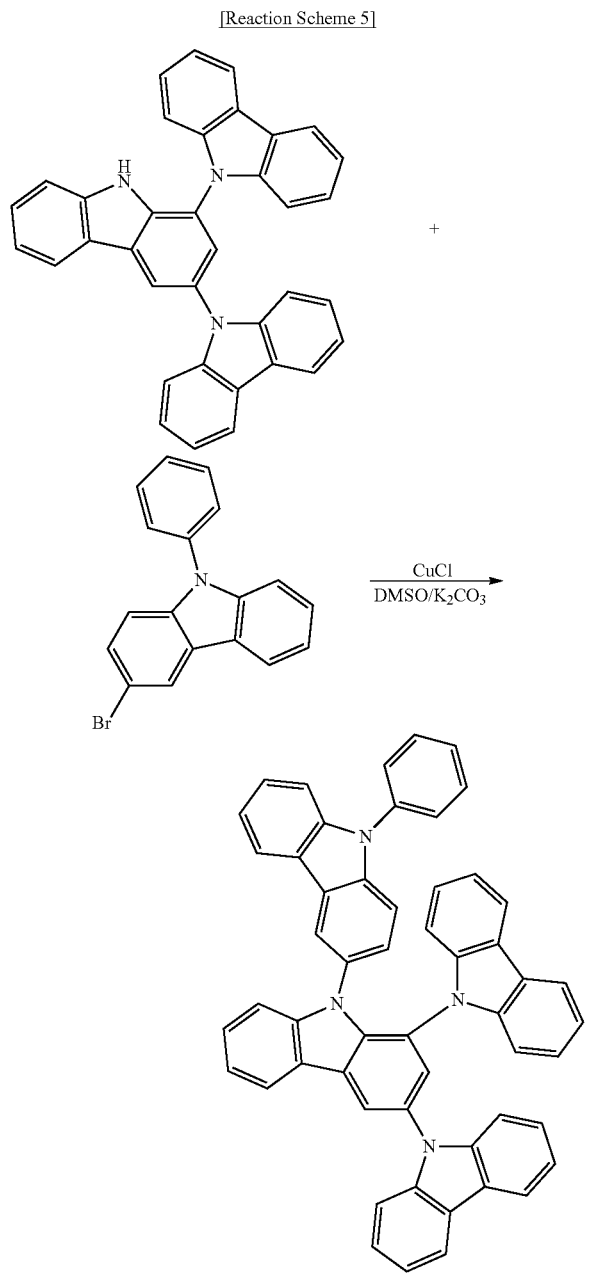

5 g (10 mmol) of intermediate product (C) (from Example 1), 3.21 g (10 mmol) of bromophenylcarbazole, 99 mg (1 mmol) of copper chloride, and 2.07 g (15 mmol) of potassium carbonate were refluxed in DMSO for 48 hours.

After separating the reaction flux into 2 layers, the organic layer was washed with a saturated sodium chloride aqueous solution and dried with anhydrous sodium sulfate.

The organic solvent was removed by distillation under reduced pressure, and then the residue was recrystallized with methanol to provide a crystal. The crystal was separated by filtration and washed with methanol to provide 5.09 g (yield: 69%) of a compound represented by Chemical Formula 46.

EA: C, 87.78; H, 4.64; N, 7.58
MS[M+1]: 738.28

(Fabrication of Organic Photoelectric Device)

Example 6

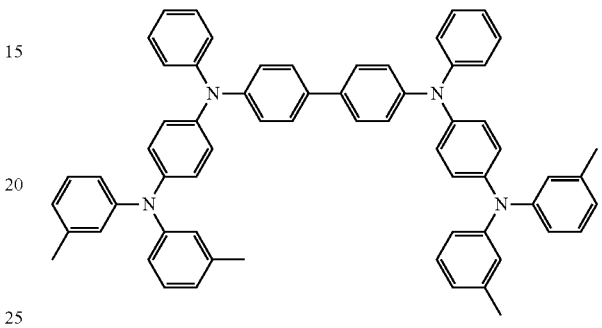

DNTPD

An organic photoelectric device was fabricated by using the compound represented by Chemical Formula 11 obtained from Example 2 as a host, and a dopant of Ir(PPy)$_3$ to form an emission layer (EML).

The anode was ITO having a thickness of 1,000 Å, and the cathode was aluminum (Al) having a thickness of 1,000 Å.

The organic emission layer had a 5-layered structure. In particular, the organic emission layer had a 5-layered structure of DNTPD (60 nm)/NPB (30 nm)/EML (10%, 30 nm)/Alq$_3$ (20 nm)/LiF, with the anode of ITO on one side thereof and the cathode of Al (100 nm) on another side thereof.

The organic photoelectric device was fabricated by cutting an ITO glass substrate having a sheet resistance of 15 Ψ/cm$^2$ to a size of 50 mm×50 mm×0.7 mm, ultrasonic wave cleaning the same in acetone, isopropyl alcohol, and pure water for 15 minutes for each, and UV ozone cleaning the same to provide an anode.

DNTPD and NPD were deposited on an upper surface of the substrate under the conditions of a vacuum degree of 650×10$^{-7}$ Pa and a deposition speed of 0.1 to 0.3 nm/s to provide a hole transport layer (HTL) having a thickness of 900 Å.

Subsequently, a 300 Å-thick emission layer (EML) was prepared by using the compound represented by Chemical Formula 11 under the same vacuum deposition conditions, and a phosphorescent dopant of Ir(PPy)$_3$ was simultaneously deposited.

Then Alq3 was deposited under the same vacuum deposition conditions to provide an electron transport layer (ETL) having a thickness of 200 Å. LiF and Al were sequentially deposited on the upper surface of the electron transport layer (ETL) to complete an organic photoelectric device.

Example 7

An organic photoelectric device was fabricated in accordance with the same procedure as in Example 6, except that the compound represented by Chemical Formula 19 was used instead of the compound represented by Chemical Formula 11.

Example 8

An organic photoelectric device was fabricated in accordance with the same procedure as in Example 6, except that the compound represented by Chemical Formula 46 was used instead of the compound represented by Chemical Formula 11.

Comparative Example

An organic photoelectric device having a structure of ITO/DNTPD (60 nm)/NPB (30 nm)/CBP (10%, 30 nm)/Alq$_3$ (20 nm)/LiF/Al (100 nm) was fabricated in accordance with the same procedure as in Example 6, except that 4,4-N,N-dicarbazolebiphenyl (CBP) was used instead of the compound represented by Chemical Formula 11.

Experimental Example

Method and Condition

Each of the obtained organic photoelectric devices was measured for luminance change, current density change depending upon voltage, and luminous efficiency. The specific method was as follows.

1) Measurement of Current Density Change Depending on Voltage Change

The obtained organic photoelectric device was measured for current value flowing in the unit device while increasing the voltage from 0 V to 10 V using a current-voltage meter (Keithley 2400), and the measured current value was divided by area to provide the result.

2) Measurement of Luminance Change Depending on Voltage Change

The obtained organic photoelectric device was measured for luminance using a luminance meter (Minolta Cs-1000A) while increasing the voltage from 0 V to 10 V.

3) Measurement of Luminous Efficiency

The luminous efficiency was calculated by using luminance and current density from 1) and 2), and voltage Results

TABLE 1

|  | Comparative Example | Example 6 | Example 7 | Example 8 |
|---|---|---|---|---|
| Turn-on voltage (1 cd/m$^2$) | 2.6 V | 2.8 V | 2.6 V | 4.4 V |
| Operating voltage (1,000 cd/m$^2$) | 5.6 V | 7.0 V | 4.5 V | 7.8 V |
| Efficiency (1,000 cd/m$^2$) | 35.80 cd/A | 17.59 cd/A | 37.76 cd/A | 23.70 cd/A |
|  | 20.08 lm/W | 7.90 lm/W | 25.79 lm/W | 9.54 lm/W |
| Efficiency (Maximum) | 36.86 cd/A | 38.76 cd/A | 38.07 cd/A | 30.49 cd/A |
|  | 37.46 lm/W | 46.31 lm/W | 44.33 lm/W | 17.81 lm/W |
| CIE (x, y) (1,000 cd/m$^2$) | 0.30 and 0.61 | 0.29 and 0.61 | 0.31 and 0.61 | 0.29 and 0.61 |

From the characteristic results of the organic photoelectric devices, it may be seen that Example 7 had a driving voltage of 4.5 V or less at a luminance of 1,000 nit and had a higher device level than the Comparative Example including CBP.

Example 7 also had a better result than the Comparative Example in view of luminous efficiency. Furthermore, it had higher efficiency than the Comparative Example in view of power efficiency, which is an important characteristic of an organic photoelectric device. Example 7 had a lower driving voltage than the Comparative Example. Thus, it had superior power efficiency with regard to the Comparative Example.

Example 6 exhibited the maximum electric power efficiency of 46.31 lm/w in which power efficiency was 123% of that of the Comparative Example.

In addition, Examples 6, 7, and 8 exhibited a solubility in toluene of about 5 wt %, which means that they may be applied for developing a future organic electric field light emitting element by a solution process.

The compound according to an embodiment exhibited a low driving voltage and high luminous efficiency in the results of analyzing an organic photoelectric device, and the life-span of the device was enhanced in a device driving test.

By way of summation and review, when one material is used as a light emitting material, a maximum light emitting wavelength may be shifted to a long wavelength or color purity may decrease because of interactions between molecules, or device efficiency may decrease because of a light emitting quenching effect. Therefore, a host/dopant system may be included as a light emitting material in order to help improve color purity and to help increase luminous efficiency and stability through energy transfer.

In order to implement the above excellent performance of an organic light emitting diode, a material constituting an organic material layer, e.g., a hole injection material, a hole transport material, a light emitting material, an electron transport material, an electron injection material, and/or a light emitting material such as a host and/or a dopant should be stable and have good efficiency. The embodiments provide an organic material layer forming material for an organic light emitting diode. This material may also be used for other organic photoelectric devices.

The embodiments provide a compound for an organic photoelectric device that can act as a light emitting or electron injection and/or transport material, and also as a light emitting host along with an appropriate dopant.

The embodiments provide an organic photoelectric device having excellent life-span, efficiency, driving voltage, electrochemical stability, and thermal stability.

The embodiments provide a compound having excellent electrochemical and thermal stability, and that can provide an organic photoelectric device having excellent life-span, and high luminous efficiency at a low driving voltage.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A compound for an organic photoelectric device represented by the following Chemical Formula 1:

[Chemical Formula 1]

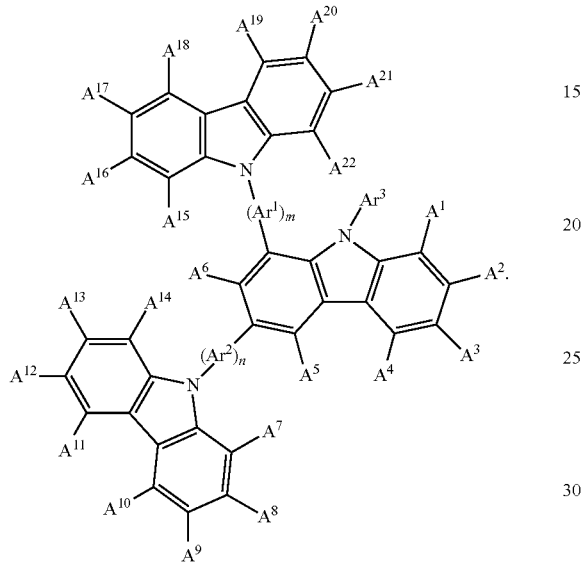

wherein:
Ar$^1$ and Ar$^2$ are each independently a substituted or unsubstituted C6 to C30 arylene group,
Ar$^3$ is selected from the group of a substituted or unsubstituted C6 to C30 aryl group, a substituted or unsubstituted C5 to C30 heteroaryl group, and a substituted or unsubstituted C1 to C30 alkyl group,
A$^1$ to A$^{22}$ are each independently selected from the group of hydrogen, a substituted or unsubstituted C6 to C30 aryl group, a substituted or unsubstituted C5 to C30 heteroaryl group, and a substituted or unsubstituted C1 to C30 alkyl group, and
m and n are 0 or 1.

2. The compound as claimed in claim 1, wherein Ar$^3$ is a substituted or unsubstituted C6 to C25 aryl group or a substituted or unsubstituted C5 to C20 heteroaryl group.

3. The compound as claimed in claim 1, wherein Ar$^3$ is selected from the group of the following Chemical Formulae 3 to 10:

[Chemical Formula 3]

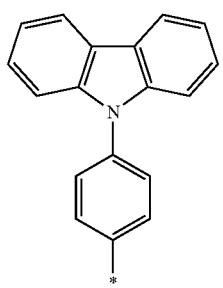

[Chemical Formula 4]

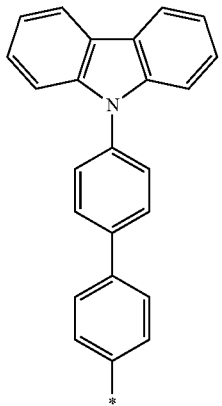

[Chemical Formula 5]

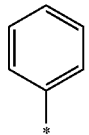

[Chemical Formula 6]

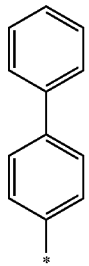

[Chemical Formula 7]

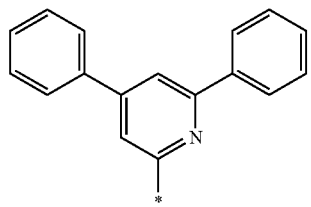

[Chemical Formula 8]

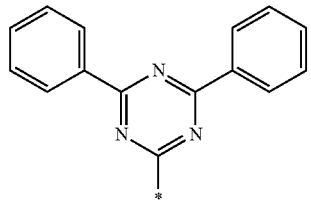

[Chemical Formula 9]

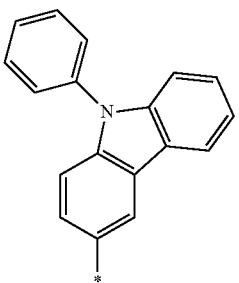

[Chemical Formula 10]

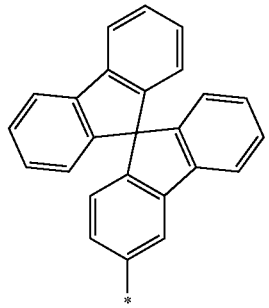

wherein, in the above Chemical Formulae, * refers to a position at which Ar³ is bound.

4. An organic photoelectric device, comprising
an anode;
a cathode; and
at least one organic thin layer between the anode and cathode,
wherein the at least one organic thin layer includes the compound as claimed in claim 1.

5. The organic photoelectric device as claimed in claim 4, wherein the at least one organic thin layer includes one selected from the group of an emission layer, a hole transport layer (HTL), a hole injection layer (HIL), an electron transport layer (ETL), an electron injection layer (EIL), a hole blocking layer, and a combination thereof.

6. The organic photoelectric device as claimed in claim 4, wherein:
the at least one organic thin layer includes an electron transport layer (ETL) or an electron injection layer (EIL), and
the compound is included in the electron transport layer (ETL) or the electron injection layer (EIL).

7. The organic photoelectric device as claimed in claim 4, wherein:
the at least one organic thin layer includes an emission layer, and
the compound is included in the emission layer.

8. The organic photoelectric device as claimed in claim 4, wherein:
the at least one organic thin layer includes an emission layer, and
the compound is a phosphorescent or fluorescent host material in the emission layer.

9. The organic photoelectric device as claimed in claim 4, wherein:
the at least one organic thin layer includes an emission layer, and
the compound is a fluorescent blue dopant material in the emission layer.

10. The organic photoelectric device as claimed in claim 4, wherein the organic photoelectric device is selected from the group of an organic light emitting diode, an organic solar cell, an organic transistor, an organic photo-conductor drum, and an organic memory device.

11. A display device comprising the organic photoelectric device as claimed in claim 4.

12. A compound for an organic photoelectric device represented by one of the following Chemical Formulae 11 to 81:

[Chemical Formula 11]

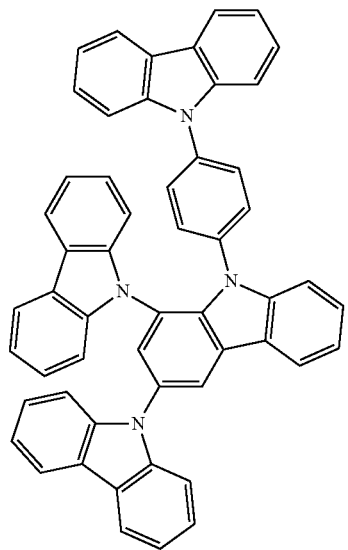

[Chemical Formula 12]

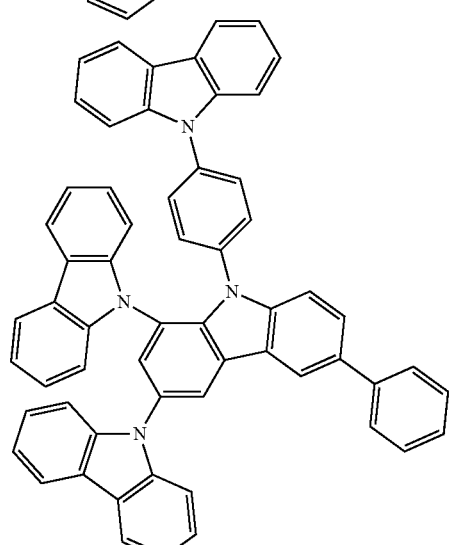

[Chemical Formula 13]

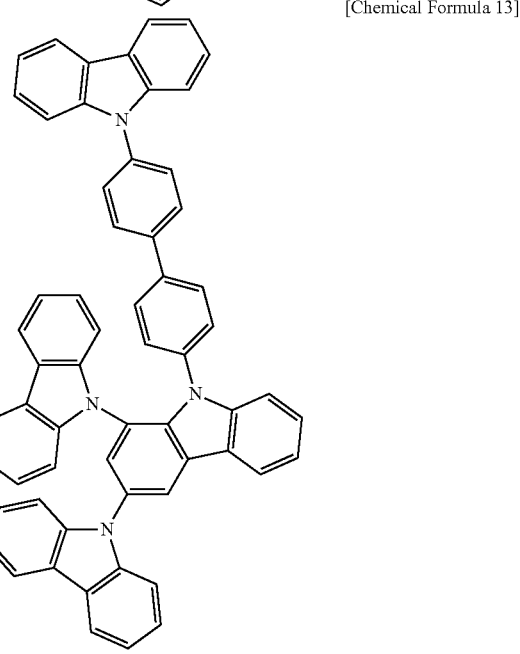

[Chemical Formula 14]
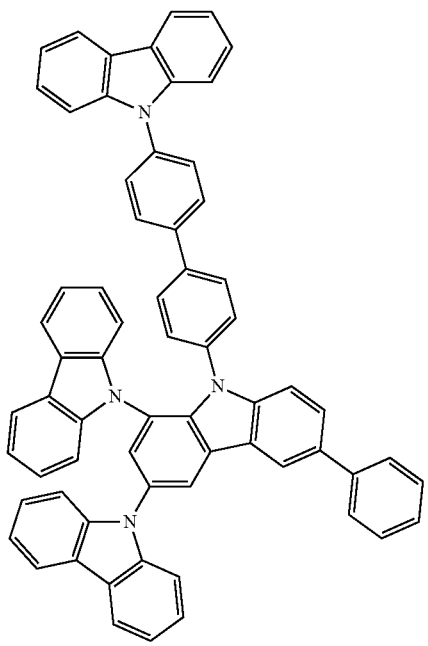
[Chemical Formula 15]
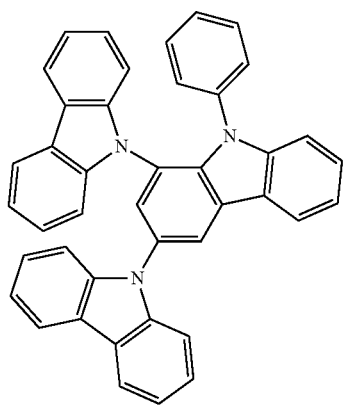
[Chemical Formula 16]
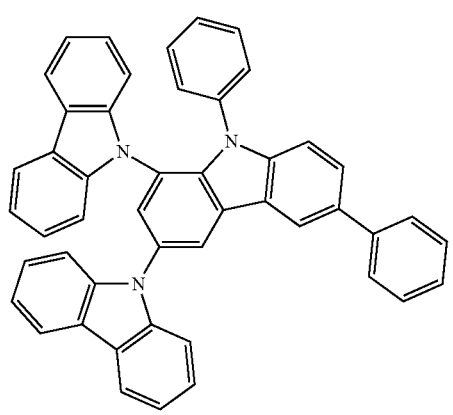
[Chemical Formula 17]
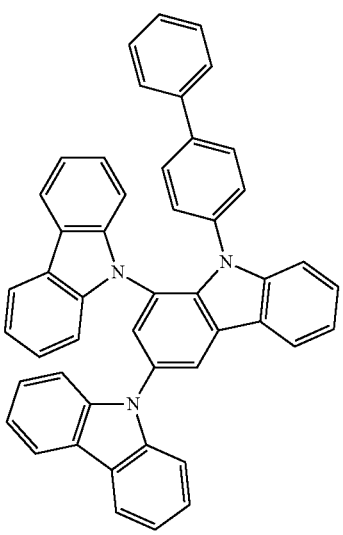
[Chemical Formula 18]
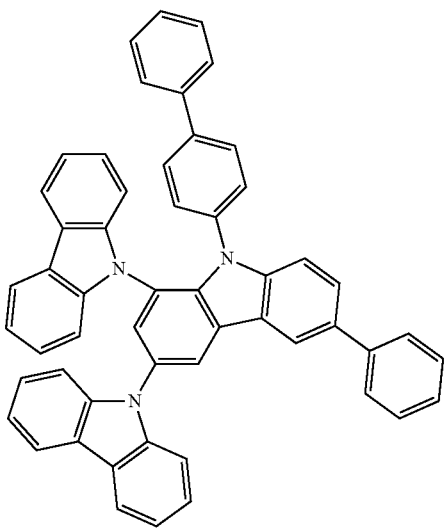
[Chemical Formula 19]
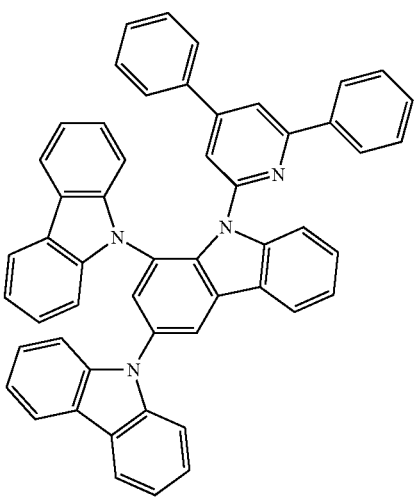

[Chemical Formula 20]
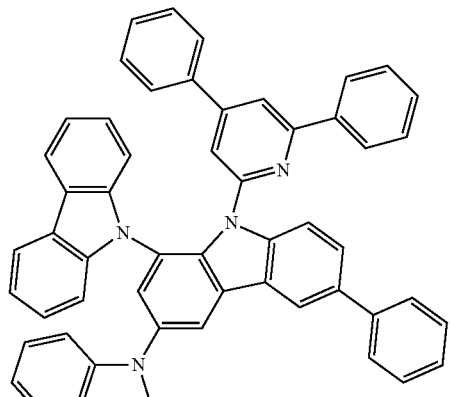
[Chemical Formula 21]
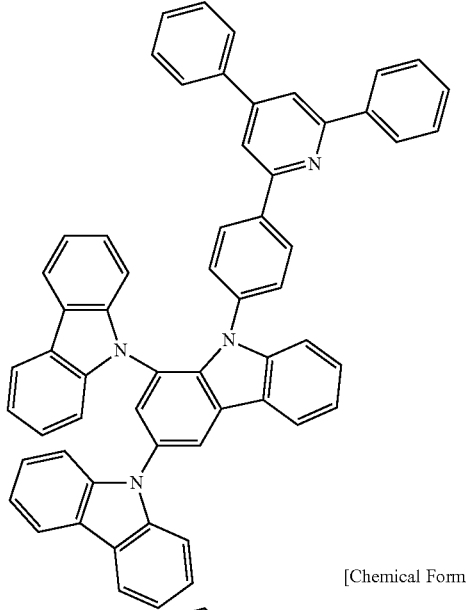
[Chemical Formula 22]
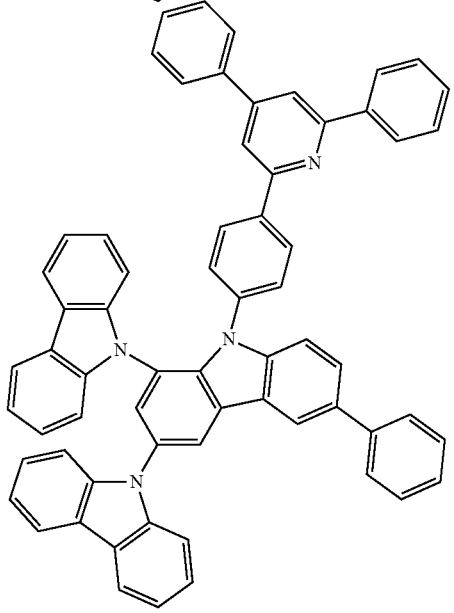
[Chemical Formula 23]
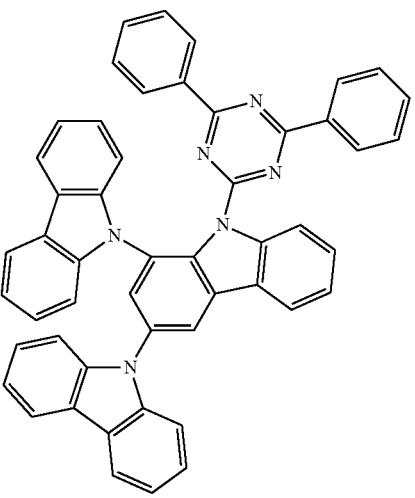
[Chemical Formula 24]
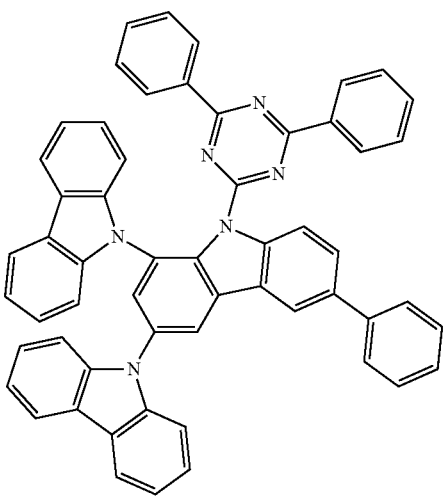
[Chemical Formula 25]
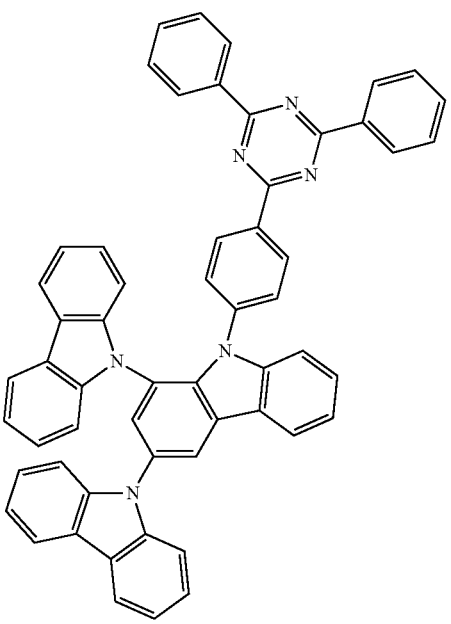

[Chemical Formula 26]
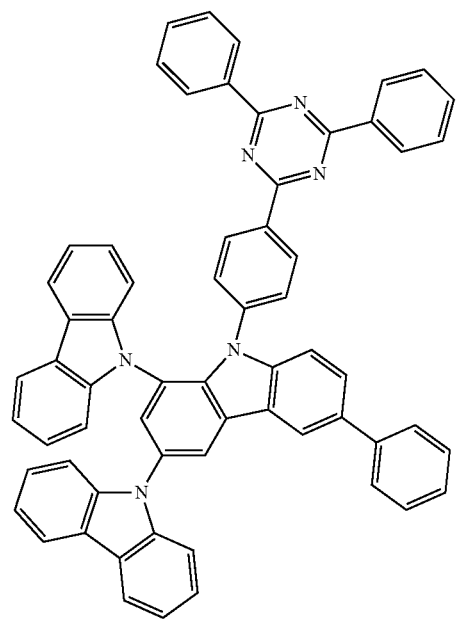
[Chemical Formula 27]
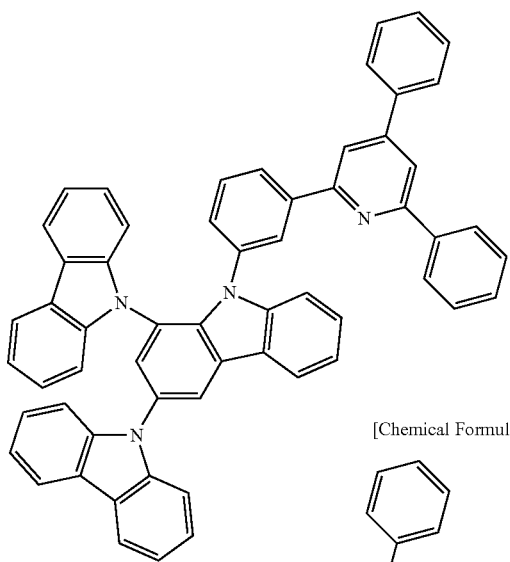
[Chemical Formula 28]
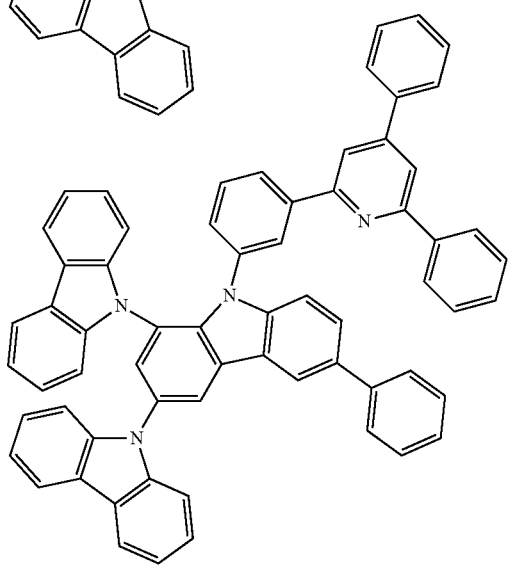
[Chemical Formula 29]
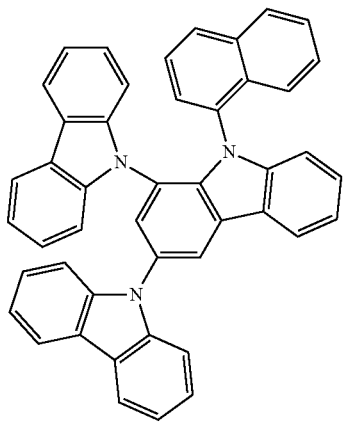
[Chemical Formula 30]
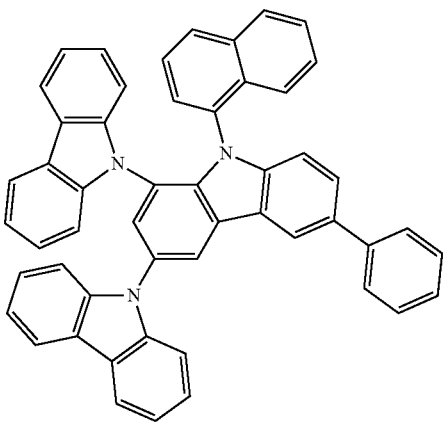
[Chemical Formula 31]
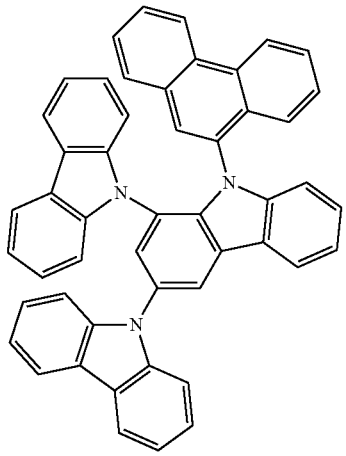

[Chemical Formula 32]
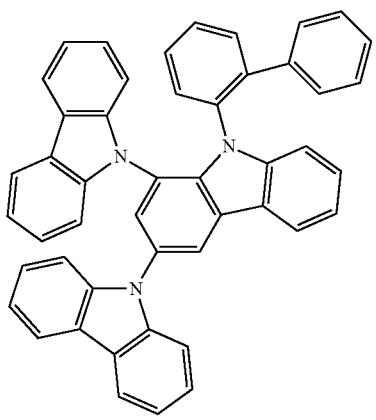
[Chemical Formula 33]
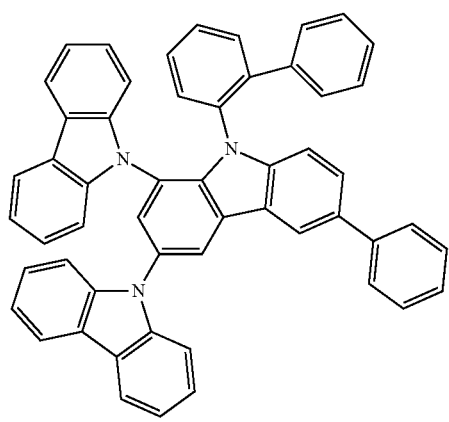
[Chemical Formula 34]
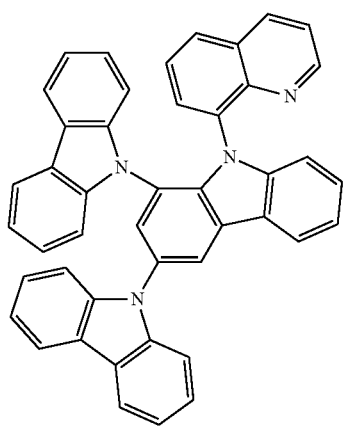
[Chemical Formula 35]
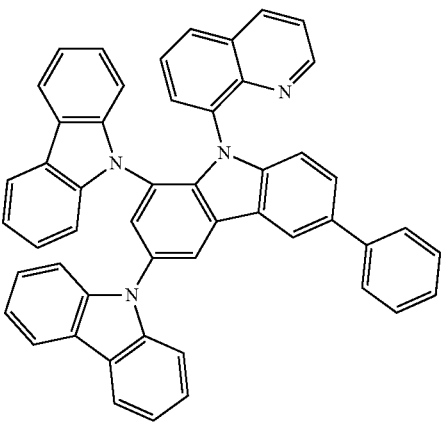
[Chemical Formula 36]
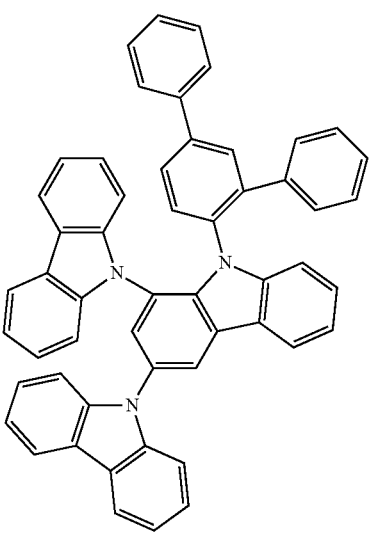
[Chemical Formula 37]
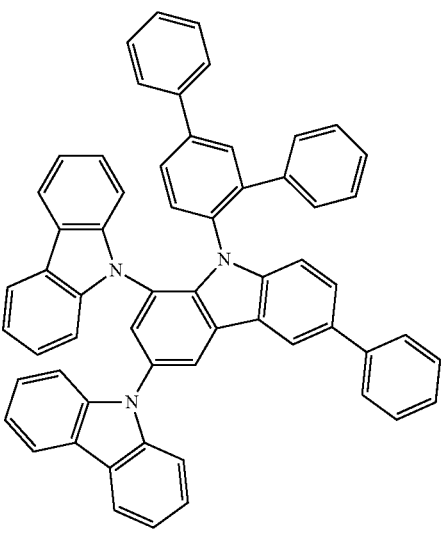

[Chemical Formula 38]
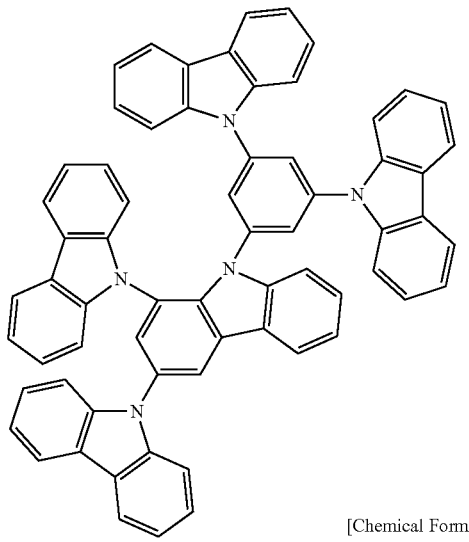
[Chemical Formula 39]
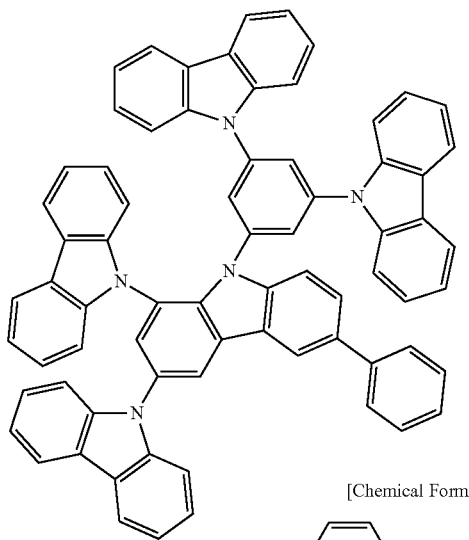
[Chemical Formula 40]
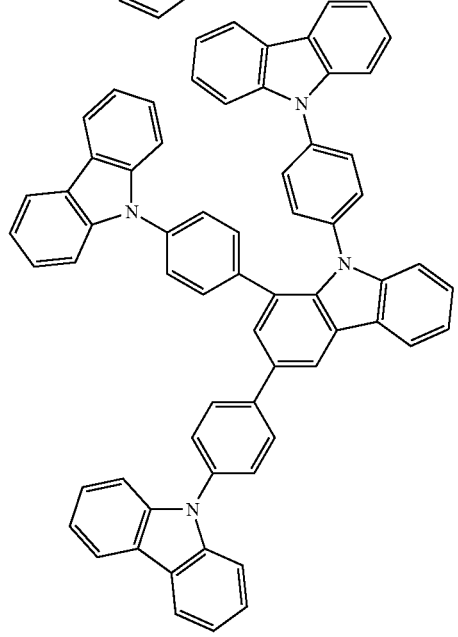
[Chemical Formula 41]
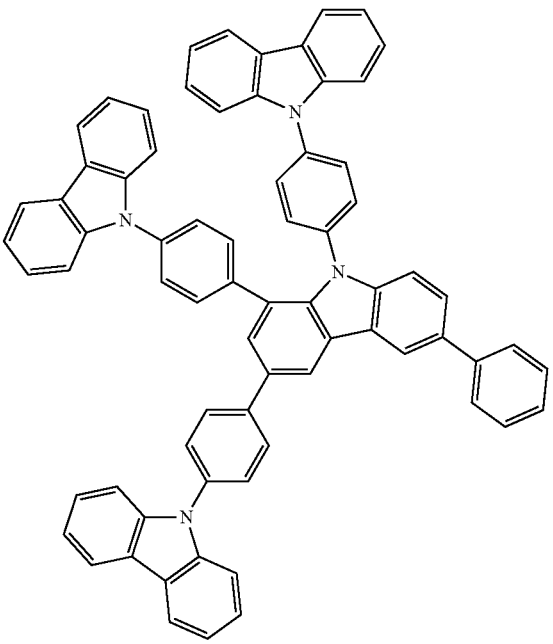
[Chemical Formula 42]
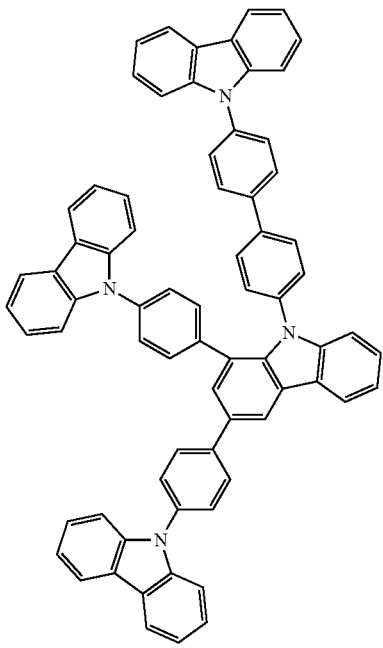

[Chemical Formula 43]
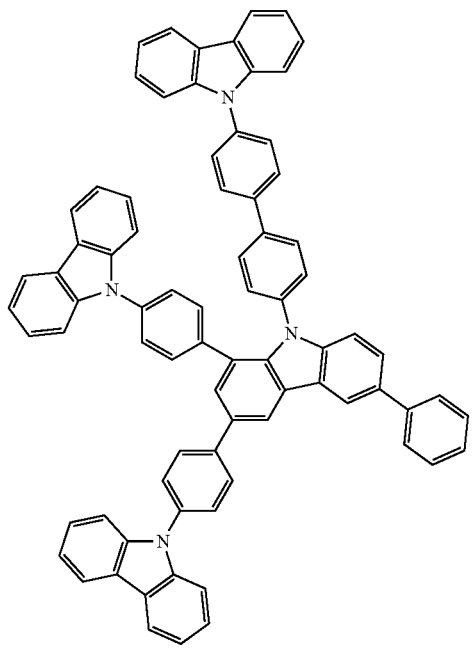
[Chemical Formula 44]
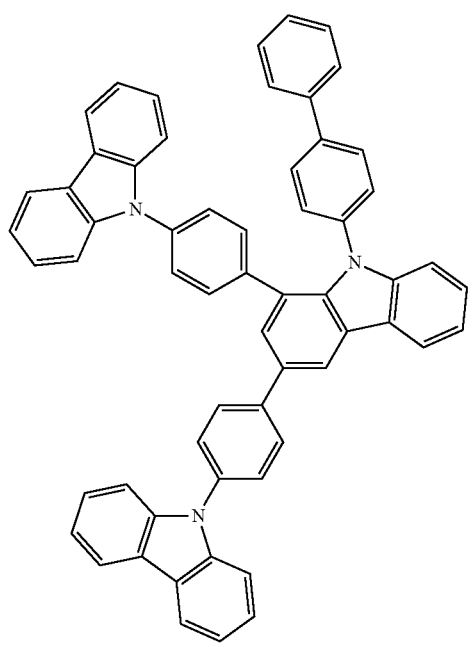
[Chemical Formula 45]
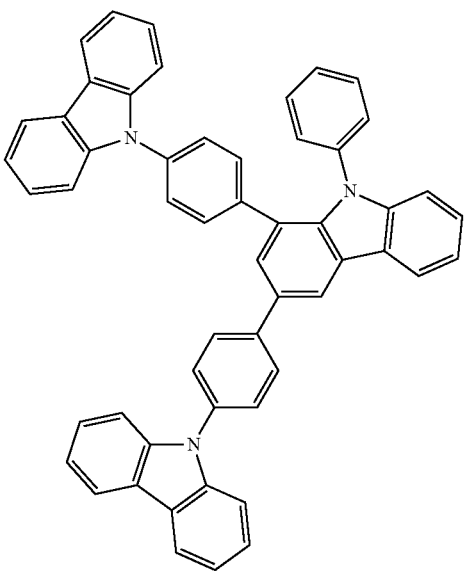
[Chemical Formula 46]
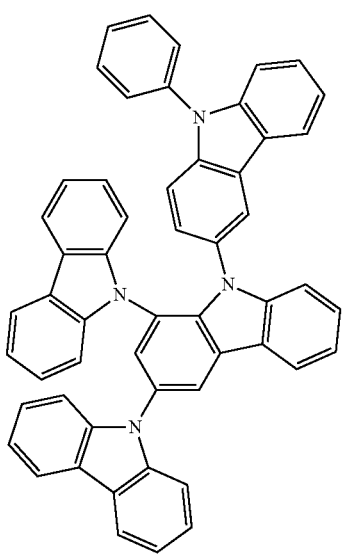

[Chemical Formula 47]
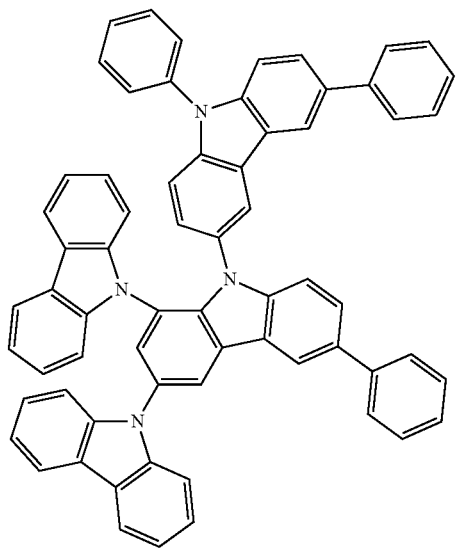
[Chemical Formula 48]
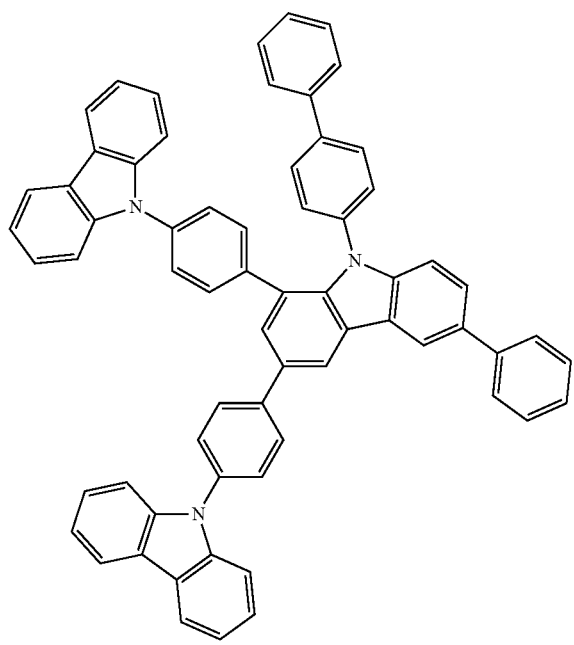
[Chemical Formula 49]
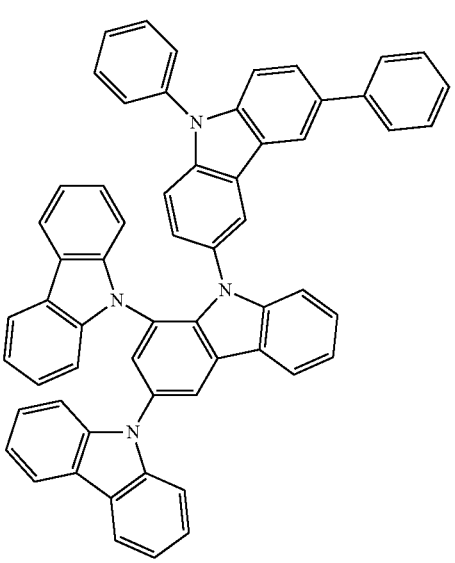
[Chemical Formula 50]
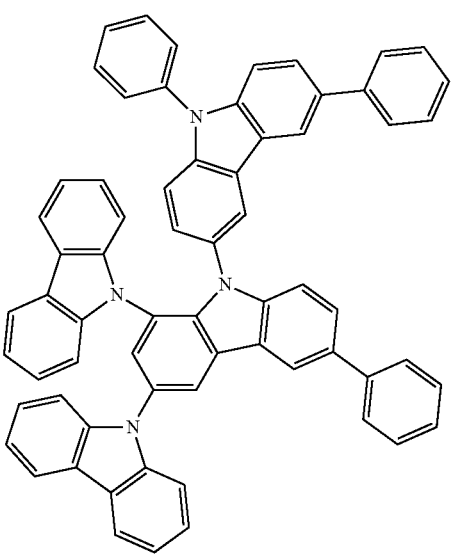

-continued
[Chemical Formula 51]
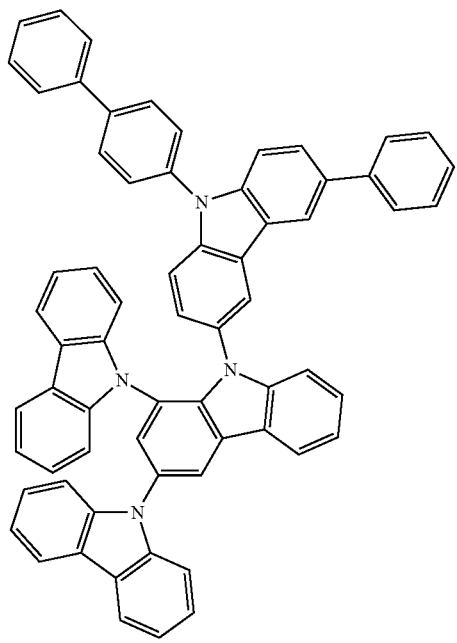
[Chemical Formula 52]
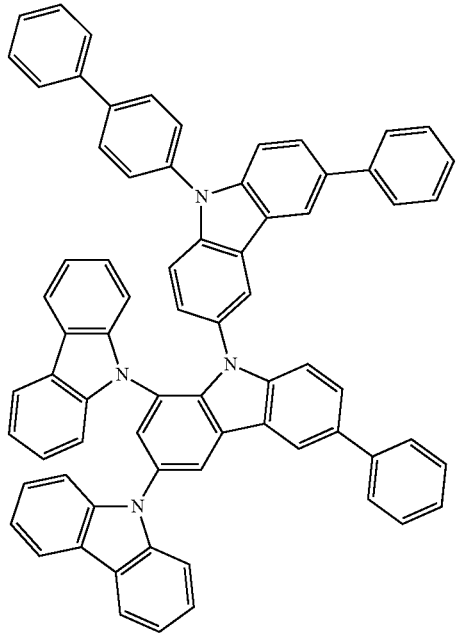
-continued
[Chemical Formula 53]
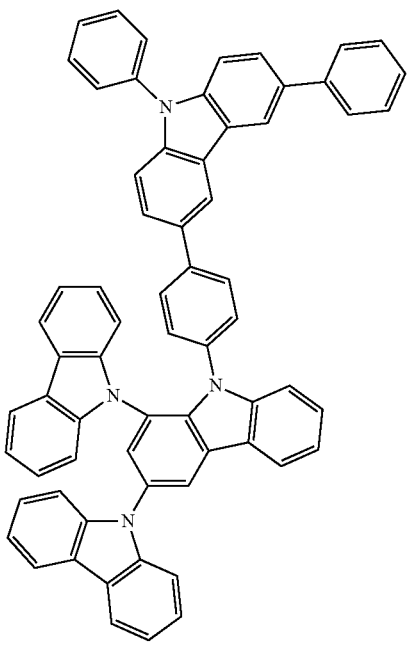
[Chemical Formula 54]
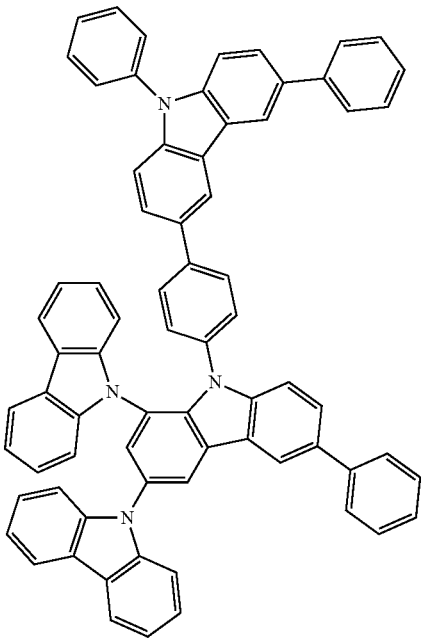

-continued
[Chemical Formula 55]
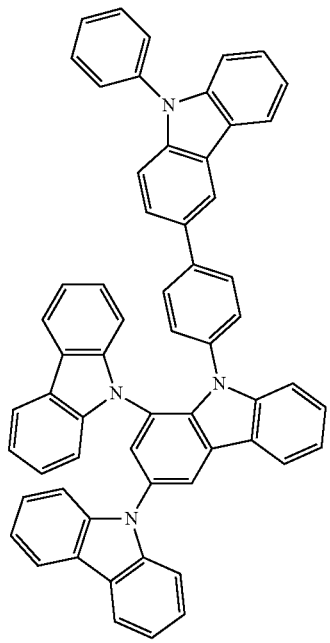
[Chemical Formula 56]
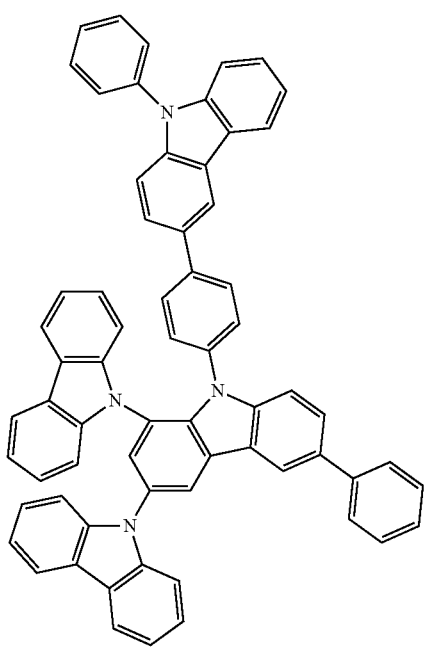
-continued
[Chemical Formula 57]
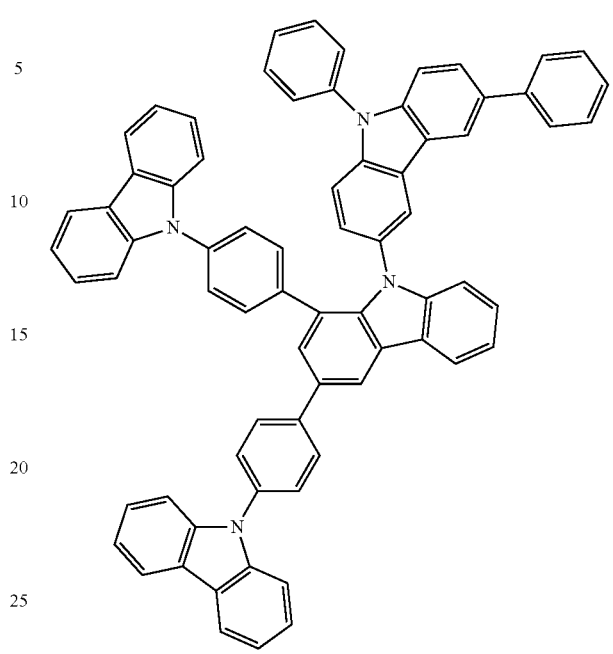
[Chemical Formula 58]
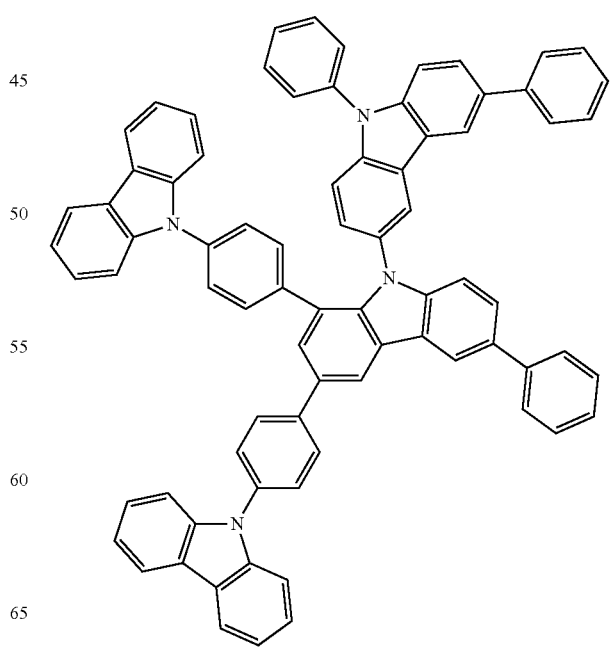

101
-continued
[Chemical Formula 59]
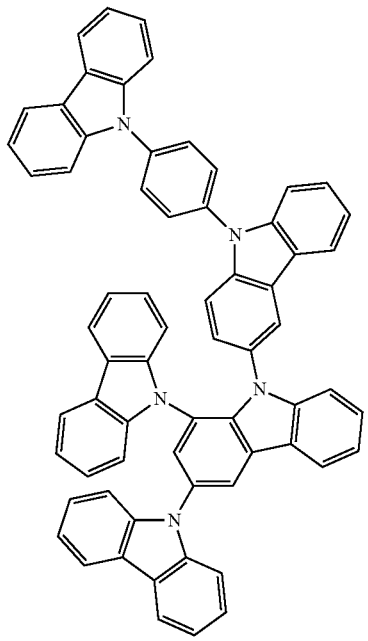
[Chemical Formula 60]
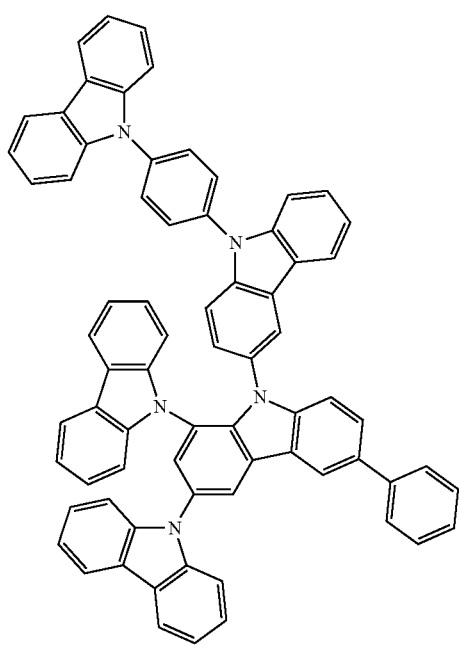
102
-continued
[Chemical Formula 61]
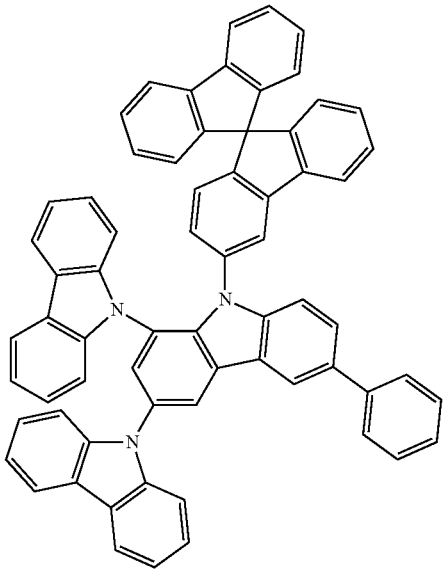
[Chemical Formula 62]
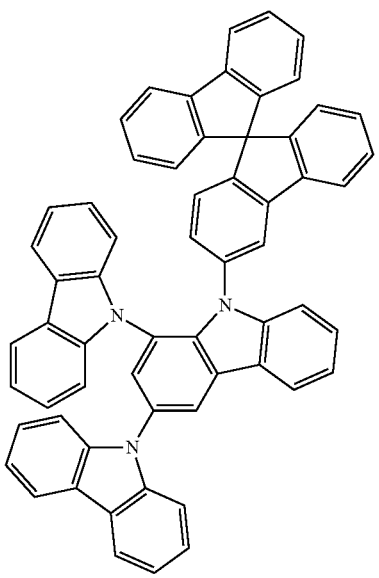

[Chemical Formula 63]
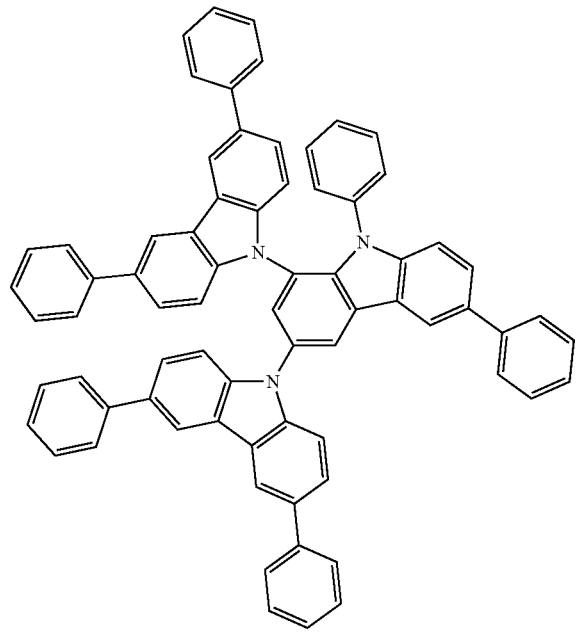
[Chemical Formula 64]
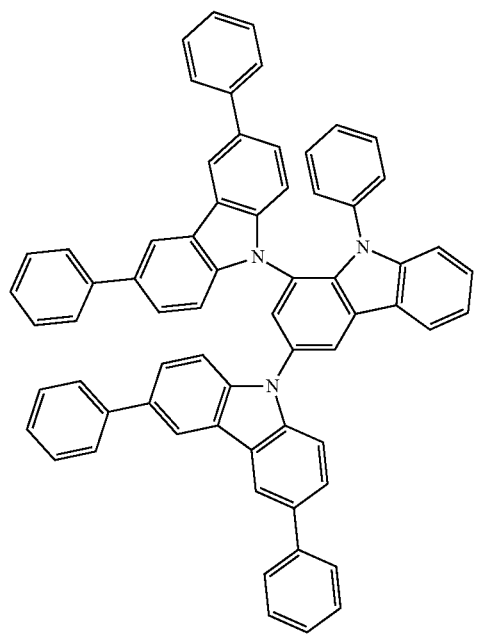
[Chemical Formula 65]
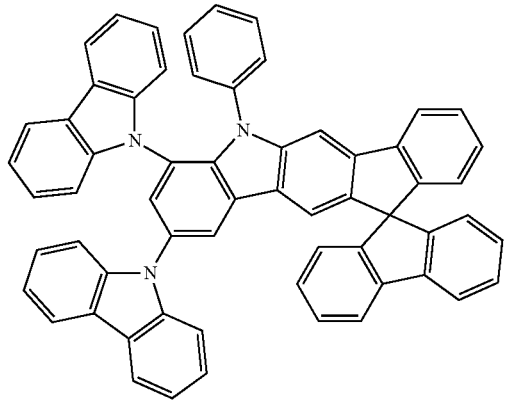
[Chemical Formula 66]
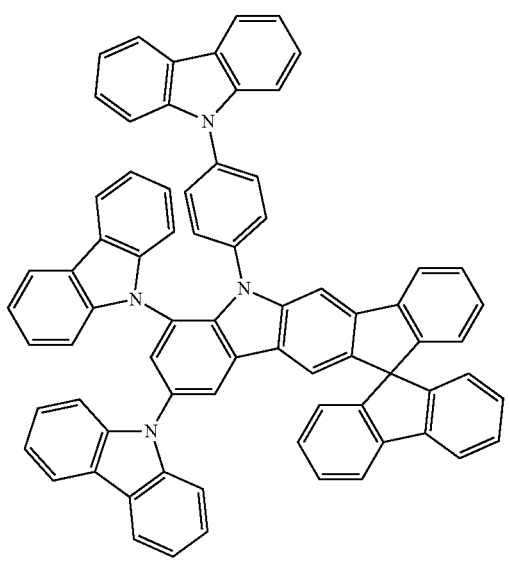
[Chemical Formula 67]
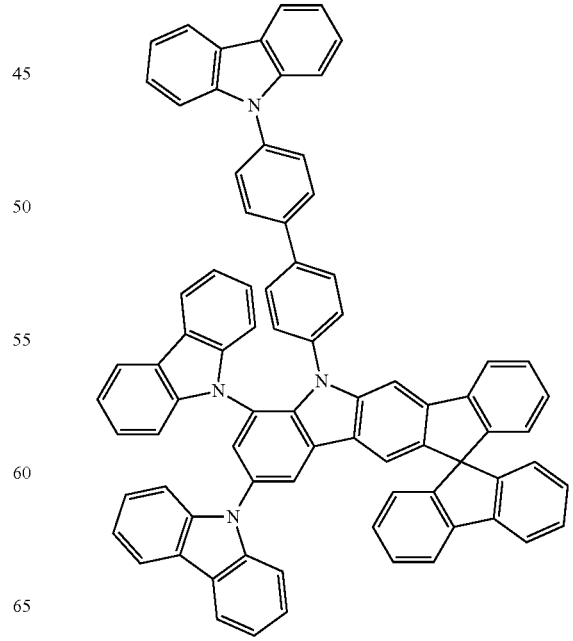

[Chemical Formula 68]
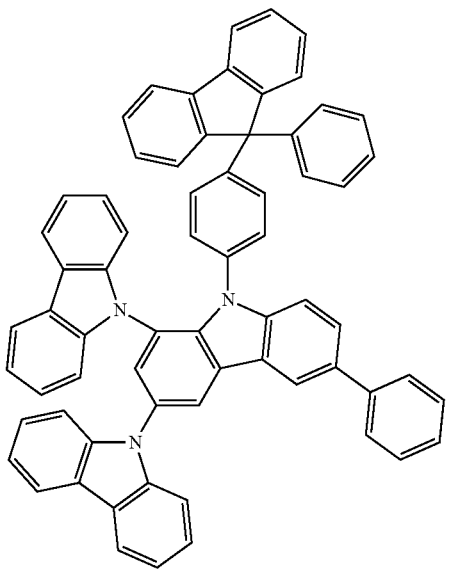
[Chemical Formula 69]
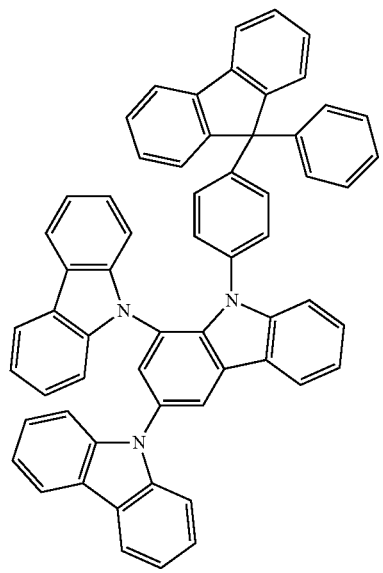
[Chemical Formula 70]
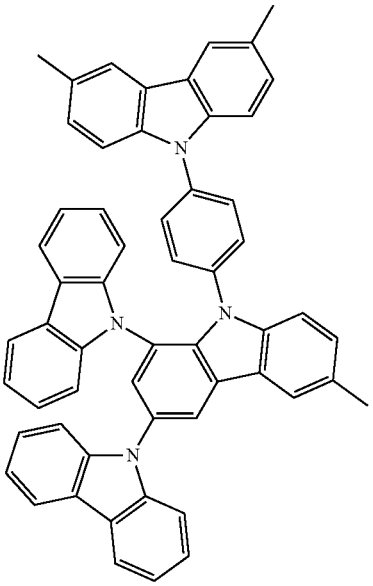
[Chemical Formula 71]
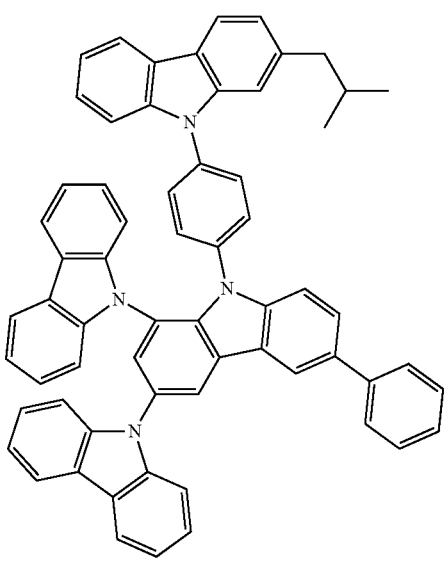

[Chemical Formula 72]
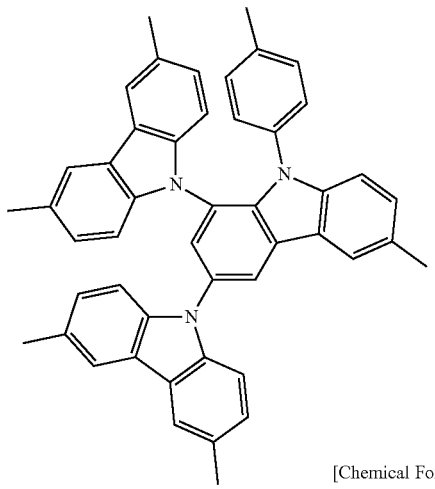
[Chemical Formula 73]
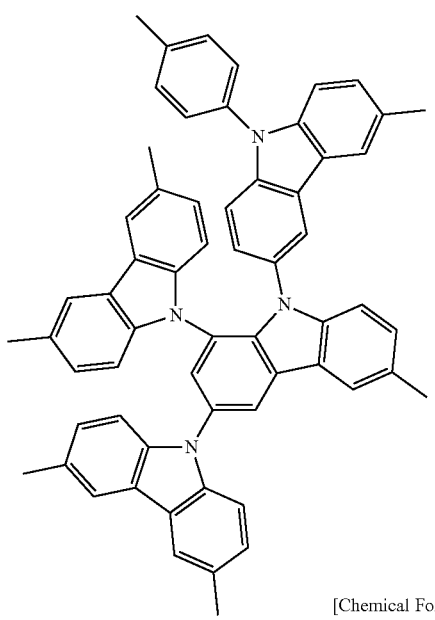
[Chemical Formula 74]
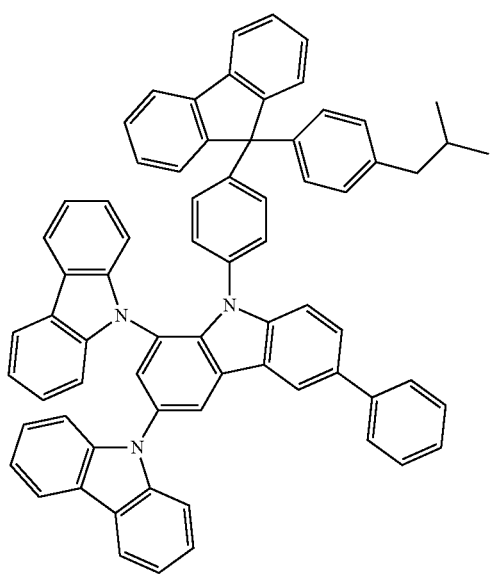
[Chemical Formula 75]
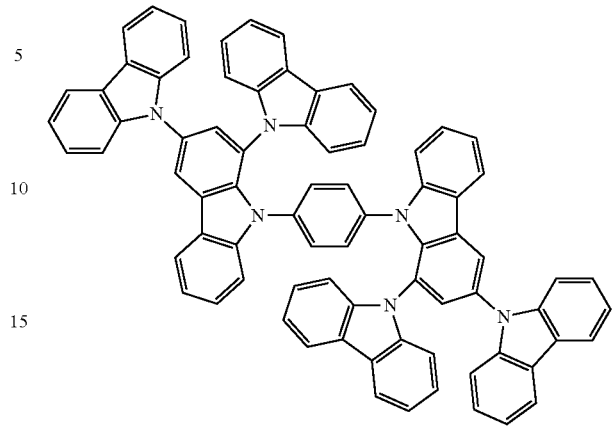
[Chemical Formula 76]
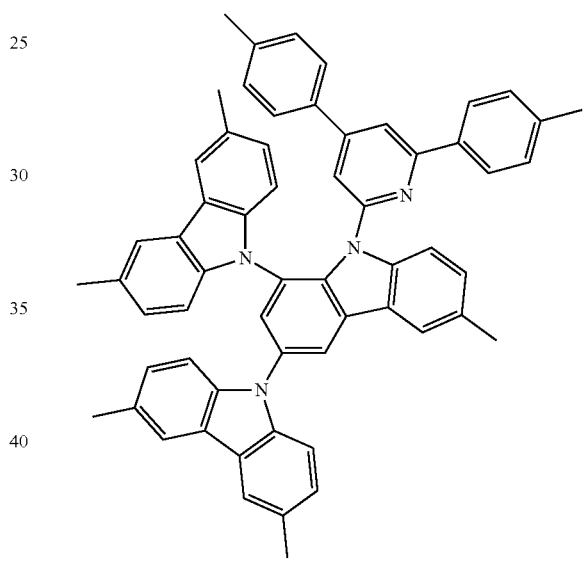
[Chemical Formula 77]
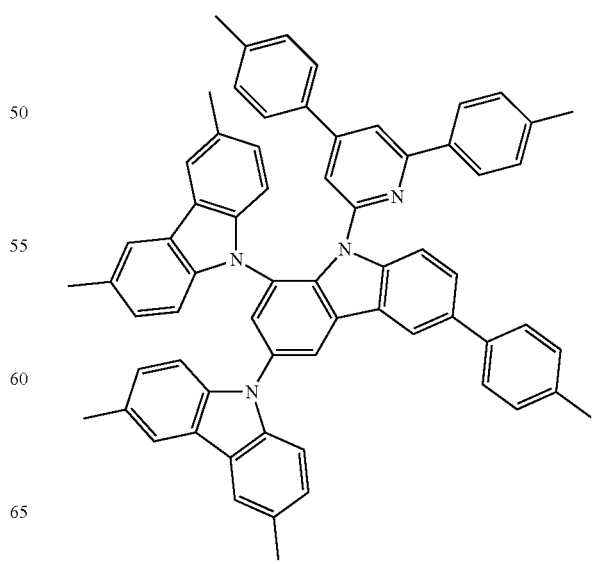

[Chemical Formula 78]
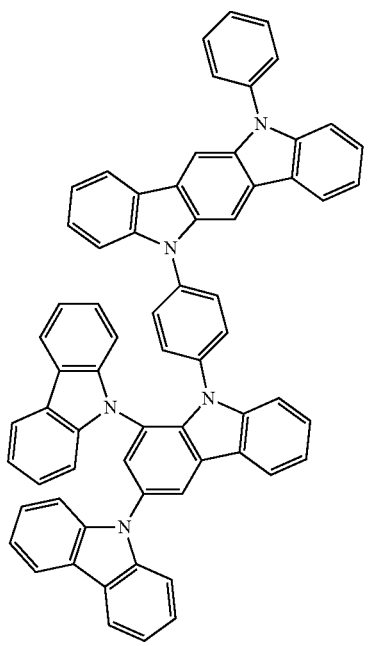
[Chemical Formula 79]
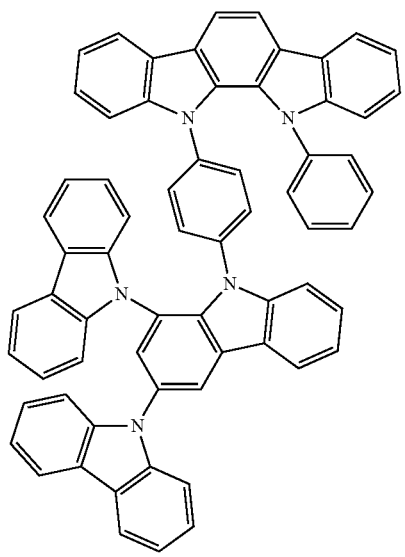
[Chemical Formula 80]
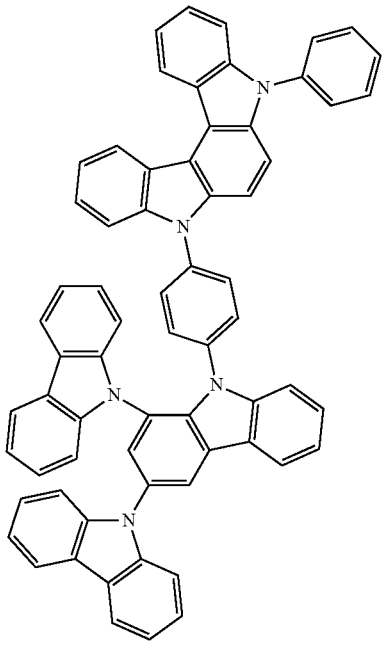
[Chemical Formula 81]
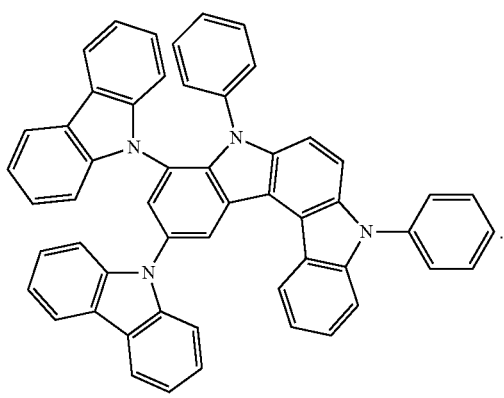

13. The compound as claimed in claim 1, wherein the compound represented by Chemical Formula 1 is represented by the following Chemical Formula 2:

[Chemical Formula 2]

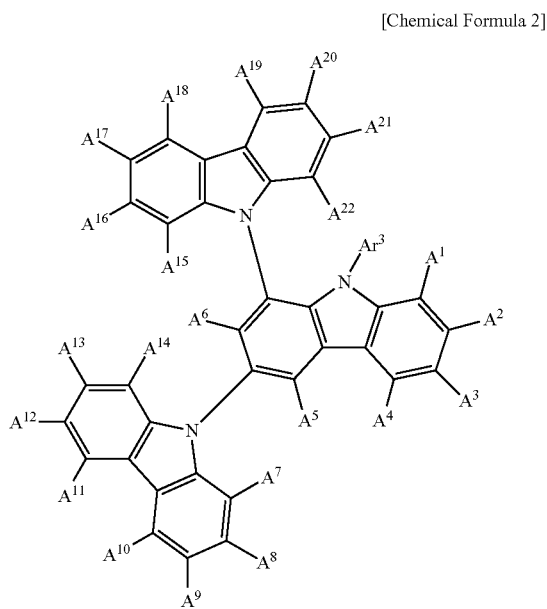

wherein:

$Ar^3$ is selected from the group of a substituted or unsubstituted C6 to C30 aryl group, a substituted or unsubstituted C5 to C30 heteroaryl group, and a substituted or unsubstituted C1 to C30 alkyl group, and $A^1$ to $A^{22}$ are each independently selected from the group of hydrogen, a substituted or unsubstituted C6 to C30 aryl group, a substituted or unsubstituted C5 to C30 heteroaryl group, and a substituted or unsubstituted C1 to C30 alkyl group.

14. The compound as claimed in claim 13, wherein at least one of $A^1$, $A^3$, $A^7$, $A^9$, $A^{12}$, $A^{14}$, $A^{15}$, $A^{17}$, $A^{20}$, and $A^{22}$ independently selected from the group of a substituted or unsubstituted C6 to C30 aryl group, a substituted or unsubstituted C5 to C30 heteroaryl group, and a substituted or unsubstituted C1 to C30 alkyl group.

15. The compound as claimed in claim 14, wherein at least one of $A^1$, $A^3$, $A^7$, $A^9$, $A^{12}$, $A^{14}$, $A^{15}$, $A^{17}$, $A^{20}$, and $A^{22}$ is independently selected from the group of a substituted or unsubstituted C6 to C12 aryl group, a substituted or unsubstituted C5 to C12 heteroaryl group, and a substituted or unsubstituted C1 to C4 alkyl group.

* * * * *